(12) United States Patent
Chin et al.

(10) Patent No.: US 11,652,044 B2
(45) Date of Patent: May 16, 2023

(54) CONTACT STRUCTURE AND METHOD OF MAKING

(71) Applicant: TAIWAN SEMICONDUCTOR MANUFACTURING COMPANY, LTD., Hsinchu (TW)

(72) Inventors: Shu-Cheng Chin, Hsinchu (TW); Yao-Min Liu, Hsinchu (TW); Hung-Wen Su, Hsinchu (TW); Chih-Chien Chi, Hsinchu (TW); Chi-Feng Lin, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 16 days.

(21) Appl. No.: 17/187,143

(22) Filed: Feb. 26, 2021

(65) Prior Publication Data
US 2022/0278040 A1 Sep. 1, 2022

(51) Int. Cl.
*H01L 23/522* (2006.01)
*H01L 23/528* (2006.01)
*H01L 29/417* (2006.01)
*H01L 29/45* (2006.01)
*H01L 21/768* (2006.01)
*H01L 23/532* (2006.01)

(52) U.S. Cl.
CPC ...... *H01L 23/5226* (2013.01); *H01L 21/7685* (2013.01); *H01L 21/76846* (2013.01); *H01L 21/76883* (2013.01); *H01L 23/5283* (2013.01); *H01L 29/41725* (2013.01); *H01L 29/456* (2013.01); *H01L 21/76807* (2013.01); *H01L 23/53209* (2013.01); *H01L 23/53223* (2013.01); *H01L 23/53238* (2013.01); *H01L 23/53266* (2013.01)

(58) Field of Classification Search
CPC ....... H01L 21/76807; H01L 2221/1015–1036; H01L 2224/05006; H01L 2224/05546
See application file for complete search history.

(56) References Cited

U.S. PATENT DOCUMENTS

| | | | |
|---|---|---|---|
| 2014/0183739 A1* | 7/2014 | Li | H01L 23/481 257/751 |
| 2016/0118296 A1* | 4/2016 | Kolics | H01L 21/76879 438/653 |
| 2019/0006234 A1* | 1/2019 | Fox, III | H01L 21/7685 |
| 2019/0164827 A1* | 5/2019 | Yang | H01L 21/324 |
| 2022/0139772 A1* | 5/2022 | Jezewski | H01L 23/53238 257/758 |

* cited by examiner

*Primary Examiner* — Wasiul Haider
(74) *Attorney, Agent, or Firm* — Hauptman Ham, LLP

(57) ABSTRACT

A semiconductor device includes an insulating layer, wherein the insulating layer has a via opening and a conductive line opening. The semiconductor device further includes a via in the via opening, wherein the via includes a first conductive material. The semiconductor device further includes a conductive line in the conductive line opening. The conductive line includes a first liner layer, wherein a first thickness of the first liner layer over the via is less than a second thickness of the first liner layer over the insulating layer, and a conductive fill comprising a second conductive material different from the first conductive material.

20 Claims, 60 Drawing Sheets

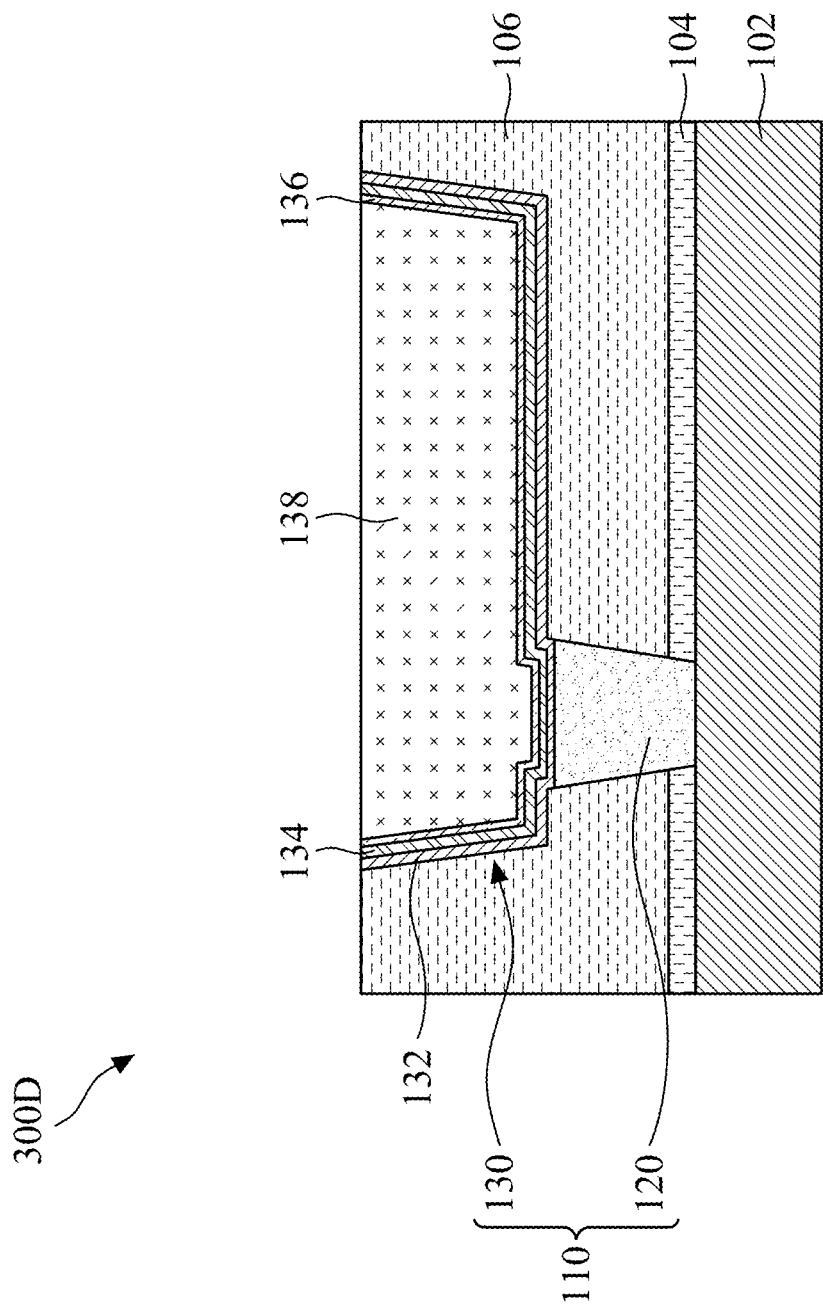

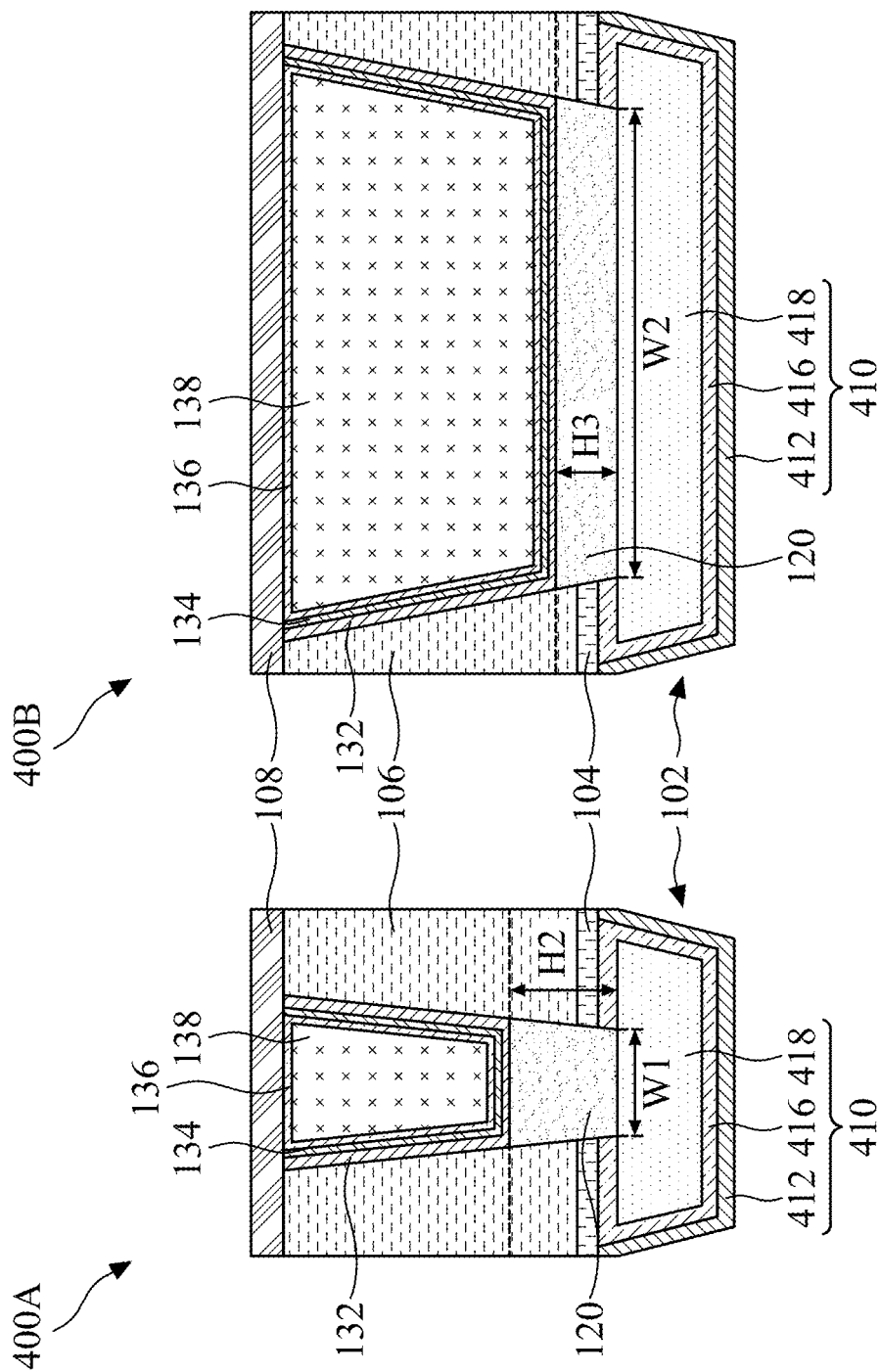

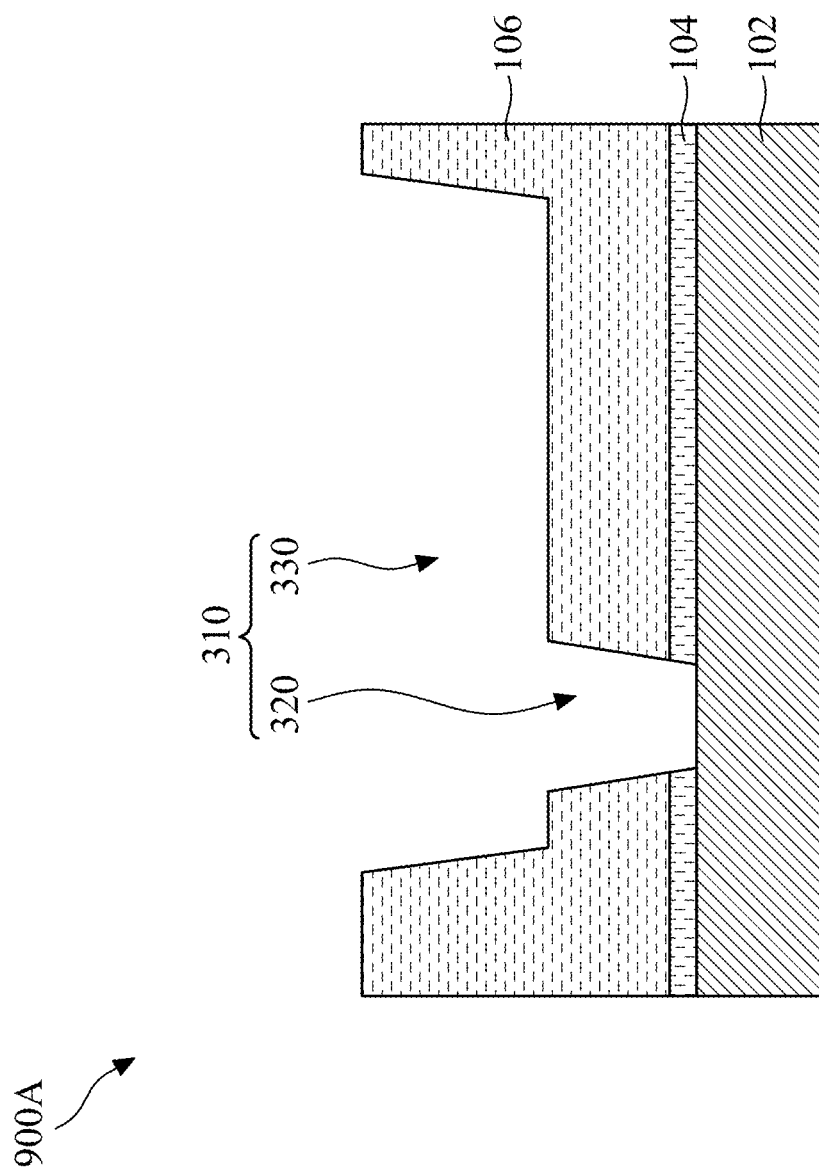

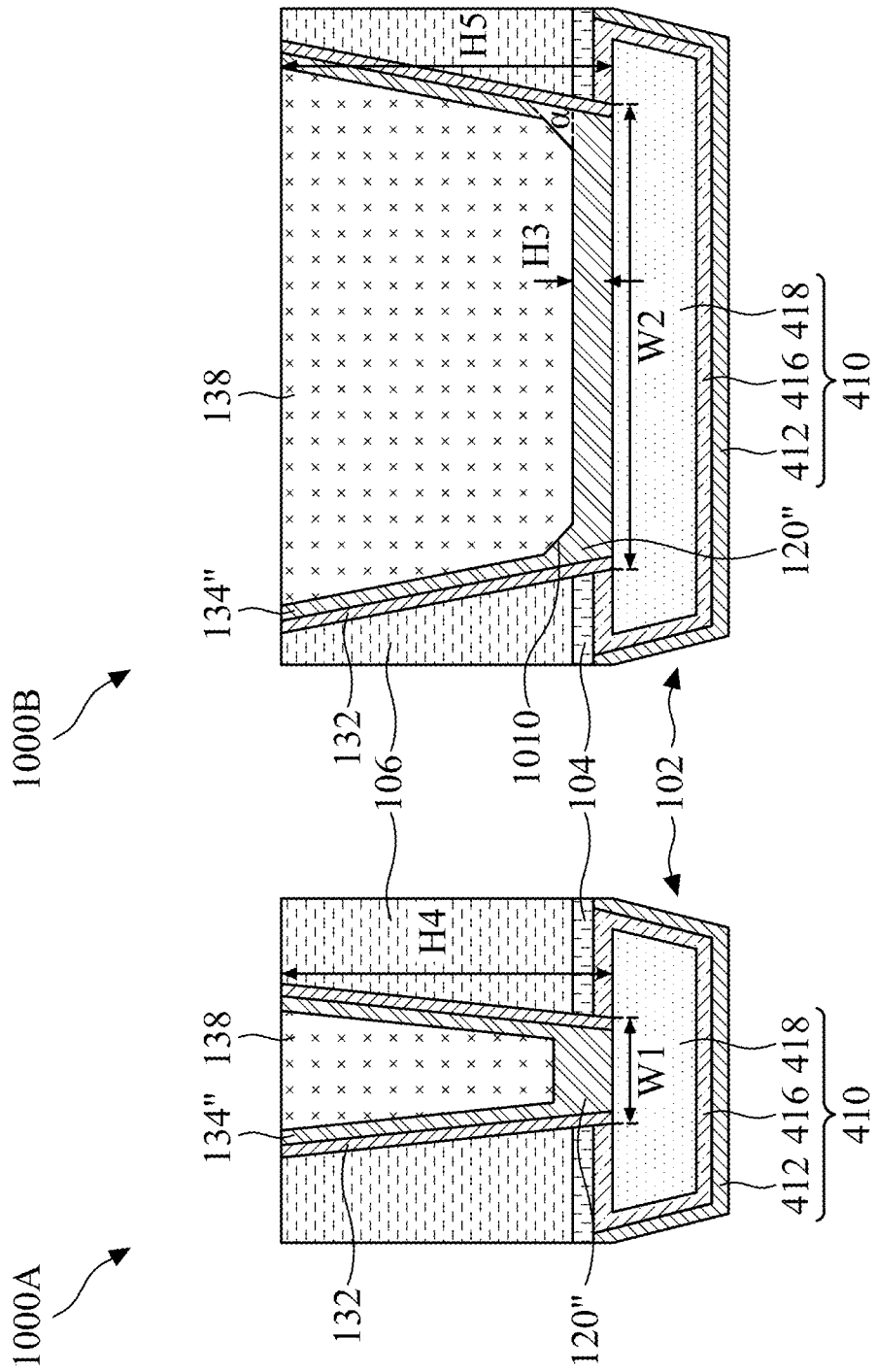

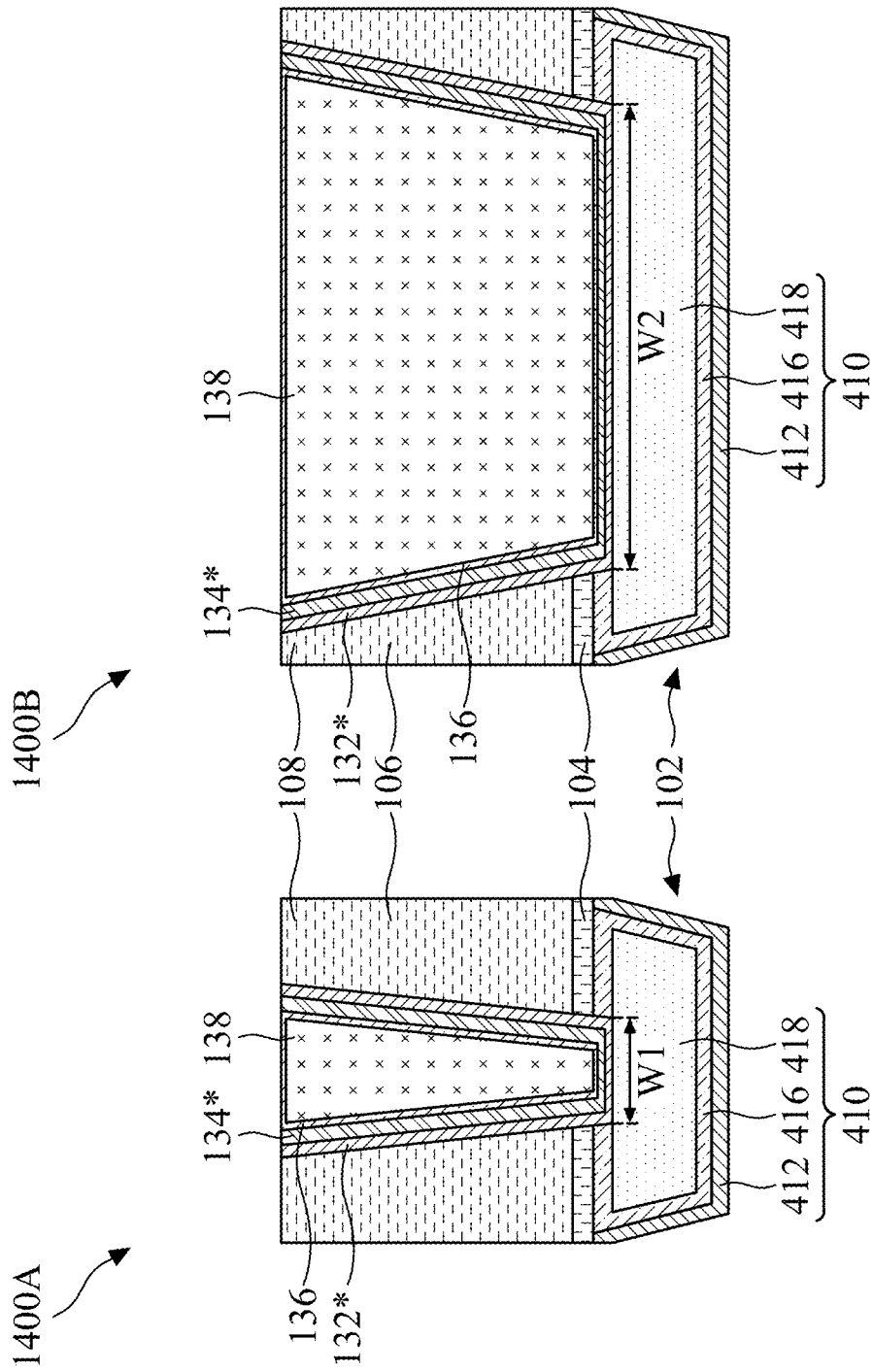

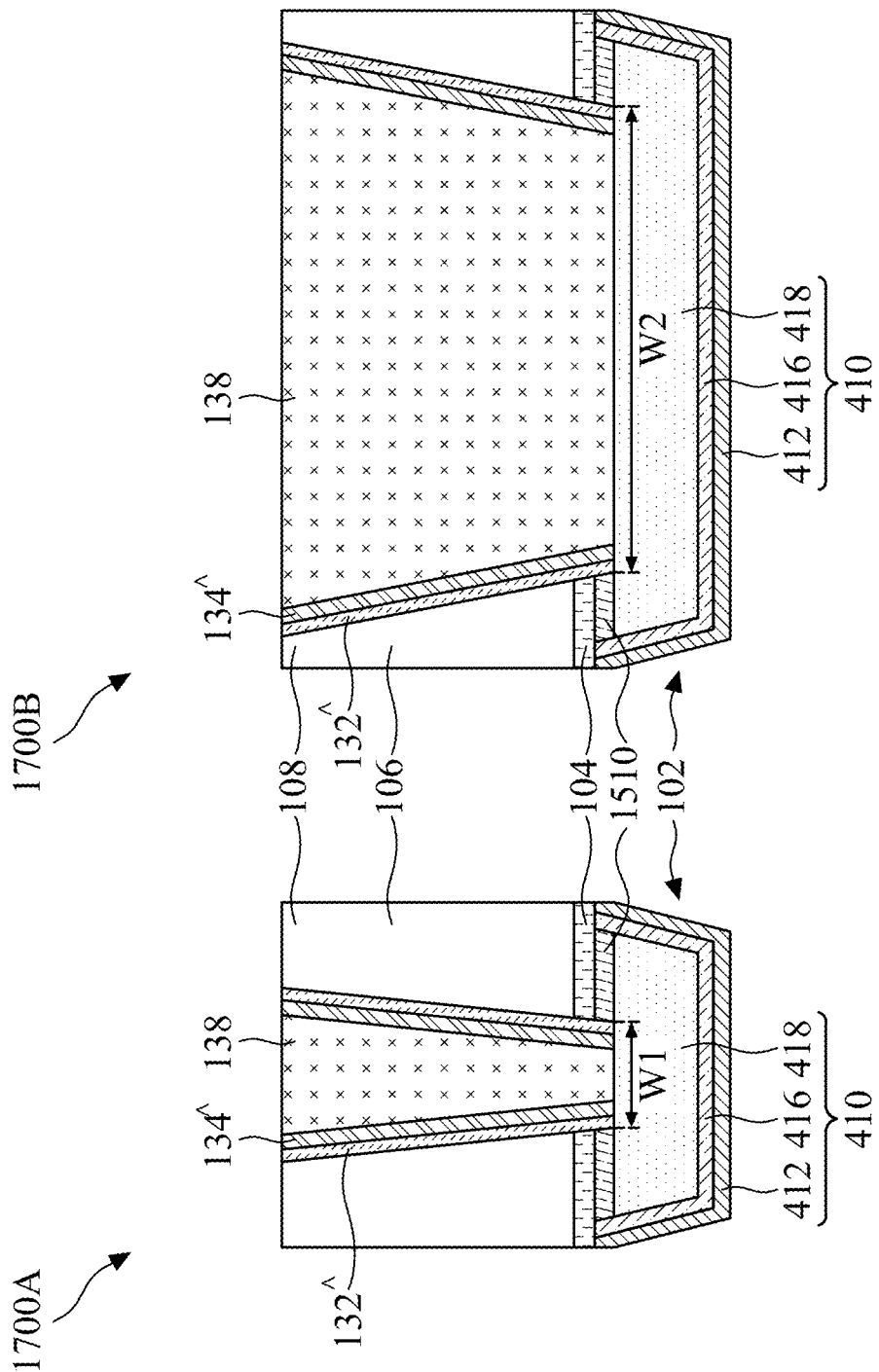

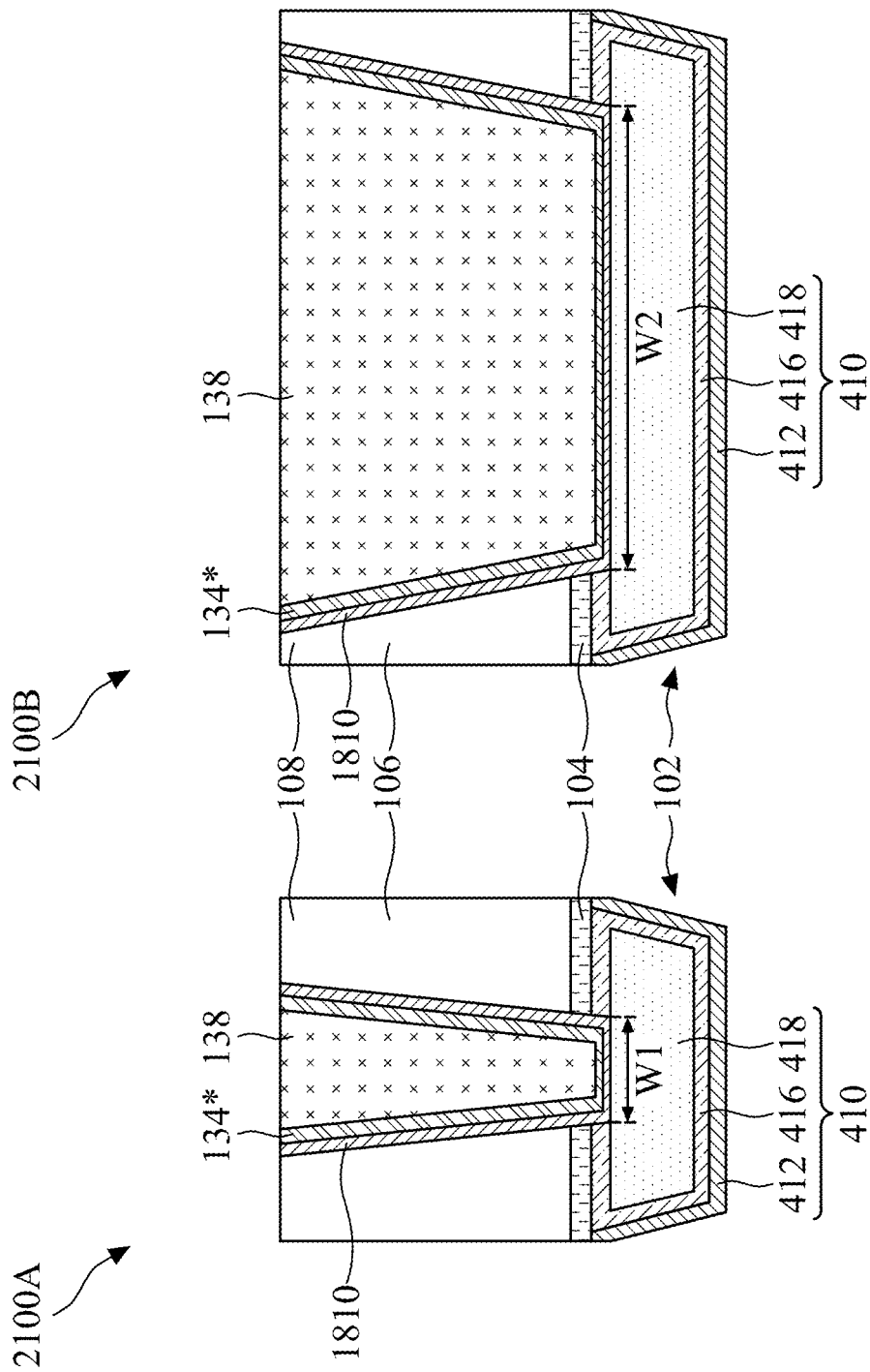

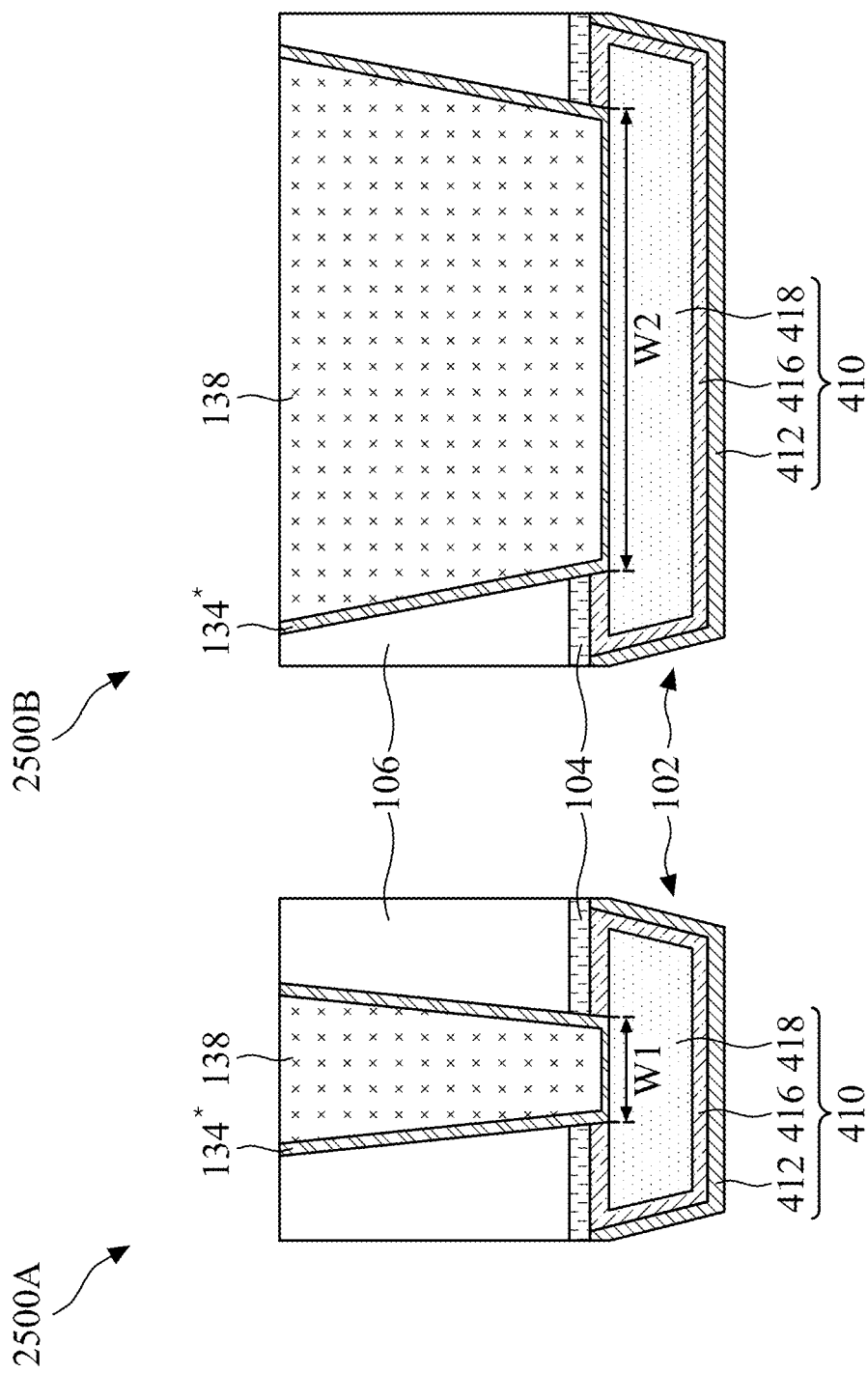

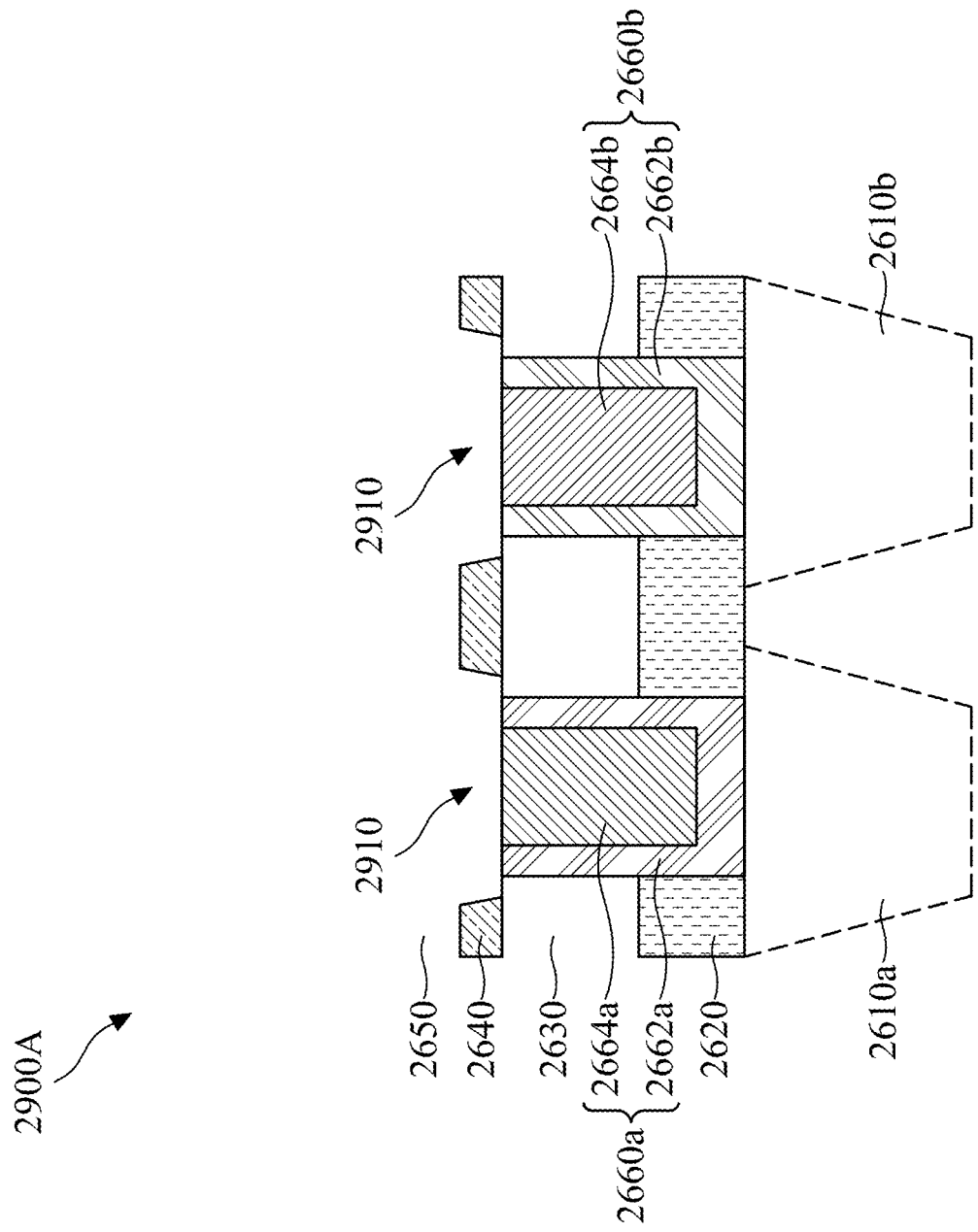

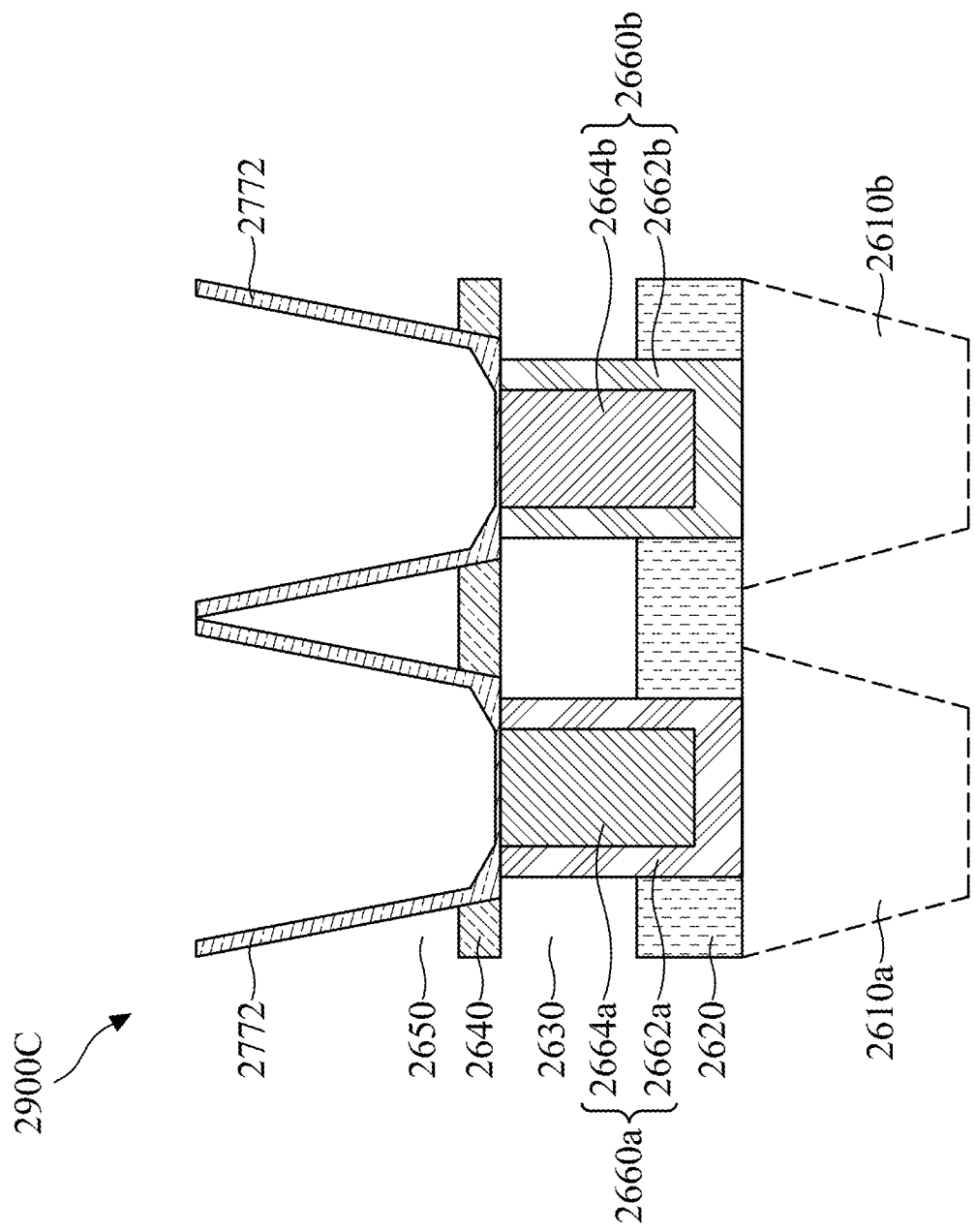

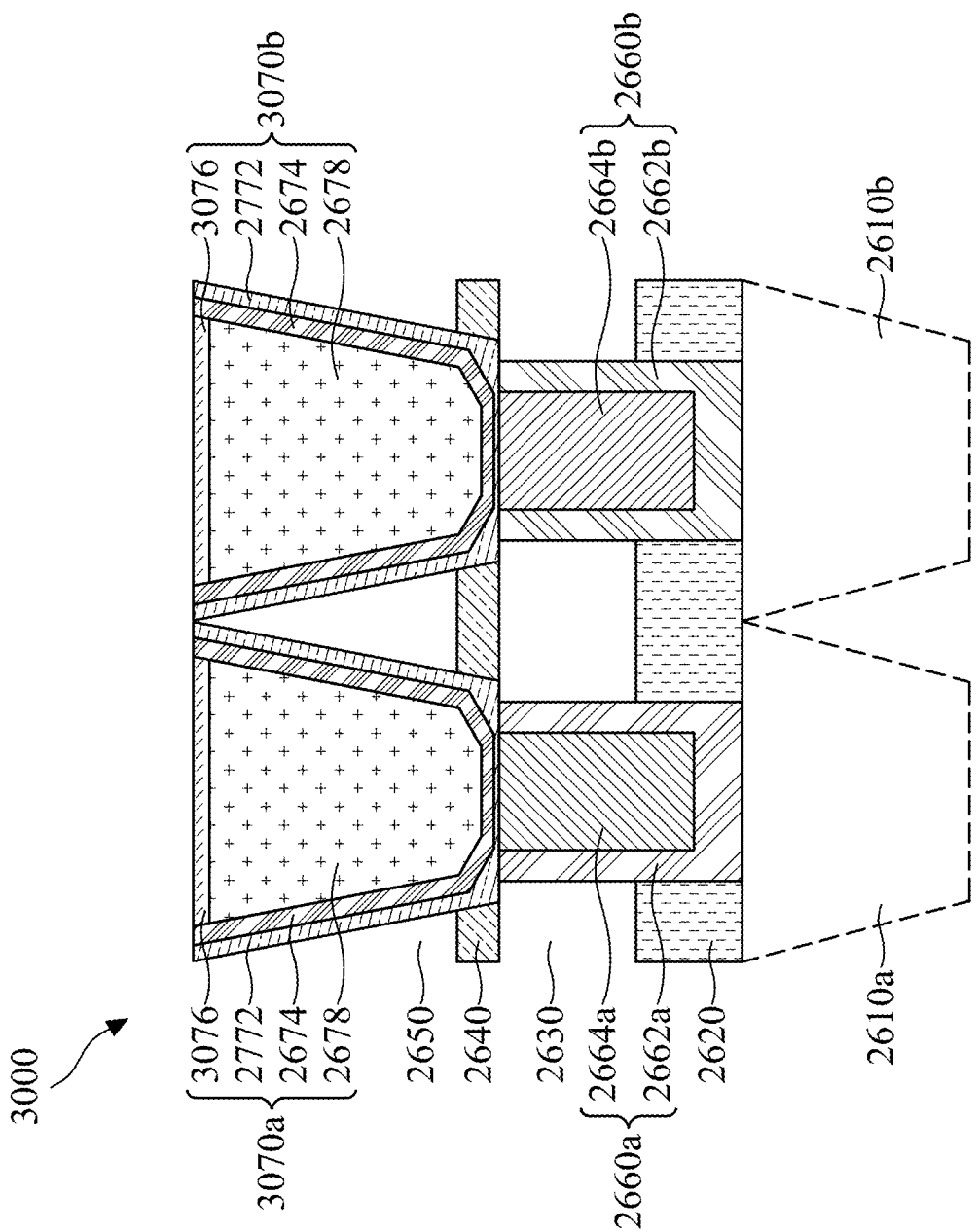

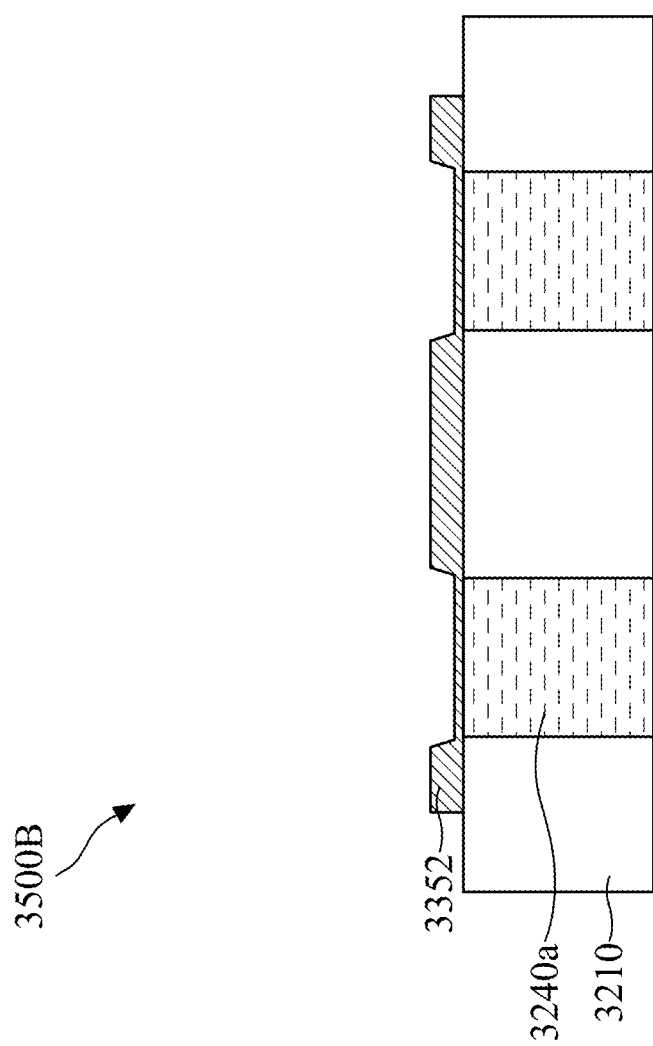

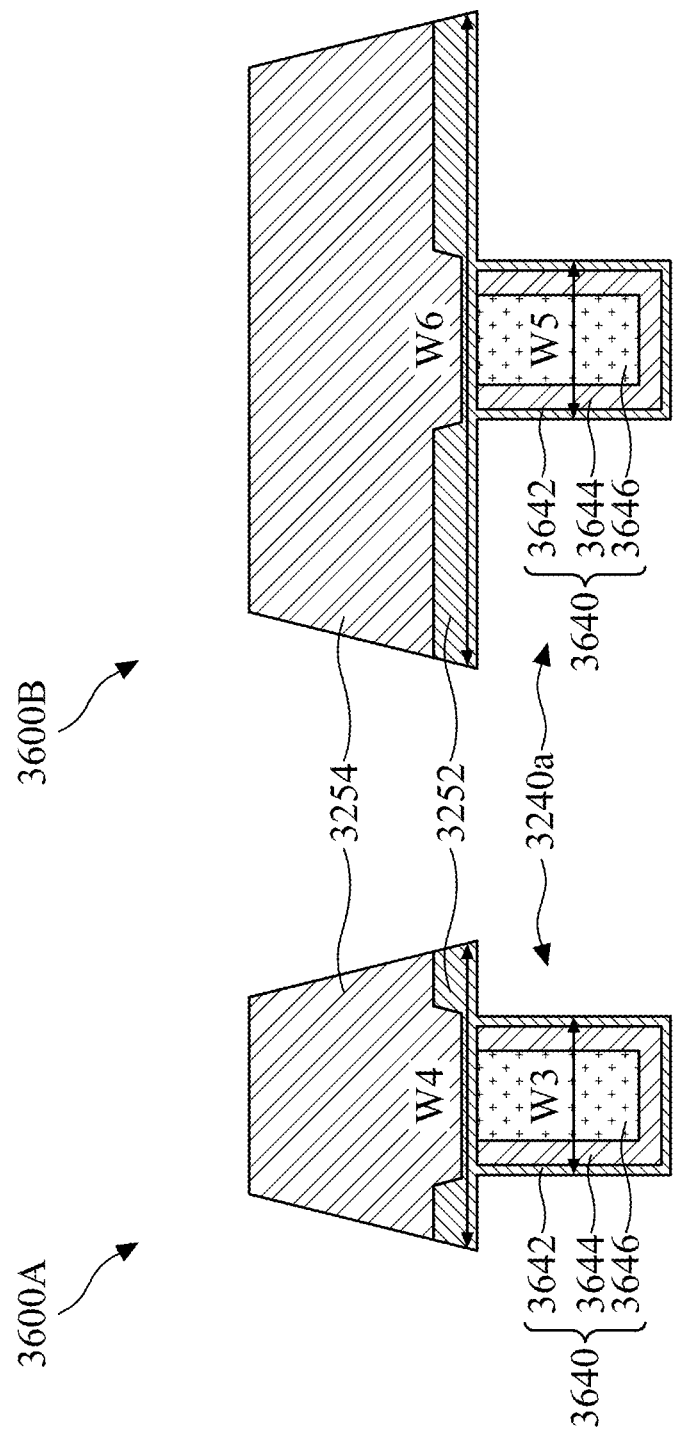

CONTACT STRUCTURE AND METHOD OF MAKING

BACKGROUND

Contacts are used to provide electrical connection to devices, such as source/drain (S/D) regions and gate electrodes of transistors. In some approaches, a via is used to provide electrical connection to the device. In some approaches, the via is connected to a conductive line as part of a dual damascene structure. As technology nodes shrink, a size of the via which contacts the device also shrinks. The reduced size of the via increases an aspect ratio for the via.

Liners are used in formation of the via in order to improve uniformity of deposition of the conductive material of the via and to help prevent the conductive material of the via from migrating into surrounding insulating material during processing. The inclusion of lines further increases the aspect ratio of the conductive material used to fill the via, so that filling the via without having voids in the conductive material becomes more difficult. Voids increase resistance of the via and in extreme situations cause open circuits, in some instances.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D are cross-sectional views of a contact structure during various stage of manufacturing in accordance with some embodiments.

FIG. 4A is a cross-sectional view of a contact structure in a circuit region in accordance with some embodiments.

FIG. 4B is a cross-sectional view of a contact structure in a seal ring region in accordance with some embodiments.

FIGS. 9A-9D are cross-sectional views of a contact structure during various stage of manufacturing in accordance with some embodiments.

FIG. 10A is a cross-sectional view of a contact structure in a circuit region in accordance with some embodiments.

FIG. 10B is a cross-sectional view of a contact structure in a seal ring region in accordance with some embodiments.

FIG. 14A is a cross-sectional view of a contact structure in a circuit region in accordance with some embodiments.

FIG. 14B is a cross-sectional view of a contact structure in a seal ring region in accordance with some embodiments.

FIG. 17A is a cross-sectional view of a contact structure in a circuit region in accordance with some embodiments.

FIG. 17B is a cross-sectional view of a contact structure in a seal ring region in accordance with some embodiments.

FIG. 21A is a cross-sectional view of a contact structure in a circuit region in accordance with some embodiments.

FIG. 21B is a cross-sectional view of a contact structure in a seal ring region in accordance with some embodiments.

FIG. 25A is a cross-sectional view of a contact structure in a circuit region in accordance with some embodiments.

FIG. 25B is a cross-sectional view of a contact structure in a seal ring region in accordance with some embodiments.

FIGS. 29A-29C are cross-sectional views of a contact structure during various stage of manufacturing in accordance with some embodiments.

FIG. 30 is a cross-sectional view of a contact structure in accordance with some embodiments.

FIGS. 35A-35D are cross-sectional views of a contact structure during various stage of manufacturing in accordance with some embodiments.

FIG. 36A is a cross-sectional view of a contact structure in a circuit region in accordance with some embodiments.

FIG. 36B is a cross-sectional view of a contact structure in a seal ring region in accordance with some embodiments.

DETAILED DESCRIPTION

Figure 1:
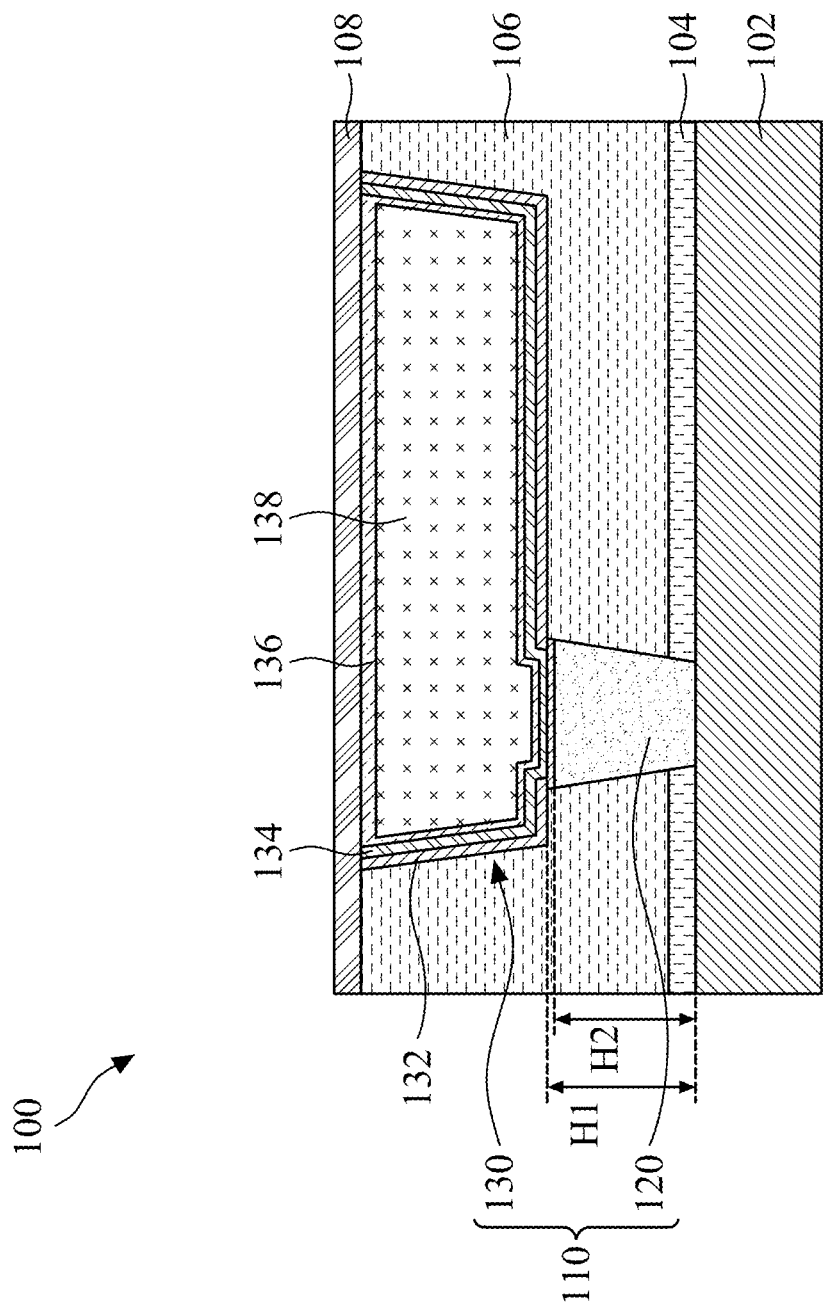
FIG. 1 is a cross-sectional view of a contact structure in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A barrier-less via, i.e., a via without liner layers or with very thin liner layers, in a contact structure helps to reduce bottom liner thickness of the via or even to reduce an aspect ratio of the via. As a result, a risk of voids being formed during the deposition of a conductive material for a via is reduced. As a result, resistance of the via in the contact structure is reduced and production yield increases due to fewer open circuits in the manufactured products.

In some embodiments, ruthenium is used to fill the via of the contact structure. Ruthenium has less risk of migrating into surrounding insulating material than other conductive material such as copper. As a result, ruthenium is usable in order to avoid liner layers in the via for the contact structure in order to increase the aspect ratio and provide the resulting benefits.

In some embodiments, a surface modification is performed on the ruthenium in order to deposit materials of the conductive line. The conductive line expands the size of the contact structure in order to increase routing options and reduce the risk of offset error resulting in high resistance contacts structure or open circuits. In some embodiments, the surface modification includes deposition of a benzotriazole (BTA), or other organic long chain molecule, monolayer on the ruthenium. The BTA monolayer helps to reduce thickness of liner layers deposited during formation of the conductive line. In some embodiments, the BTA monolayer helps to avoid the use of liner layers entirely during the formation of the conductive line.

FIG. 1 is a cross-sectional view of a contact structure 110 in accordance with some embodiments. The contact structure 110 is part of a semiconductor device 100. The semiconductor device 100 includes a substrate 102. An etch stop layer (ESL) 104 is over the substrate 102. In some embodiments, ESL 104 is called a contact ESL (CESL). An insulating layer 106 is over the ESL 104. In some embodiments, the insulating layer 106 is an inter-layer dielectric (ILD) layer. In some embodiments, the insulating layer 106 is an inter-metal dielectric (IMD) layer. An ESL 108 is over the insulating layer 106. The contact structure 110 extends through the insulating layer 106 and the ESL 104 in order to contact the substrate 102. The contact structure 110 includes a via 120 and a conductive line 130. The via 120 extends through the ESL 104 in order to contact the substrate 102.

FIG. 1 does not include any specific devices in the substrate 102. One of ordinary skill in the art would understand that in some embodiments, the substrate 102 includes a source/drain (S/D) region, a gate electrode or another conductive element of a device to be electrically connected to the via 120. In some embodiments, the substrate 102 includes an isolation structure, such as a shallow trench isolation (STI), which is in contact with the via 120. FIG. 1 is a cross-sectional view with the contact structure 110 at the metal zero (M0) level. The M0 level is the portion of an interconnect structure which directly connects to the substrate. However, in some embodiments, the contact structure 110 is part of a metal one (M1), metal two (M2) or metal three (M3) level. The M1 level is a layer of the interconnect structure directly above the M0 level. The M2 level is a layer of the interconnect structure directly above the M1 level. The M3 level is a layer of the interconnect structure directly above the M2 level. In some embodiments where the contact structure 110 is part of the M1-M3 level, the substrate 102 is replaced with a layer of the interconnect structure directly below the contact structure 110.

In some embodiments, substrate 102 includes an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 102 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

The ESL 104 helps to prevent damage to the substrate 102 during formation of an opening for the contact structure 110. The ESL 104 has a different etch selectivity from the insulating layer 106, so that an etching process used to form the opening for the contact structure 110 in the insulating layer 106 has a low risk of etching through the ESL 104 and damaging the substrate 102. In some embodiments, the ESL 104 includes silicon oxide, silicon nitride, silicon oxynitride or another suitable material. In some embodiments, the ESL 104 has a thickness ranging from about 1 nanometer (nm) to about 15 nm. If the ESL 104 is too thin, then a risk of damage to the substrate 102 increases, in some instances. If the ESL 104 is too thick, then a size of the semiconductor device 100 is increased without significant increase in performance, in some instances. In some embodiments, the ESL 104 is formed by chemical vapor deposition (CVD), physical vapor deposition (PVD), spin coating, printing, spray coating, sintering, thermal oxidation or another suitable process.

The insulating layer 106 includes a dielectric material for providing electrical insulation between the contact structure 110 and other conductive elements within the semiconductor device 100. In some embodiments, the insulating layer 106 includes silicon carbide, silicon oxycarbide, silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), polyimide or another suitable material. In some embodiments, the insulating layer 106 has a thickness ranging from about 30 nm to about 45 nm. If the insulating layer 106 is too thin, then a size of the contact structure decreases and resistance of the contact structure 110 increases which impairs functionality of the semiconductor device 100, in some instances. If the insulting layer 106 is too thick, then a size of the semiconductor device 100 is increased without significant increase in performance, in some instances. In some embodiments, the insulating layer 106 is formed by CVD, PVD, spin coating, high density plasma CVD (HDP CVD), sub-atmospheric CVD (SACVD), sputtering or another suitable process.

The ESL 108 helps to prevent damage to the insulating layer during subsequent manufacturing processes. The ESL 108 has a different etch selectivity from the insulating layer 106, so that an etching process has a low risk of etching through the ESL 108 and damaging the insulating layer 106. In some embodiments, the ESL 108 includes silicon oxide, silicon nitride, silicon oxynitride or another suitable material. In some embodiments, the ESL 108 includes a same material as the ESL 104. In some embodiments, the ESL 108 has a different material from the ESL 104. In some embodiments, the ESL 108 has a thickness ranging from about 1 nm to about 10 nm. If the ESL 108 is too thin, then a risk of damage to the insulating layer 106 increases, in some instances. If the ESL 108 is too thick, then a size of the semiconductor device 100 is increased without significant increase in performance, in some instances. In some embodiments, the ESL 108 has a same thickness as the ESL 104. In some embodiments, the ESL 108 has a different thickness from the ESL 104. In some embodiments, the ESL 108 is formed by CVD, PVD, spin coating, printing, spray coating, sintering, thermal oxidation or another suitable process. In some embodiments, the ESL 108 is formed using a same process as the ESL 104. In some embodiments, the ESL 108 is formed using a different process from the ESL 104.

The contact structure 110 includes the via 120 and the conductive line 130. The via 120 extends from inside the insulating layer 106, through the ESL 104 and contacts the substrate 102. As mentioned above, in some embodiments where the contact structure 110 is in the M1-M3 level, the via 120 will contact a lower layer of the interconnect structure instead of the substrate 102. The via 120 is free of liner layers. In some embodiments, the via 120 is called a barrier-free via. A height H1 of an opening for the via 120 is greater than a height H2 of the via 120. In some embodiments, the height H2 is equal to the height H1. In some embodiments, the height H2 is at least 50% of the height H1. If the height H2 of the via 120 is too small, then a risk of voids forming in the contact structure 110 increases because a depth which the liner layers and conductive fill of the conductive line extend into the via opening increases, in some instances. If the height H2 of the via 120 is too large, the material is wasted without significant improvement in performance, in some instances. In some embodiments, the height H2 is greater than the height H2 and the via 120 extends into an opening for the conductive line 130. In some embodiments, the via 120 includes ruthenium. In some embodiments, the via 120 includes tungsten. In some embodiments, the via 120 is formed using atomic layer deposition (ALD), CVD, PVD, plating or another suitable deposition process.

The conductive line 130 includes at least one liner layer and a conductive fill. The contact structure 110 includes three liner layers, a first liner layer 132, a second liner layer 134 and a third liner layer 136, collectively called liner layers. A conductive fill 138 is used to fill an opening for the conductive line 130 following deposition of the liner layers. In some embodiments where the height H2 is less than the height H1, at least one of the liner layers extends into the via opening. In some embodiments where the height H2 is less than the height H1, the conductive fill 138 extends into the via opening.

The first liner layer 132 is in direct contact with the insulating layer 106 and the via 120. The first liner layer 132 helps to prevent migration of the conductive fill 138 into the insulating layer 106. In some embodiments, a thickness of the first liner layer 132 ranges from about 8 angstroms to about 25 angstroms. In some embodiments where the contact structure 110 is in M1 or M2, a thickness of the first liner layer 132 ranges from about 8 angstroms to about 15 angstroms. In some embodiments where the contact structure 110 is in M3, a thickness of the first liner layer 132 ranges from about 10 angstroms to about 25 angstroms. If the first liner layer 132 is too thick, then a size of the semiconductor device 100 is increased without significant increase in performance, in some instances. If the first liner layer 132 is too thin, then a risk of the material of the conductive fill 138 migrating into the insulating layer 106 increases, in some instances.

In some embodiments, a thickness of the first liner layer 132 over the via 120 is less than a thickness of the first liner layer 132 in other locations due to surface modification of the via 120. In some embodiments, the surface modification includes deposition of a BTA monolayer. The reduced thickness of the first liner layer 132 helps to reduce the aspect ratio of any portion of the conductive line 130 that extends into the via opening, which in turn reduces the risk of voids forming in the contact structure 110. In some embodiments, the first liner layer 132 includes tantalum nitride (TaN), titanium nitride (TiN) or another suitable material. In some embodiments, the thickness of the first linear layer 132 over the via 120 ranges from about 3 angstroms to about 15 angstroms. In some embodiments where the contact structure 110 is in M1 or M2, the thickness of the first liner layer 132 over the via 120 ranges from about 3 angstroms to about 10 angstroms. In some embodiments where the contact structure 110 is in M3, the thickness of the first liner layer 132 over the via 120 ranges from about 5 angstroms to about 15 angstroms. If the first liner layer 132 is too thick, then a size of the semiconductor device 100 is increased without significant increase in performance, in some instances. If the first liner layer 132 is too thin, then a risk of the material of the conductive fill 138 migrating into the insulating layer 106 increases, in some instances. In some embodiments, the first liner layer 132 is formed using CVD, PVD, ALD or another suitable process.

The second liner layer 134 is in direct contact with the first liner layer 132. The second liner layer 134 also helps to prevent migration of the conductive fill 138 into the insulating layer 106 and helps to provide adhesion for layer deposited layers. In some embodiments, a thickness of the second liner layer 134 ranges from about 5 angstroms to about 15 angstroms. If the second liner layer 134 is too thick, then a size of the semiconductor device 100 is increased without significant increase in performance, in some instances. If the second liner layer 134 is too thin, then a risk of the material of the conductive fill 138 migrating into the insulating layer 106 increases, in some instances. In some embodiments, the thickness of the second liner layer 134 is substantially uniform, i.e., uniform within manufacturing tolerance. In some embodiments, a thickness of the second liner layer 134 is consistent across each of M0-M3. In some embodiments, the second liner layer 134 includes ruthenium, cobalt, tungsten nitride or another suitable material. In some embodiments, the second liner layer 134 is formed using CVD, PVD, ALD or another suitable process.

The third liner layer 136 is in direct contact with the second liner layer 134. The third liner layer 136 helps to reduce migration of the conductive fill 138 into the insulating layer 106 and helps to facilitate formation of the conductive fill 138. The third liner layer 136 also extends over a top surface of the conductive fill 138 in order to reduce the risk of migration of the material of the conductive fill 138 into the ESL 108. In some embodiments, a thickness of the third liner layer 136 ranges from about 5 angstroms to about 15 angstroms. If the third liner layer 136 is too thick, then a size of the semiconductor device 100 is increased without significant increase in performance, in some instances. If the third liner layer 136 is too thin, then a risk of non-uniform formation of the conductive fill 138 increases, in some instances. In some embodiments, the thickness of the third liner layer 136 is substantially uniform, i.e., uniform within manufacturing tolerance. In some embodiments, a thickness of the third liner layer 136 is consistent across each of M0-M3. In some embodiments, the third liner layer 136 includes cobalt, cobalt alloy or another suitable material. In some embodiments, the third liner layer 136 is formed using plating, CVD, PVD, ALD or another suitable process.

The conductive fill 138 is a conductive material that permits electrical signals to travel between the via 120 and other elements within the semiconductor device 100. In some embodiments, a thickness of the conductive fill 138 ranges from about 10 nm angstroms to about 100 nm. If the conductive fill 138 is too thick, then a size of the semiconductor device 100 is increased without significant increase in performance, in some instances. If the conductive fill 138 is too thin, then resistance of the contact structure 110 is increased and performance of the semiconductor device 100 is impaired, in some instances. In some embodiments, the conductive fill 138 includes copper, copper alloy, tungsten, aluminum, cobalt, ruthenium, iridium or another suitable material. In some embodiments, the conductive fill 138 is formed using plating, PVD, ALD or another suitable process.

Figure 2:
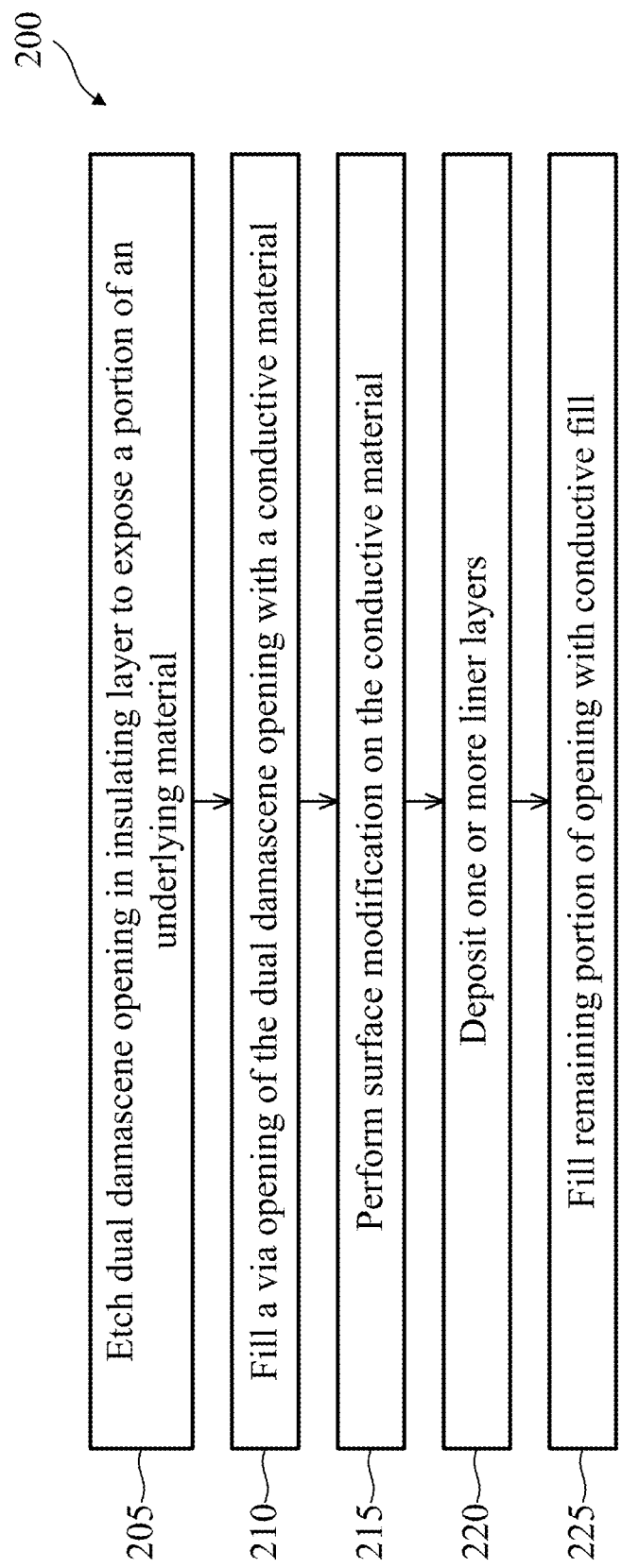
FIG. 2 is a flow chart of a method of making a contact structure in accordance with some embodiments.

FIG. 2 is a flow chart of a method 200 of making a contact structure in accordance with some embodiments. In operation 205, an insulating layer is etched to form a dual damascene opening to expose an underlying material. A dual damascene opening includes two components, a via opening and a conductive line opening. The etching process extends through an ESL in order to expose the underlying material. In some embodiments, the underlying material includes a conductive element in a substrate, e.g., the substrate 102 (FIG. 1). In some embodiments, the underlying material includes an isolation structure in the substrate, e.g., the substrate 102. In some embodiments, the etching includes a series of photolithography and etching processes in order to form the dual damascene opening.

Figure 3A:
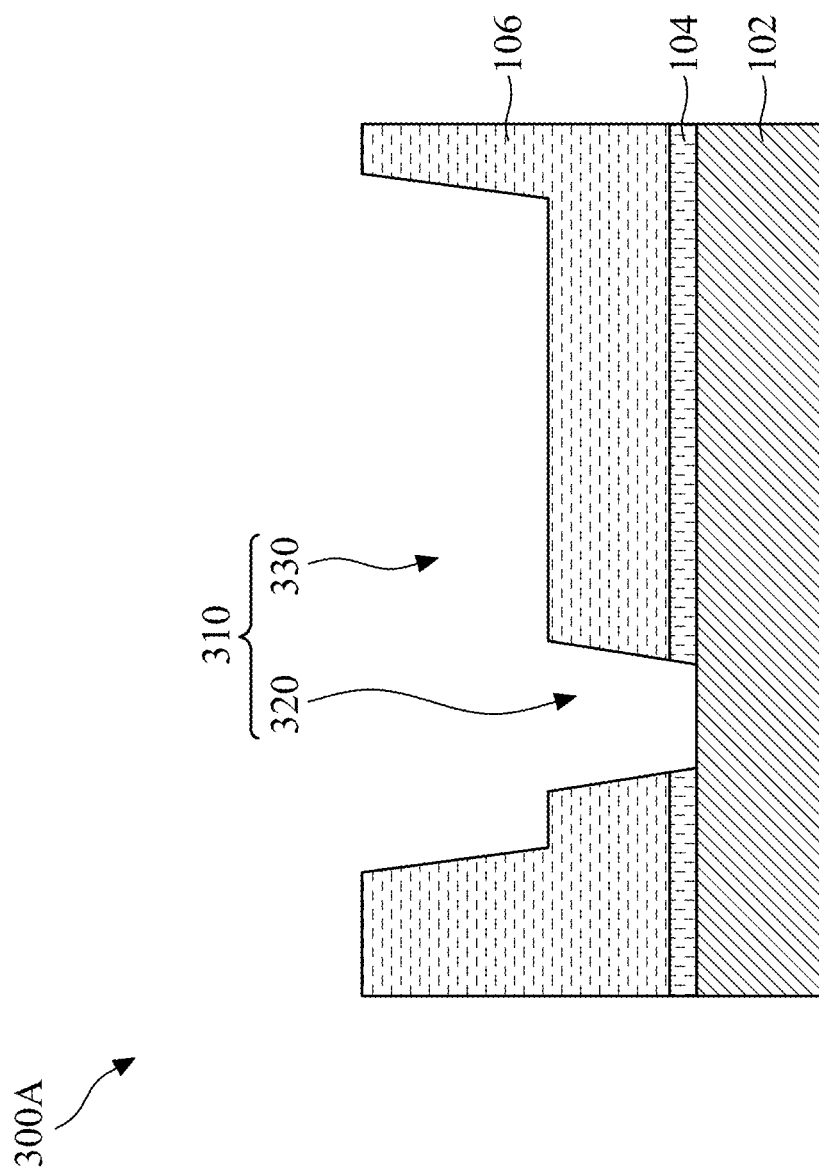

FIG. 3A is a cross-sectional view of a contact structure following etching of a dual damascene opening in accordance with some embodiments. A semiconductor device 300A includes a dual damascene opening 310 extending through the insulating layer 106 and the ESL 104 in order to expose a portion of the substrate 102. The dual damascene opening 310 includes a via opening 320 and a conductive line opening 330. The via opening 320 extends from the insulating layer 106 through the ESL 104.

Returning to FIG. 2, method 200 further includes operation 210 in which the via opening is filled with a conductive material. In some embodiments, the conductive material includes ruthenium, tungsten or another suitable material. The conductive material fills at least 50% of the via opening. In some embodiments, the conductive material fills an entirety of the via opening. In some embodiments, the conductive material extends into the conductive line opening. In some embodiments, the fill is performed using ALD, CVD, PVD, plating or another suitable deposition process.

Figure 3B:
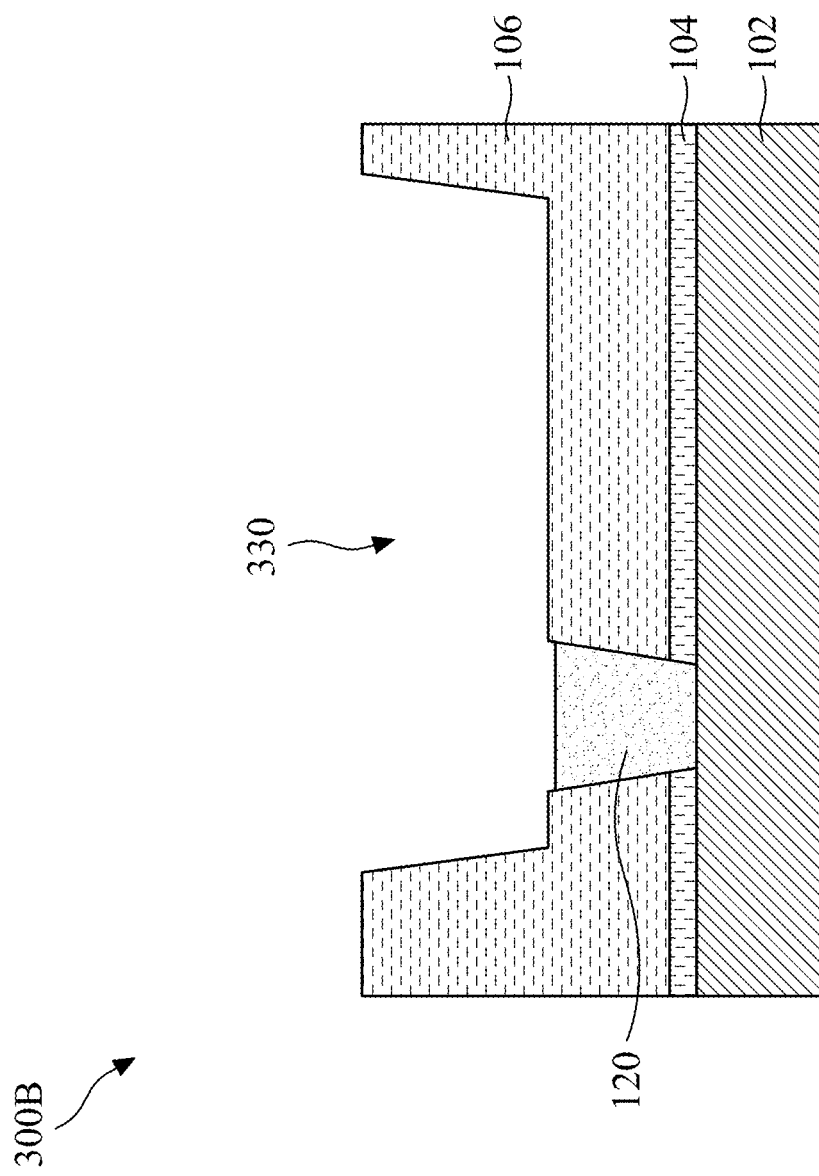

FIG. 3B is a cross-sectional view of a contact structure following filling the via opening with a conductive material in accordance with some embodiments. A semiconductor device 300B includes the via 120 filling the via opening. The via 120 fills less than an entirety of the via opening. In some embodiments, the via 120 completely fills the via opening. In some embodiments, the via 120 extends into the conductive line opening 330.

Returning to FIG. 2, method 200 further includes operation 215 in which a surface modification is performed on a surface of the conductive material. In some embodiments, the conductive material includes ruthenium, tungsten or another suitable material. The conductive material fills at least 50% of the via opening. The surface modification includes the deposition of a monolayer of BTA. In some embodiments, the surface modification includes deposition of a material other than BTA. The surface modification is selective to the conductive material, so the monolayer is not formed on the insulating layer 106.

In operation 220 one or more liner layers are deposited. In some embodiments, a single liner layer is deposited. In some embodiments, multiple liner layers are deposited. The surface modification from operation 215 results in a thickness of a first liner layer deposited in the operation 220 being reduced over the conductive material in comparison with the thickness of the first liner layer over the insulating layer. In some embodiments, the first liner layer includes TaN, TiN or another suitable material. In some embodiments, additional liner layers include ruthenium, cobalt or other suitable materials. In some embodiments, the one or more liner layers extend into the via opening. In some embodiments, the one or more liner layers are independently deposited using ALD, CVD, PVD, plating or another suitable deposition process.

Figure 3C:
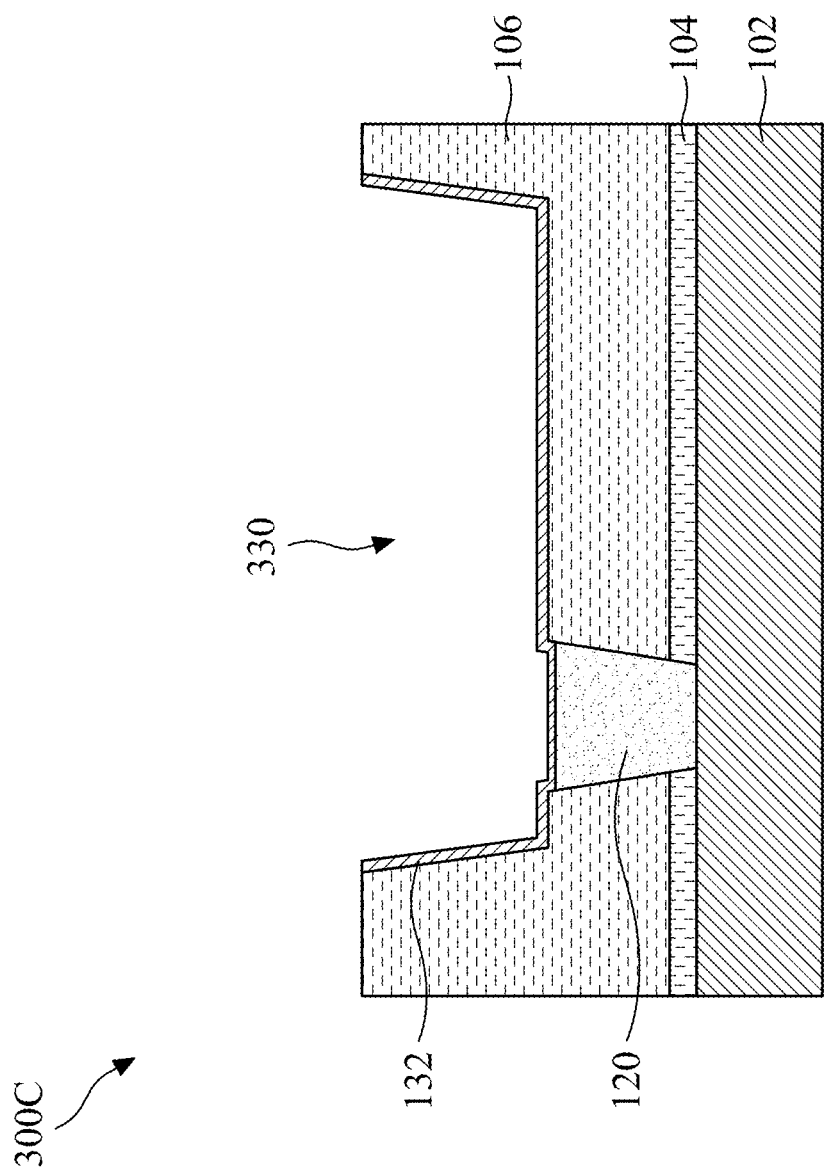

FIG. 3C is a cross-sectional view of a contact structure following performance of a surface modification process and deposition of a liner layer in accordance with some embodiments. A semiconductor device 300C includes the first liner layer 132 in the conductive line opening 330. A thickness of the first liner layer 132 over the via 120 is less than a thickness of the first liner layer 132 in other portions of the conductive line opening 330.

Returning to FIG. 2, method 200 further includes operation 225 in which a remaining portion of the dual damascene opening is filled with a conductive fill. The conductive fill fills portions of the conductive line opening not occupied by the one or more liner layers or the conductive material. In some embodiments, the conductive fill includes copper, copper alloy, tungsten, aluminum or another suitable material. In some embodiments, the fill is performed using ALD, CVD, PVD, plating or another suitable deposition process. In some embodiments, the method 200 includes additional operations such as annealing or planarization processes.

FIG. 3D is a cross-sectional view of a contact structure following filling a remaining portion of the opening with a conductive fill in accordance with some embodiments. A semiconductor device 300D includes the first liner layer 132, the second liner layer 134, the third liner layer 136 and the conductive fill 138 in the conductive line opening. The conductive fill 138 fills the remaining portion of the conductive line opening not occupied by the first liner layer 132, the second liner layer 134, the third liner layer 136 and the via 120.

Figure 3E:
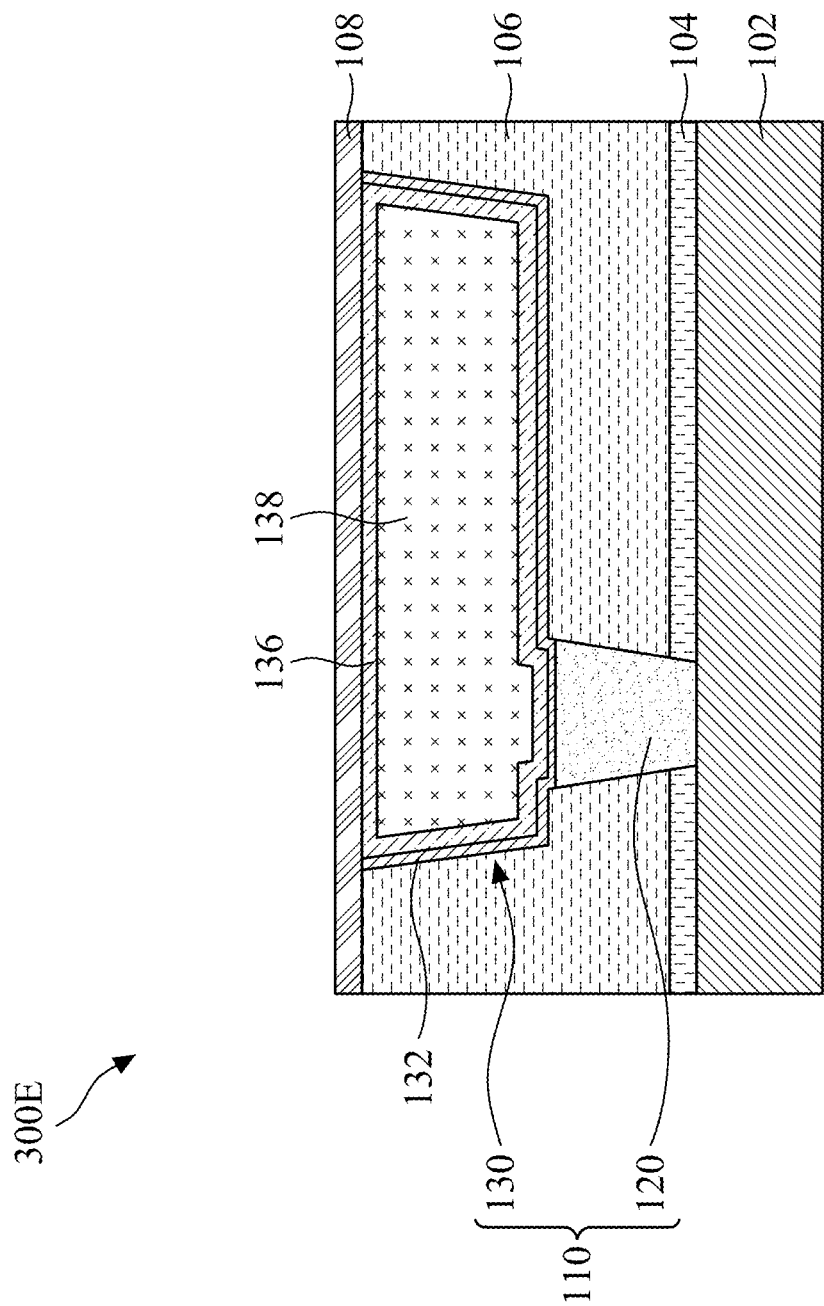
FIG. 3E is a cross-sectional view of a contact structure during manufacturing in accordance with some embodiments.

In some embodiments, the second liner layer 134 is optional and may be omitted. Accordingly, the third liner layer 136 is in direct contact with the first liner layer 132, as seen in FIG. 3E. For example, the third liner layer 136 of cobalt is in direct contact with the first liner layer 132 of TaN, but not limited thereto.

FIG. 4A is a cross-sectional view of a contact structure in a circuit region in accordance with some embodiments. A semiconductor device 400A is similar to the semiconductor device 100 (FIG. 1). In comparison with the semiconductor device 100, the semiconductor device 400A includes a conductive feature 410 as part of the substrate 102. In some embodiments, the conductive feature 410 is in place of the substrate 102. The conductive feature 410 includes a first liner layer 412, similar to the first liner layer 132 (FIG. 1). The conductive feature 410 further includes a second liner layer 416, similar to the third liner layer 136 (FIG. 1). The conductive feature 410 further includes a conductive fill 418, similar to the conductive fill 138 (FIG. 1). The via 120 is electrically connected to the conductive fill 418. In the semiconductor device 400A, the sidewalls of the first liner layer 132 are part of a continuous shape with the sidewalls of the via 120.

In some embodiments, a width W1 at an interface between the via 120 and the conductive fill 418 ranges from about 10 nm to about 22 nm. In some embodiments where the semiconductor device 400A is in the M1 level, the width W1 ranges from about 8 nm to about 15 nm. In some embodiments where the semiconductor device 400A is in the M2 level, the width W1 ranges from about 12 nm to about 18 nm. In some embodiments where the semiconductor device 400A is in the M3 level, the width W1 ranges from about 12 nm to about 16 nm. If the width W1 is too small, then resistance at the interface between the via 120 and the conductive fill 418 is increased which impairs functioning of the semiconductor device 400A, in some instances. If the width W1 is too great, then a size of the semiconductor device 400A is increased without a significant improvement in performance, in some instances. Similar to the semiconductor device 100 (FIG. 1), the via 120 has the height H2 of at least 50% of the height of the via opening.

FIG. 4B is a cross-sectional view of a contact structure in a seal ring region in accordance with some embodiments. A semiconductor device 400B is similar to the semiconductor device 100 (FIG. 1). In comparison with the semiconductor device 100, the semiconductor device 400B includes the conductive feature 410 as part of the substrate 102. In some embodiments, the conductive feature 410 is in place of the substrate 102. In the semiconductor device 400B, the sidewalls of the first liner layer 132 are offset with respect to the sidewalls of the via 120.

In some embodiments, a width W2 at an interface between the via 120 and the conductive fill 418 ranges from about 100 nm to about 180 nm. If the width W2 is too small, then resistance at the interface between the via 120 and the conductive fill 418 is increased which impairs functioning of the semiconductor device 400B, in some instances. If the width W2 is too great, then a size of the semiconductor device 400B is increased without a significant improvement in performance, in some instances. In comparison with the semiconductor device 400A, the semiconductor device 400B includes the via 120 having a height H3, which is at least 80% of the height of the via opening. The increase in the height H3, in comparison, with the height H2 is a result of the wider opening of the semiconductor device 400B, i.e., the difference between width W1 and the width W2. The wider opening helps to facilitate faster deposition of material in the via 120 resulting the increased height in comparison with a same process performed for the semiconductor device 400A.

Figure 5:
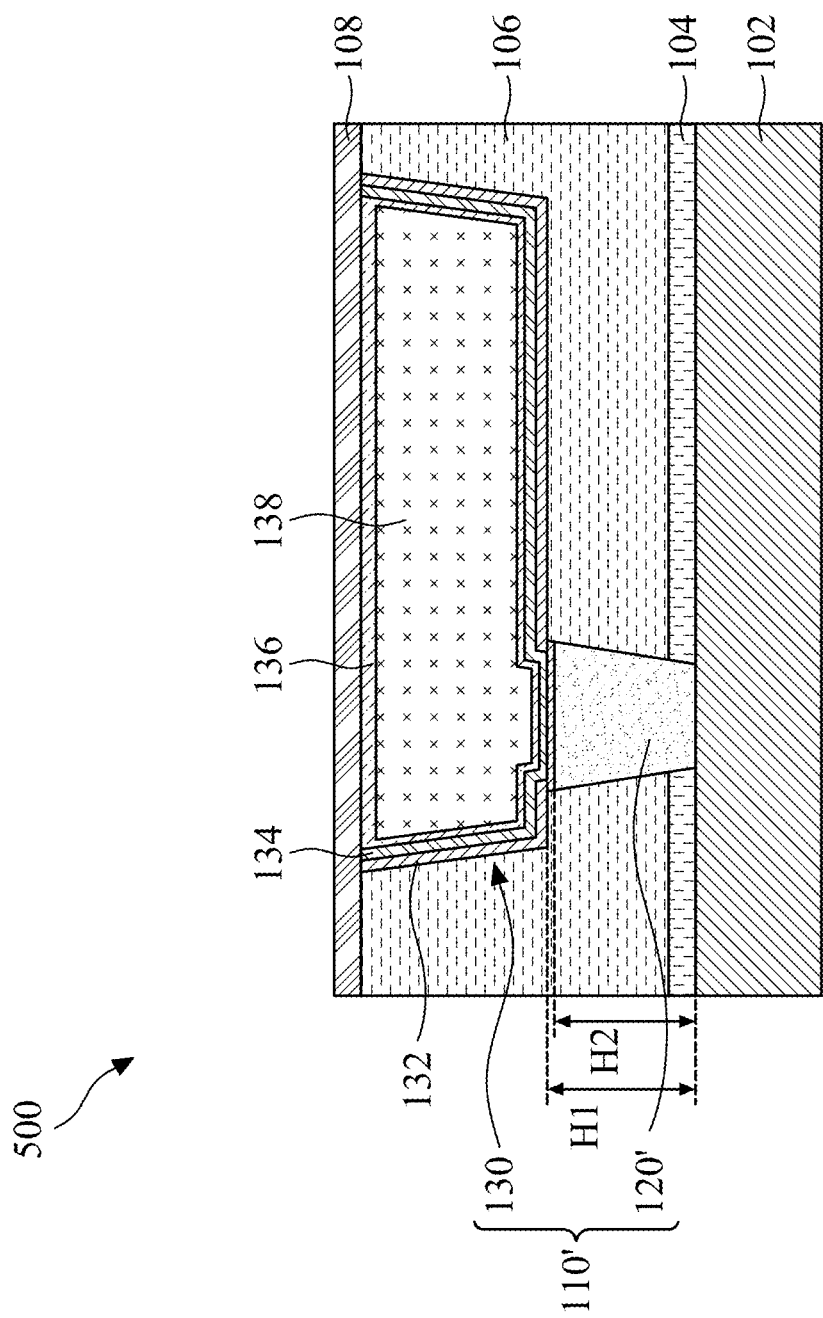
FIG. 5 is a cross-sectional view of a contact structure in accordance with some embodiments.

FIG. 5 is a cross-sectional view of a contact structure in accordance with some embodiments. A semiconductor device 500 is similar to the semiconductor device 100 (FIG. 1). In comparison with the semiconductor device 100, the semiconductor device 500 includes a contact structure 110' which includes a via 120'. The via 120' is similar to the via 120 (FIG. 1); however, the via 120' includes tungsten in place of the ruthenium in the via 120.

Figure 6:
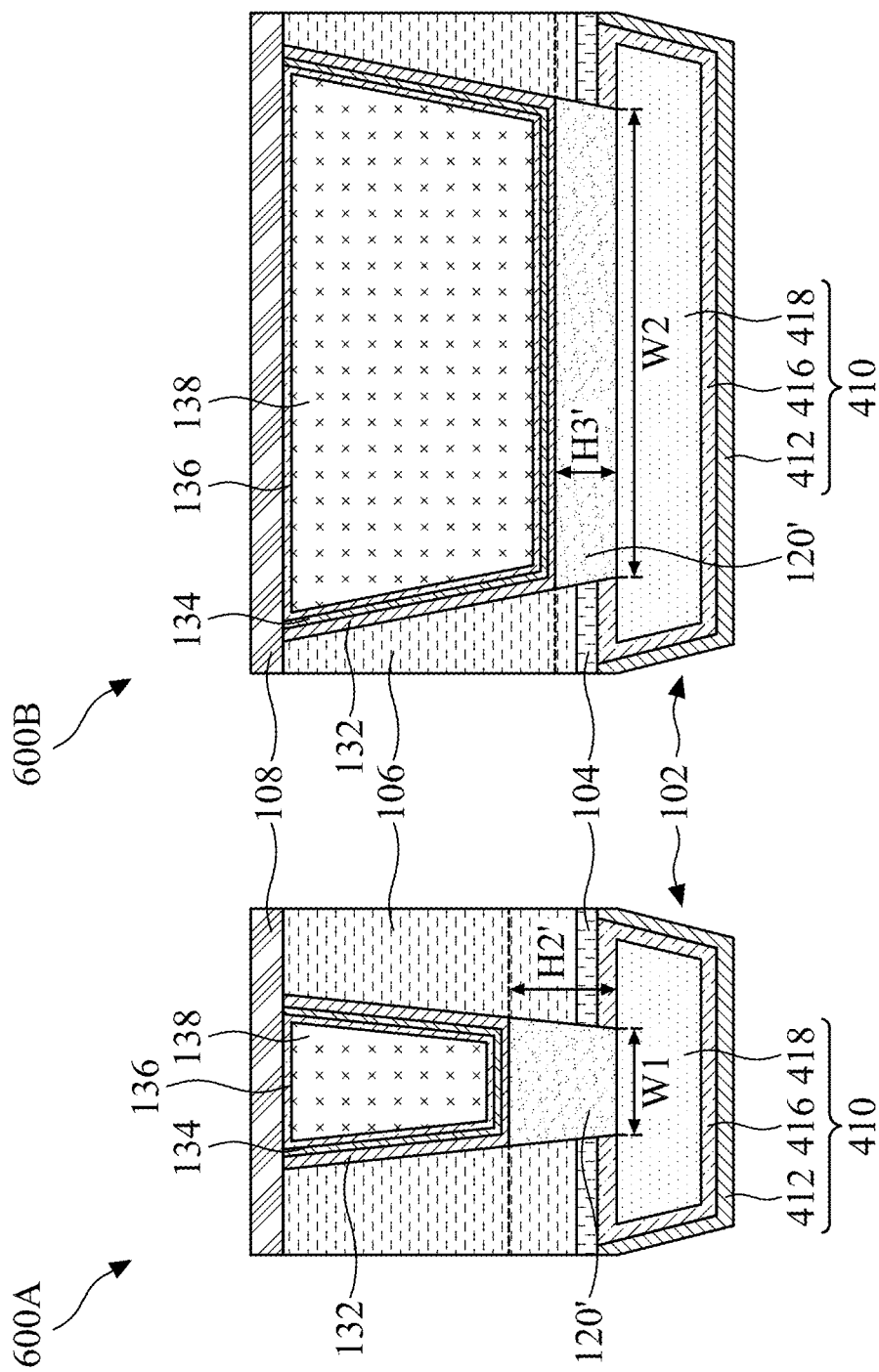
FIG. 6A is a cross-sectional view of a contact structure in a circuit region in accordance with some embodiments.
FIG. 6B is a cross-sectional view of a contact structure in a seal ring region in accordance with some embodiments.

FIG. 6A is a cross-sectional view of a contact structure in a circuit region in accordance with some embodiments. A semiconductor device 600A is similar to the semiconductor device 400A (FIG. 4A). In comparison with the semiconductor device 400A, the semiconductor device 600A includes the via 120', which includes tungsten in place of the ruthenium in the via 120.

FIG. 6B is a cross-sectional view of a contact structure in a seal ring region in accordance with some embodiments. A semiconductor device 600B is similar to the semiconductor device 600B (FIG. 4A). In comparison with the semiconductor device 400B, the semiconductor device 600B includes the via 120', which includes tungsten in place of the ruthenium in the via 120.

Figure 7:
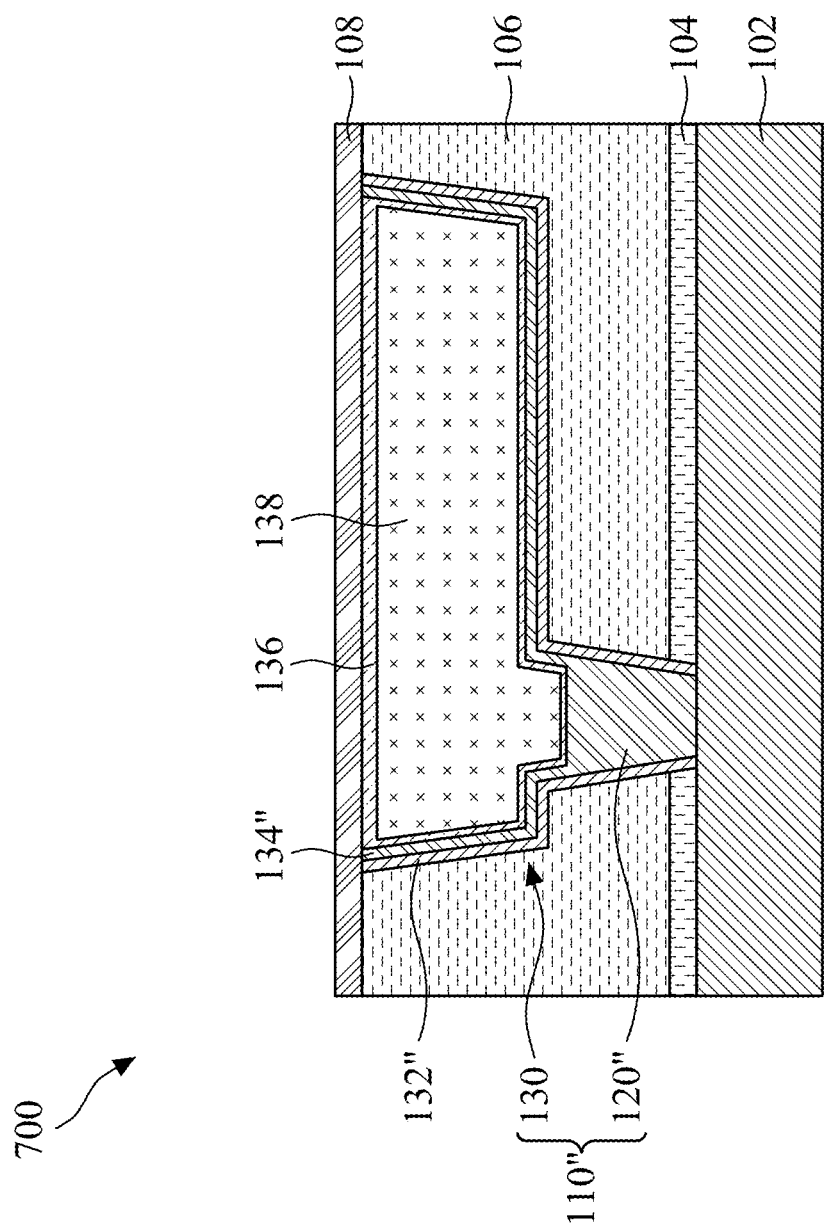
FIG. 7 is a cross-sectional view of a contact structure in accordance with some embodiments.

FIG. 7 is a cross-sectional view of a contact structure in accordance with some embodiments. A semiconductor device 700 is similar to the semiconductor device 100 (FIG. 1). In comparison with the semiconductor device 100, the semiconductor device 700 includes a contact structure 110" which includes a via 120" that is continuous with a second liner layer 134". In contrast with the semiconductor device 100 (FIG. 1), the semiconductor device 700 includes a first liner layer 132" which extends along an entirety of sidewalls of the via opening separating the via 120" from the insulating layer 106 and the ESL 104.

The via 120" is similar to the via 120 (FIG. 1) with regard to material, thickness and formation method. However, the via 120" is continuous with respect to the second liner layer 134". In some embodiments, there is no interface between the via 120" and the second liner layer 134". In some embodiments, a total thickness of the via 120" and the second liner layer 134" in a direction perpendicular to a top surface of the substrate 102 ranges from about 16 angstroms to about 60 angstroms. If the total thickness is too small, then the material of the conductive material of the via 120" fails to sufficiently fill the via opening and a risk of voids forming in the contact structure 110" increases, in some instances. If the total thickness is too great, then the size of the semiconductor device 700 is increased without significant improvement in the performance of the semiconductor device 700, in some instances.

The first liner layer 132" is similar to the first liner layer 132 (FIG. 1) with regards to material and formation method. However, the first liner layer 132" is thinner than the first liner layer 132. In some embodiments, a thickness of the first liner layer 132" along the sidewalls of the via opening and the conductive line opening ranges from about 5 angstroms to about 10 angstroms. If the first liner layer 132" is too thin, then a risk of migration of the conductive fill 138 into the insulating layer 106 increases, in some instances. If the first liner layer 132" is too thick, then a size of the semiconductor device 700 is increased without significant improvement in the functionality of the semiconductor device 700, in some instances. In some embodiments, the first liner layer 132" extends between the substrate 102 and the via 120" In some embodiments, a thickness of the first liner layer 132" between the substrate and the via 120" ranges from about 2 angstroms to about 5 angstroms. If the first liner layer 132" is too thin, then a risk of migration of the conductive material of the via 120" into the substrate 106 increases, in some instances. If the first liner layer 132" is too thick, then a size of the semiconductor device 700 is increased without significant improvement in the functionality of the semiconductor device 700, in some instances.

The second liner layer 134" is similar to the second liner layer 134 (FIG. 1) with regards to material and formation method. However, the second liner layer 134" is thicker than the second liner layer 134. In some embodiments, a thickness of the second liner layer 134" along the sidewalls of the conductive line opening ranges from about 10 angstroms to about 35 angstroms. If the second liner layer 134" is too thin, then a risk of migration of the conductive fill 138 into the insulating layer 106 increases, in some instances. If the first liner layer 134" is too thick, then a size of the semiconductor device 700 is increased without significant improvement in the functionality of the semiconductor device 700, in some instances.

Figure 8:
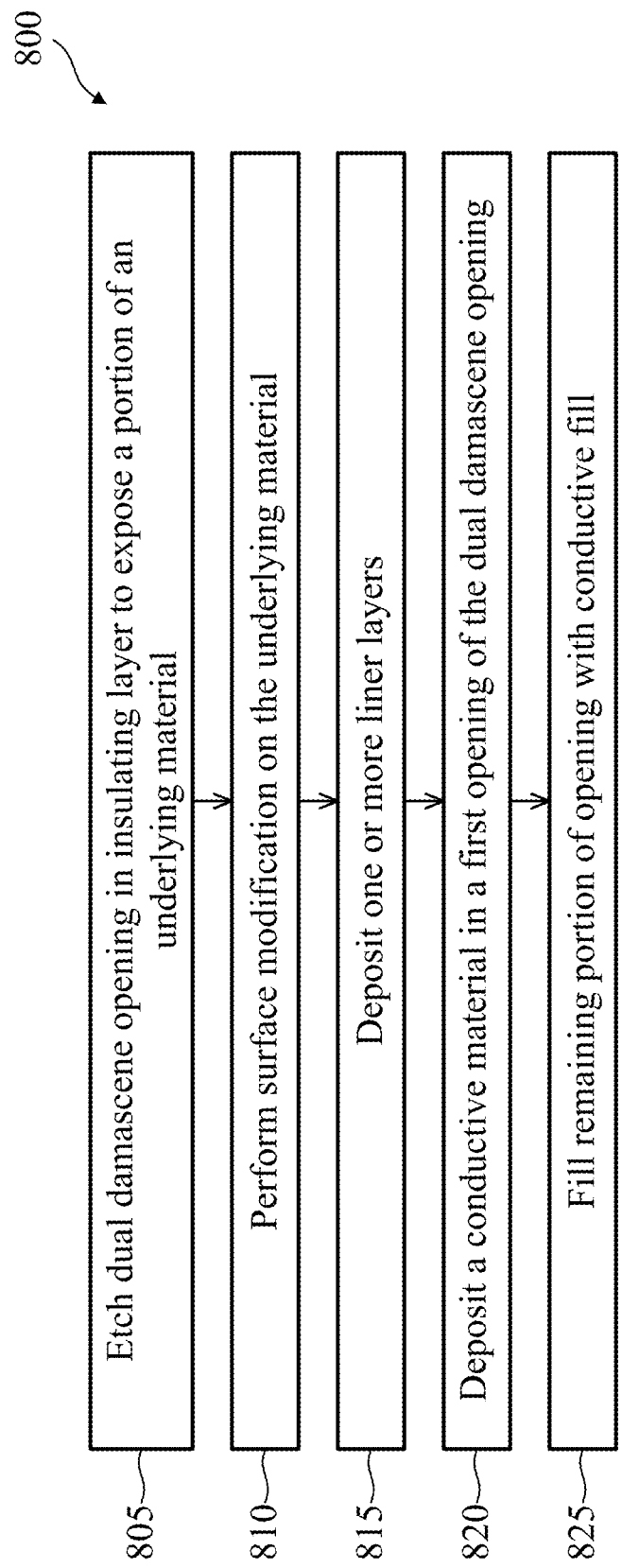
FIG. 8 is a flow chart of a method of making a contact structure in accordance with some embodiments.

FIG. 8 is a flow chart of a method 800 of making a contact structure in accordance with some embodiments. In operation 805, an insulating layer is etched to form a dual damascene opening to expose an underlying material. In some embodiments, operation 805 is similar to operation 205 (FIG. 2).

FIG. 9A is a cross-sectional view of a contact structure following etching of a dual damascene opening in accordance with some embodiments. A semiconductor device 900A is similar to the semiconductor device 300A (FIG. 3A).

Returning to FIG. 8, method 800 further includes operation 810 in which a surface modification is performed on the underlying material. In some embodiments, the underlying material includes a conductive material, an isolation structure or a semiconductor structure. The surface modification includes the deposition of a monolayer of BTA. In some embodiments, the surface modification includes deposition of a material other than BTA. The surface modification is selective to the conductive material, so the monolayer is not formed on the insulating layer 106.

Figure 9B:
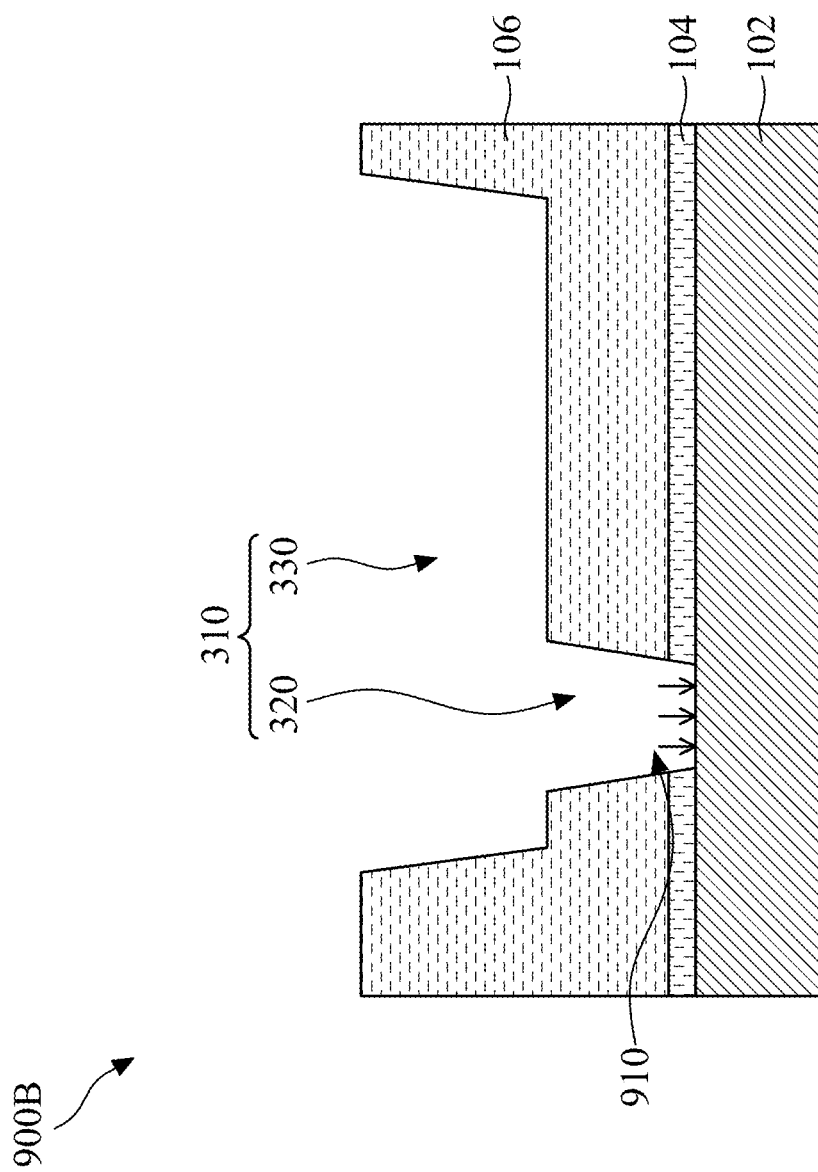

FIG. 9B is a cross-sectional view of a contact structure during performance of a surface modification process in accordance with some embodiments. A semiconductor device 900B includes a surface modification process 910 being performed on the substrate 102. In some embodiments, the surface modification process 910 is performed on a conductive element, an isolation structure in the substrate 102 or on a layer of the interconnect structure above the substrate 102.

Returning to FIG. 8, the method 800 includes operation 815 in which one or more liner layers are deposited. In some embodiments, a single liner layer is deposited. In some embodiments, multiple liner layers are deposited. The surface modification from operation 810 results in a thickness of a first liner layer deposited in the operation 815 being reduced over the underlying material in comparison with the thickness of the first liner layer over the insulating layer. In some embodiments, the surface modification in operation 810 prevents formation of a liner layer on the underlying material. In some embodiments, the first liner layer includes TaN, TiN or another suitable material. In some embodiments, additional liner layers include ruthenium, cobalt or other suitable materials. In some embodiments, the one or more liner layers are independently deposited using ALD, CVD, PVD, plating or another suitable deposition process.

Figure 9C:
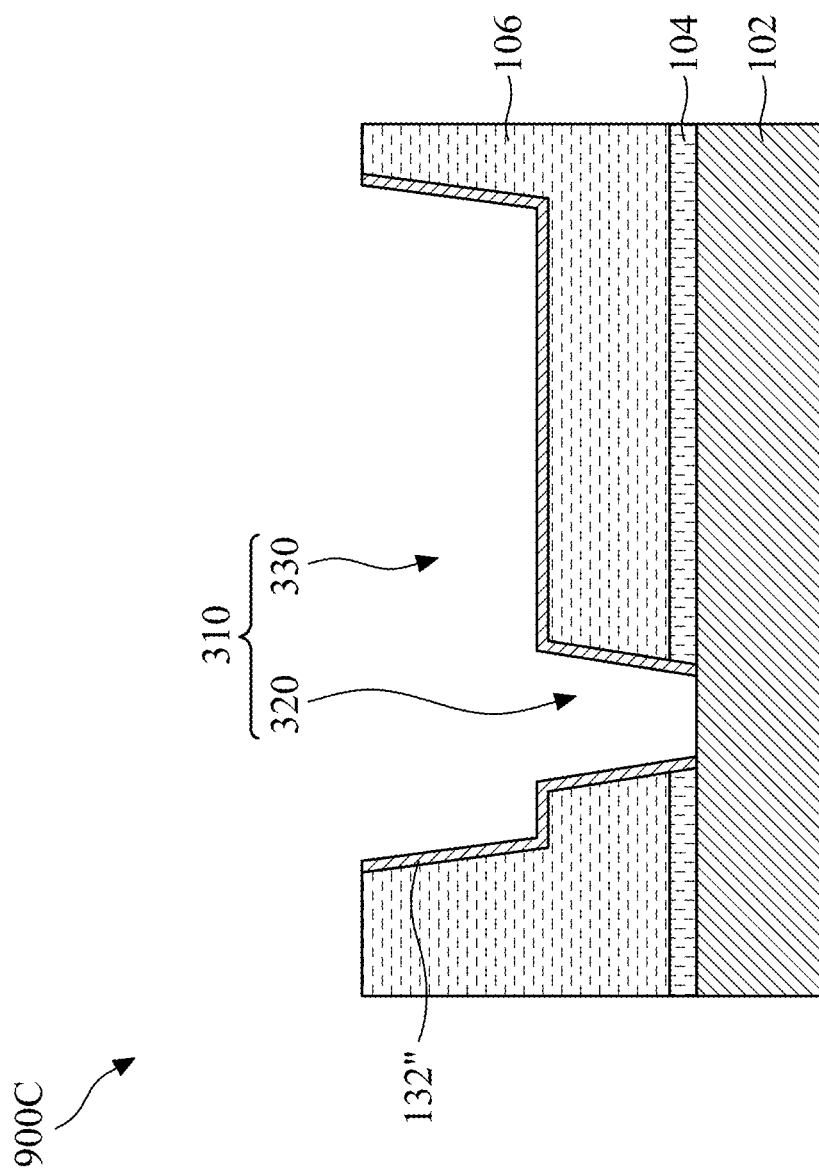

FIG. 9C is a cross-sectional view of a contact structure following deposition of a liner layer in accordance with some embodiments. A semiconductor device 900C includes the first liner layer 132" in the via opening 320 and in the conductive line opening 330. A thickness of the first liner layer 132" over the substrate 102 is less than a thickness of the first liner layer 132" on the sidewalls of the via opening 320 and the conductive line opening 330. In some embodiments, the first liner layer 132" is not on the surface of the substrate 102.

Returning to FIG. 8, method 800 further includes operation 820 in which the via opening is filled with a conductive material. In some embodiments, the conductive material includes ruthenium, tungsten or another suitable material. The conductive material fills at least 50% of the via opening. In some embodiments, the conductive material fills an entirety of the via opening. In some embodiments, the conductive material extends into the conductive line opening. Operation 820 further includes depositing a layer of the conductive material over the one or more liner layers formed during operation 815. In some embodiments, the conductive material includes ruthenium or another suitable material. In some embodiments, the deposition of the conductive material is performed using ALD, CVD, PVD, plating or another suitable deposition process.

In operation 825 a remaining portion of the dual damascene opening is filled with a conductive fill. The conductive fill fills portions of the conductive line opening not occupied by the one or more liner layers or the conductive material. In some embodiments, the conductive fill includes copper, copper alloy, tungsten, aluminum or another suitable material. In some embodiments, the fill is performed using ALD, CVD, PVD, plating or another suitable deposition process. In some embodiments, the method 800 includes additional operations such as annealing or planarization processes. In some embodiments, an additional liner layer is formed between operation 820 and operation 825.

Figure 9D:
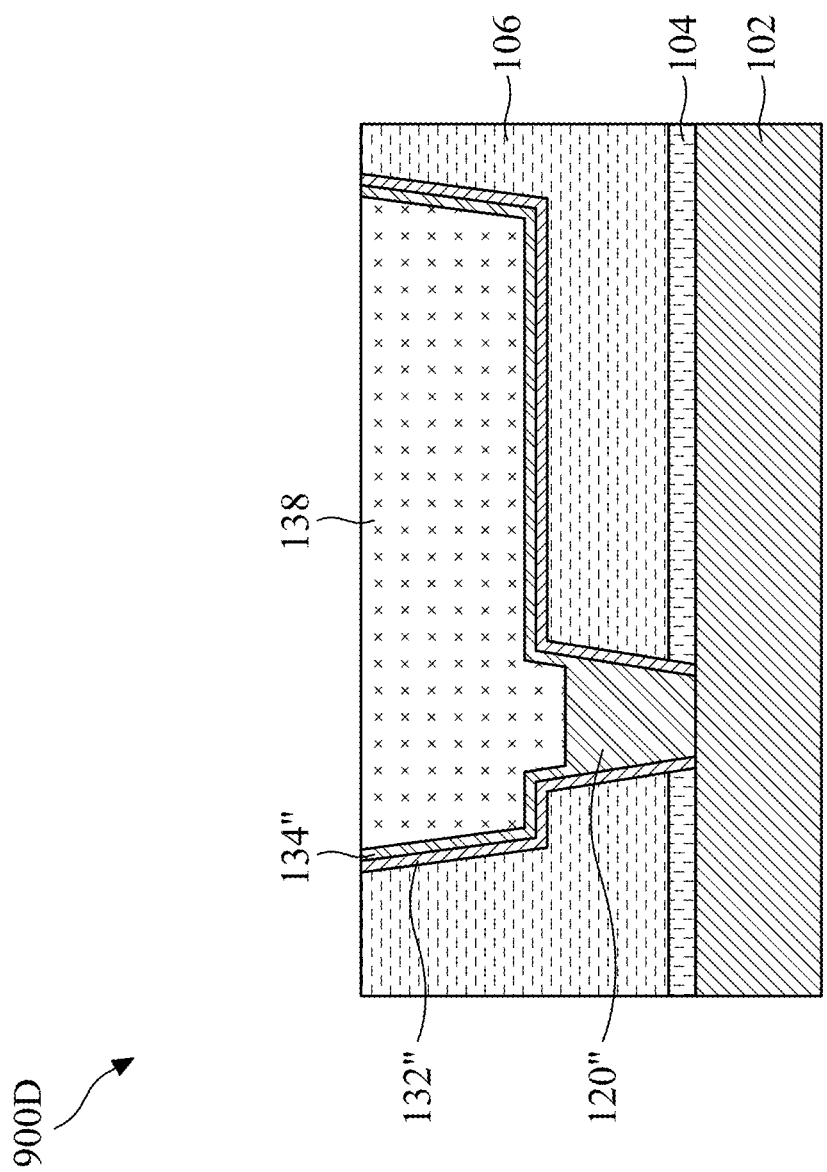

FIG. 9D is a cross-sectional view of a contact structure following filling a remaining portion of the opening with a conductive fill in accordance with some embodiments. A semiconductor device 900D includes the first liner layer 132", the second liner layer 134", and the conductive fill 138 in the conductive line opening. In some embodiments, the semiconductor device 900D further includes a third liner layer, such as third liner layer 138 (FIGS. 1 and 7). The conductive fill 138 fills the remaining portion of the conductive line opening not occupied by the first liner layer 132", the second liner layer 134" and the via 120".

FIG. 10A is a cross-sectional view of a contact structure in a circuit region in accordance with some embodiments. A semiconductor device 1000A is similar to the semiconductor device 700 (FIG. 7). In comparison with the semiconductor device 700, the semiconductor device 1000A includes the conductive feature 410 as part of the substrate 102. The via 120" is electrically connected to the conductive fill 418. In the semiconductor device 1000A, the sidewalls of the first liner layer 132" are part of a continuous shape with the sidewalls of the via 120".

In some embodiments, a height H4 of a combination of the via 120" and the second liner layer 134" in the direction perpendicular to the top surface of the substrate 102 ranges from about 20 angstroms to about 60 angstroms. If the height H4 is too small, then the material of the conductive material of the via 120" fails to sufficiently fill the via opening and a risk of voids forming in the contact structure 110" increases, in some instances. If the height H4 is too great, then the size of the semiconductor device 1000A is increased without significant improvement in the performance of the semiconductor device 1000A, in some instances. In some embodiments where the semiconductor device 1000A is in the M1 level, the width W1 ranges from about 8 nm to about 15 nm. In some embodiments where the semiconductor device 1000A is in the M2 level, the width W1 ranges from about 14 nm to about 22 nm. In some embodiments where the semiconductor device 1000A is in the M3 level, the width W1 ranges from about 12 nm to about 16 nm. If the width W1 is too small, then resistance at the interface between the via 120 and the conductive fill 418 is increased which impairs functioning of the semiconductor device 1000A, in some instances. If the width W1 is too great, then a size of the semiconductor device 1000A is increased without a significant improvement in performance, in some instances.

FIG. 10B is a cross-sectional view of a contact structure in a seal ring region in accordance with some embodiments. A semiconductor device 1000B is similar to the semiconductor device 700 (FIG. 7). In comparison with the semiconductor device 700, the semiconductor device 1000B includes the conductive feature 410 as part of the substrate 102. In some embodiments, the conductive feature 410 is in place of the substrate 102.

In some embodiments, a height H5 of a combination of the via 120" and the second liner layer 134" in the direction perpendicular to the top surface of the substrate 102 ranges from about 16 angstroms to about 48 angstroms. If the height H5 is too small, then the material of the conductive material of the via 120" fails to sufficiently fill the via opening and a risk of voids forming in the contact structure 110" increases, in some instances. If the height H5 is too great, then the size of the semiconductor device 1000B is increased without significant improvement in the performance of the semiconductor device 1000B, in some instances.

At a transition from the via 120" to the second liner layer 134" a tapered sidewall 1010 exists. The tapered sidewall 1010 is a result of a change in the deposition process for depositing the conductive material for the via 120" and the conductive material for the second liner layer 134". An angle α of the tapered sidewall with respect to the top surface of the via 120" ranges from about 30-degrees to about 60-degrees. If the angle α is too small, then stress at the junction between the second liner layer 134" and the via 120" increases a risk of a crack forming, in some instances. If the angle α is too great, then a size of the conductive fill 138 is reduced which increases resistance of the contact structure, in some instances.

Figure 11:
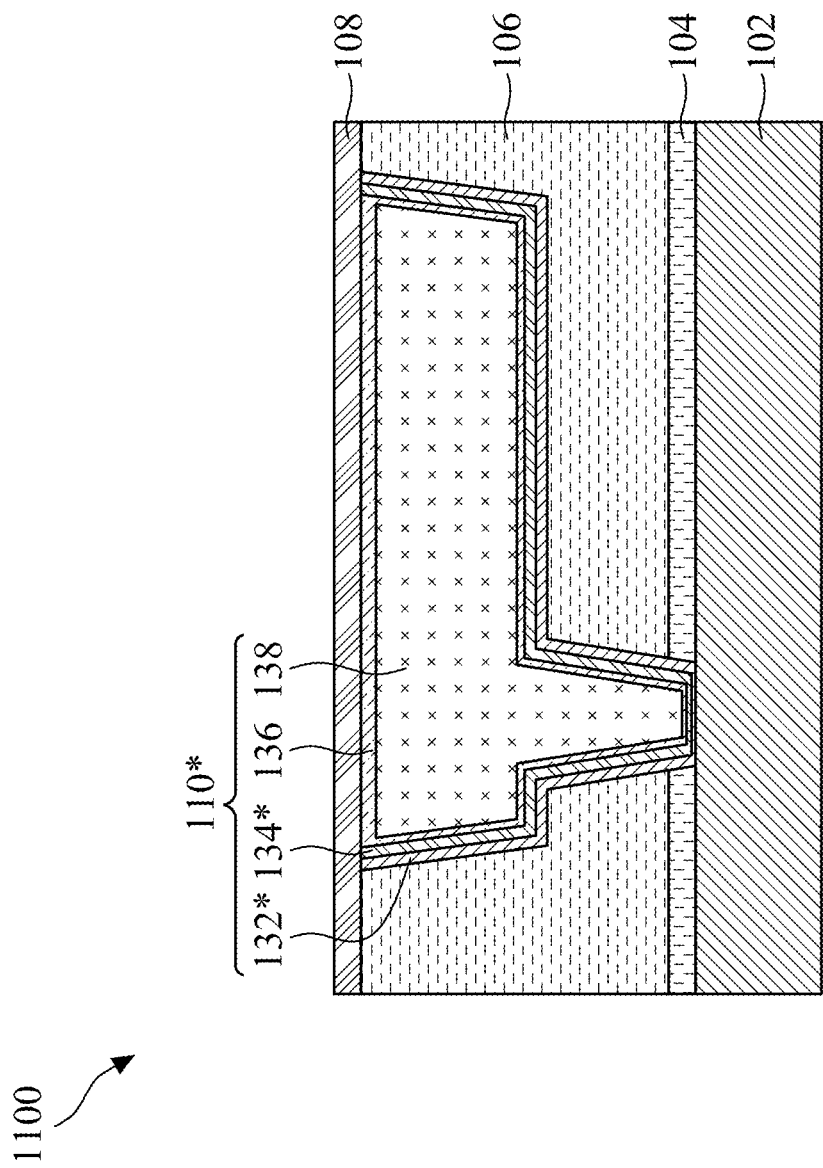
FIG. 11 is a cross-sectional view of a contact structure in accordance with some embodiments.

FIG. 11 is a cross-sectional view of a contact structure in accordance with some embodiments. A semiconductor device 1100 is similar to the semiconductor device 100 (FIG. 1). In comparison with the semiconductor device 100, the semiconductor device 1100 does not include via 120. In contrast, the first liner layer 132\*, the second liner layer 134\*, the third liner layer 136 and the conductive fill 138 are continuous in both the conductive line opening and the via opening for forming the contact structure 110\*. The first liner layer 132\* is similar to the first liner layer 132 (FIG. 1) in material and process of forming. The second liner layer 134\* is similar to the second liner layer 134 (FIG. 1) in material and process of forming.

In contrast to the first liner layer 132 (FIG. 1), the first liner layer 132\* has a thickness along the sidewalls of the via opening and the conductive line opening ranging from about 8 angstroms to about 20 angstroms. If the thickness of the first liner layer 132\* along the sidewalls is too thin, then a risk of the conductive fill 138 migrating into the insulating layer 106 increases, in some instances. If the thickness of the first liner layer 132\* along the sidewalls is too great, then a size of the semiconductor device 1100 is increased without a significant increase in the performance of the semiconductor device 1100, in some instances. In some embodiments, thickness of the first liner layer 132\* adjacent to the substrate 102 ranges from about 3 angstroms to about 8 angstroms. In some embodiments, the thickness of the first liner layer 132\* adjacent the substrate 102 is less than 50% of the thickness of the first liner layer 132\* along the sidewalls. If the thickness of the first liner layer 132\* along adjacent to the substrate 102 is too thin, then a risk of the conductive fill 138 migrating into the substrate 102 increases, in some instances. If the thickness of the first liner layer 132\* adjacent the substrate 102 is too great, then a size of the semiconductor device 1100 is increased without a significant increase in the performance of the semiconductor device 1100, in some instances.

In contrast to the second liner layer 134 (FIG. 1), the second liner layer 134\* has a thickness along the sidewalls of the via opening and the conductive line opening ranging from about 5 angstroms to about 15 angstroms. If the thickness of the second liner layer 134\* along the sidewalls is too thin, then a risk of the conductive fill 138 migrating into the insulating layer 106 increases, in some instances. If the thickness of the second liner layer 134\* along the sidewalls is too great, then a size of the semiconductor device 1100 is increased without a significant increase in the performance of the semiconductor device 1100, in some instances. In some embodiments, a thickness of the second liner layer 134\* adjacent to the substrate 102 ranges from about 3 angstroms to about 8 angstroms. In some embodiments, the thickness of the second liner layer 134\* adjacent the substrate 102 is less than 50% of the thickness of the second liner layer 134\* along the sidewalls. If the thickness of the second liner layer 134\* along adjacent to the substrate 102 is too thin, then a risk of the conductive fill 138 migrating into the substrate 102 increases, in some instances. If the thickness of the second liner layer 134\* adjacent the substrate 102 is too great, then a size of the semiconductor device 1100 is increased without a significant increase in the performance of the semiconductor device 1100, in some instances.

Figure 12:
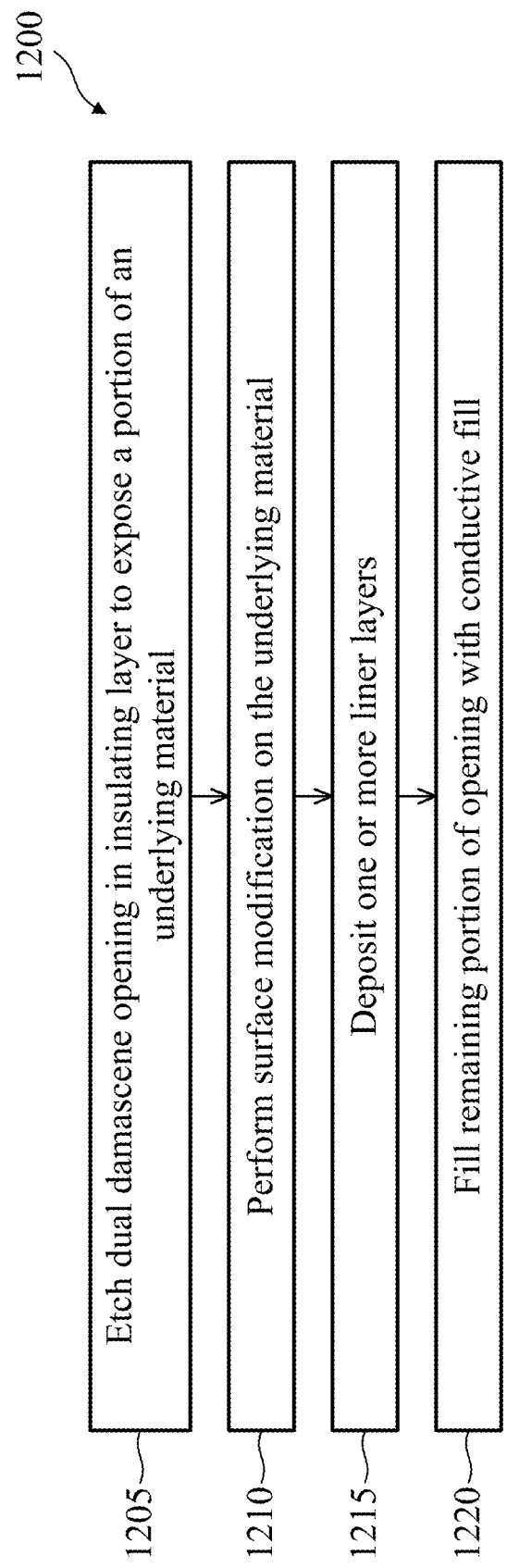
FIG. 12 is a flow chart of a method of making a contact structure in accordance with some embodiments.

FIG. 12 is a flow chart of a method 1200 of making a contact structure in accordance with some embodiments. In operation 1205, an insulating layer is etched to form a dual damascene opening to expose an underlying material. In some embodiments, operation 1205 is similar to operation 205 (FIG. 2).

Figure 13A:
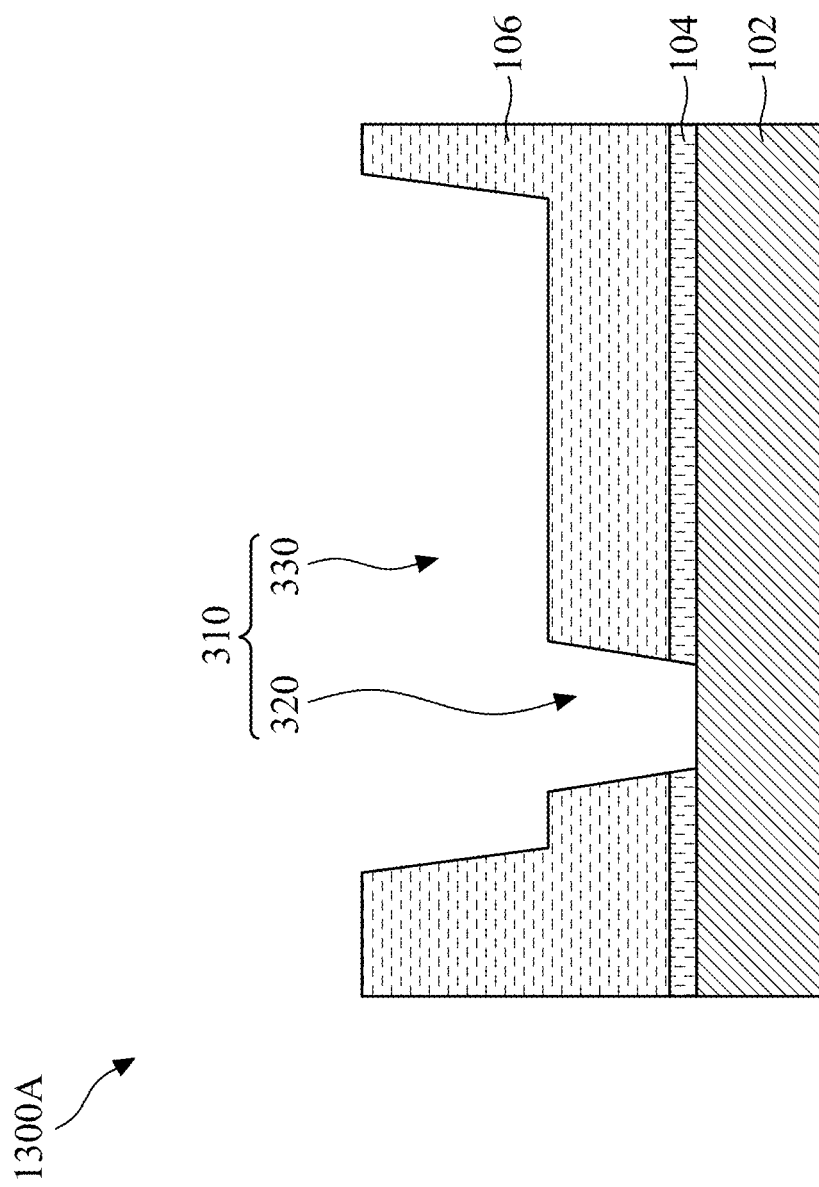
FIGS. 13A-13D are cross-sectional views of a contact structure during various stage of manufacturing in accordance with some embodiments.

FIG. 13A is a cross-sectional view of a contact structure following etching of a dual damascene opening in accordance with some embodiments. A semiconductor device 1300A is similar to the semiconductor device 300A (FIG. 3A).

Returning to FIG. 12, method 1200 further includes operation 1210 in which a surface modification is performed on the underlying material. In some embodiments, the underlying material includes a conductive material, an isolation structure or a semiconductor structure. The surface modification includes the deposition of a monolayer of BTA. In some embodiments, the surface modification includes deposition of a material other than BTA. The surface modification is selective to the conductive material, so the monolayer is not formed on the insulating layer 106.

Figure 13B:
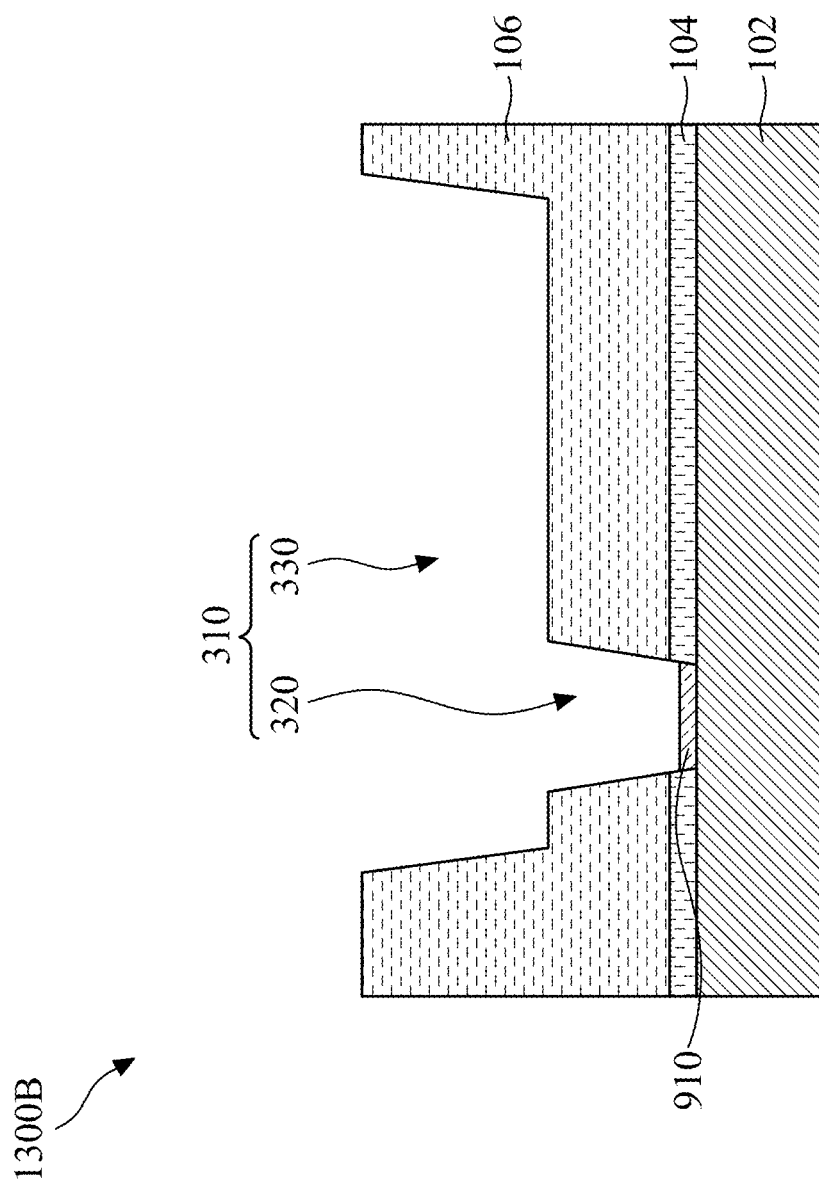

FIG. 13B is a cross-sectional view of a contact structure during performance of a surface modification process in accordance with some embodiments. A semiconductor device 1300B includes a surface modification process 910 being performed on the substrate 102. In some embodiments, the surface modification process 910 is performed on a conductive element, an isolation structure in the substrate 102 or on a layer of the interconnect structure above the substrate 102.

Returning to FIG. 12, the method 1200 includes operation 1215 in which one or more liner layers are deposited. In some embodiments, a single liner layer is deposited. In some embodiments, multiple liner layers are deposited. The surface modification from operation 1210 results in a thickness of a first liner layer deposited in the operation 1215 being reduced over the underlying material in comparison with the thickness of the first liner layer along sidewalls of the insulating layer. In some embodiments, the first liner layer includes TaN, TiN or another suitable material. In some embodiments, additional liner layers include ruthenium, cobalt or other suitable materials. In some embodiments, the surface modification from operation 1210 prevents formation of liner layers adjacent to the substrate 102. In some embodiments, the one or more liner layers are independently deposited using ALD, CVD, PVD, plating or another suitable deposition process.

Figure 13C:
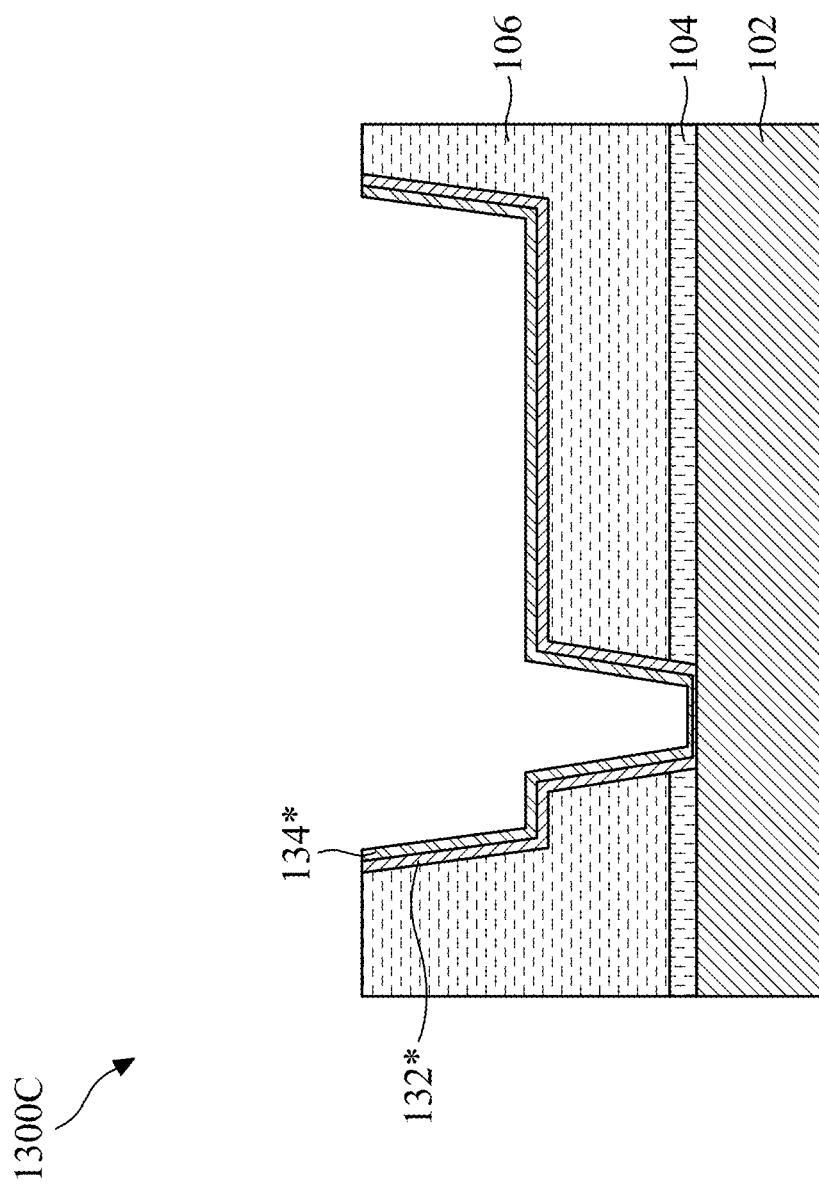

FIG. 13C is a cross-sectional view of a contact structure following deposition of two liner layers in accordance with some embodiments. A semiconductor device 1300C includes the first liner layer 132* in the via opening 320 and in the conductive line opening 330. A thickness of the first liner layer 132* over the substrate 102 is less than a thickness of the first liner layer 132* on the sidewalls of the via opening 320 and the conductive line opening 330. The semiconductor device 1300C includes the second liner layer 134* in the via opening 320 and in the conductive line opening 330. A thickness of the second liner layer 134* over the substrate 102 is less than a thickness of the second liner layer 134* on the sidewalls of the via opening 320 and the conductive line opening 330.

Returning to FIG. 12, method 1200 further includes operation 1220 in which a remaining portion of the dual damascene opening is filled with a conductive fill. The conductive fill fills portions of the conductive line opening not occupied by the one or more liner layers. In some embodiments, the conductive fill includes copper, copper alloy, tungsten, aluminum or another suitable material. In some embodiments, the fill is performed using ALD, CVD, PVD, plating or another suitable deposition process. In some embodiments, the method 1200 includes additional operations such as annealing or planarization processes.

Figure 13D:
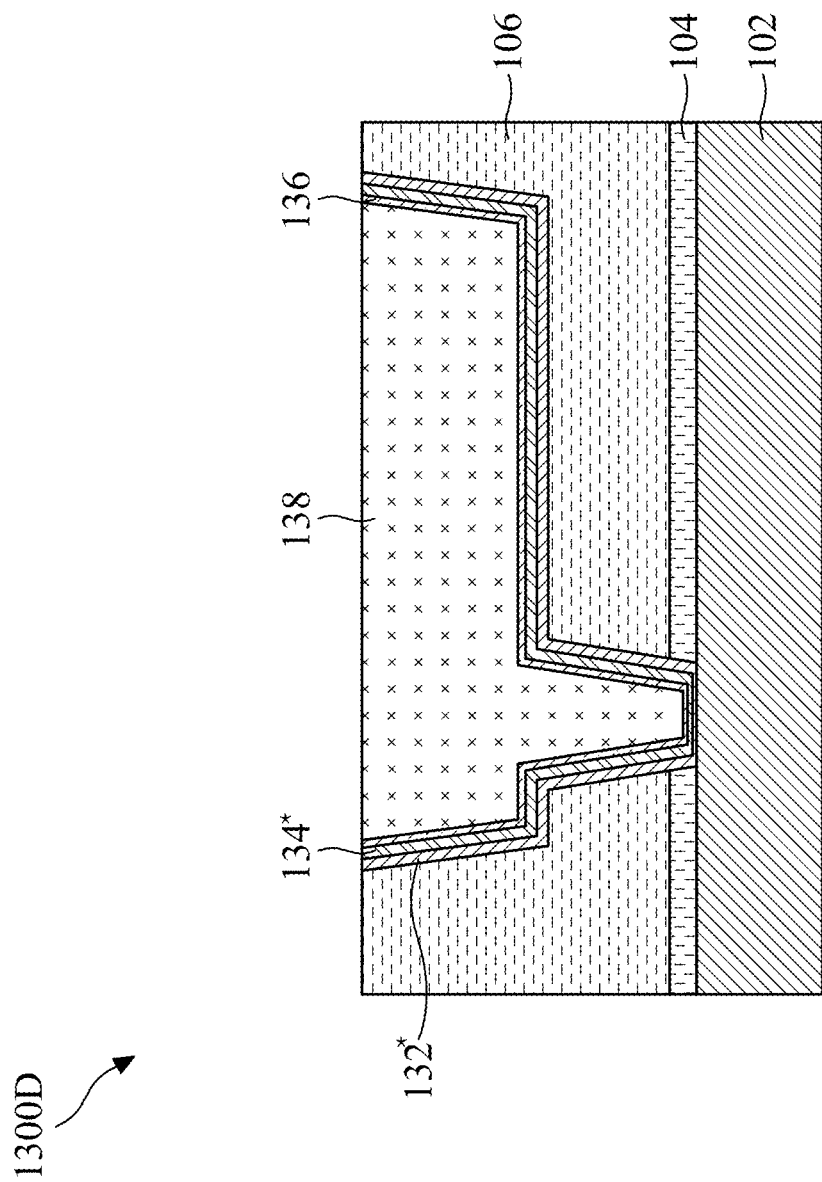

FIG. 13D is a cross-sectional view of a contact structure following filling a remaining portion of the opening with a conductive fill in accordance with some embodiments. A semiconductor device 1300D includes the third liner layer 136 and the conductive fill 138 in the conductive line opening and the via opening. The third liner layer 136 separates the conductive fill 138 from the second liner layer 134*. The conductive fill 138 fills the remaining portion of the conductive line opening not occupied by the first liner layer 132*, the second liner layer 134* and the third liner layer 136.

FIG. 14A is a cross-sectional view of a contact structure in a circuit region in accordance with some embodiments. A semiconductor device 1400A is similar to the semiconductor device 1100 (FIG. 11). In comparison with the semiconductor device 1100, the semiconductor device 1400A includes the conductive feature 410 as part of the substrate 102. The semiconductor device 1400A does not include a via, e.g., via 120 (FIG. 1). Instead, the liner layers 132*, 134* and 136 and the conductive fill 138 fill the entire opening in the insulating layer 106 and the ESL 104. In some embodiments where the semiconductor device 1400A is in the M1 level, the width W1 ranges from about 8 nm to about 15 nm. In some embodiments where the semiconductor device 1400A is in the M2 level, the width W1 ranges from about 14 nm to about 22 nm. In some embodiments where the semiconductor device 1400A is in the M3 level, the width W1 ranges from about 12 nm to about 16 nm. If the width W1 is too small, then resistance at the interface between the via 120 and the conductive fill 418 is increased which impairs functioning of the semiconductor device 1400A, in some instances. If the width W1 is too great, then a size of the semiconductor device 1400A is increased without a significant improvement in performance, in some instances.

FIG. 14B is a cross-sectional view of a contact structure in a seal ring region in accordance with some embodiments. A semiconductor device 1400B is similar to the semiconductor device 1100 (FIG. 11). In comparison with the semiconductor device 1100, the semiconductor device 1400B includes the conductive feature 410 as part of the substrate 102. In some embodiments, the conductive feature 410 is in place of the substrate 102. The semiconductor device 1400B does not include a via, e.g., via 120 (FIG. 1). Instead, the liner layers 132*, 134* and 136 and the conductive fill 138 fill the entire opening in the insulating layer 106 and the ESL 104.

Figure 15:
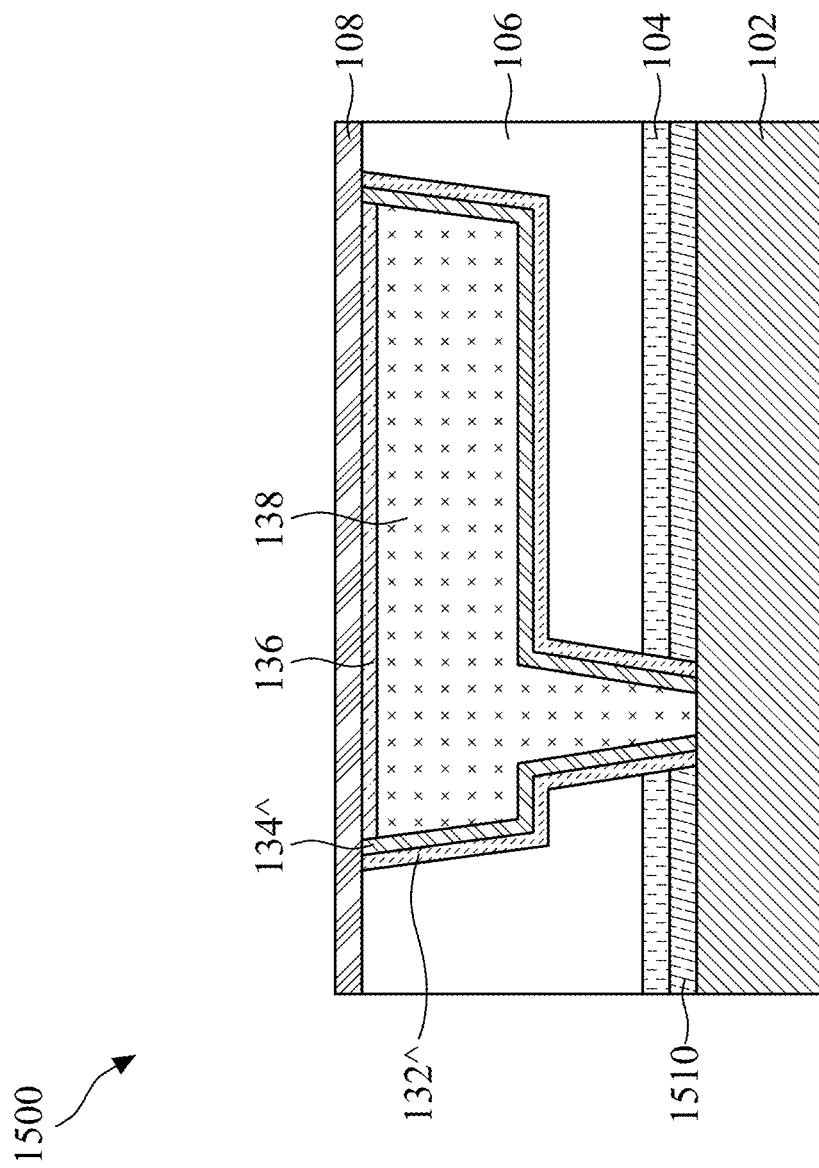
FIG. 15 is a cross-sectional view of a contact structure in accordance with some embodiments.

FIG. 15 is a cross-sectional view of a contact structure in accordance with some embodiments. A semiconductor device 1500 is similar to the semiconductor device 1100 (FIG. 11). In comparison with the semiconductor device 1100, the semiconductor device 1500 does not include liner layers between the conductive fill 138 and the substrate 102. The first liner layer 132^ is similar to the first liner layer 132 (FIG. 1) in material and process of forming. The second liner layer 134^ is similar to the second liner layer 134 (FIG. 1) in material and process of forming. In some embodiments, the semiconductor device 1500 includes a conductive material, such as an underlying conductive line or silicide region, as the substrate 102.

In contrast to the first liner layer 132 (FIG. 1), the first liner layer 132^ has a thickness along the sidewalls of the via opening and the conductive line opening ranging from about 8 angstroms to about 20 angstroms. If the thickness of the first liner layer 132^ along the sidewalls is too thin, then a risk of the conductive fill 138 migrating into the insulating layer 106 increases, in some instances. If the thickness of the first liner layer 132^ along the sidewalls is too great, then a size of the semiconductor device 1500 is increased without a significant increase in the performance of the semiconductor device 1500, in some instances. In FIG. 15, the first liner layer 132^ does not fully cover the substrate 102. In some embodiments, a thin layer of the first liner layer 132^ does cover the substrate 102. In some embodiments, a thickness of the first liner layer 132^ adjacent to the substrate 102 ranges from about 1 angstrom to about 3 angstroms. In some embodiments, the thickness of the first liner layer 132^ adjacent the substrate 102 is less than 50% of the thickness of the first liner layer 132^ along the sidewalls. If the thickness of the first liner layer 132^ along adjacent to the substrate 102 is too thin, then the first liner layer 132^ is effectively absent from the structure of the semiconductor device 1500, in some instances. If the thickness of the first liner layer 132^ adjacent the substrate 102 is too great, then a resistance between the conductive fill 138 and the substrate 102 increases and the functionality of the semiconductor device 1500 is impaired, in some instances.

In contrast to the second liner layer 134 (FIG. 1), the second liner layer 134^ has a thickness along the sidewalls of the via opening and the conductive line opening ranging from about 5 angstroms to about 25 angstroms. If the thickness of the second liner layer 134^ along the sidewalls is too thin, then a risk of the conductive fill 138 migrating into the insulating layer 106 increases, in some instances. If the thickness of the second liner layer 134^ along the sidewalls is too great, then a size of the semiconductor device 1500 is increased without a significant increase in the performance of the semiconductor device 1500, in some instances. In FIG. 15, the second liner layer 134^ does not fully cover the substrate 102. In some embodiments, a thin layer of the second liner layer 134^ does cover the substrate 102. In some embodiments, a thickness of the second liner layer 134^ adjacent to the substrate 102 ranges from about 1 angstrom to about 3 angstroms. In some embodiments, the thickness of the second liner layer 134^ adjacent the substrate 102 is less than 50% of the thickness of the second liner layer 134^ along the sidewalls. If the thickness of the second liner layer 134^ along adjacent to the substrate 102 is too thin, then the second liner layer 134^ is effectively absent from the structure of the semiconductor device 1500, in some instances. If the thickness of the second liner layer 134^ adjacent the substrate 102 is too great, then a resistance between the conductive fill 138 and the substrate 102 is increased and the functionality of the semiconductor device 1500 is impaired, in some instances.

The semiconductor device 1500 further includes a cap layer 1510. In some embodiments, the cap layer 1510 is similar to the third liner layer 136 (FIG. 1) from a conductive structure below the contact structure. The cap layer 1510 is between the substrate 102 and the ESL 104. In some embodiments, the cap layer 1510 includes cobalt or another suitable material. In some embodiments, a thickness of the cap layer ranges from about 15 angstroms to about 40 angstroms. If the thickness of the cap layer 1510 is too great, then the size of the semiconductor device 1500 is increased without significant improvement in the functionality of the semiconductor device 1500, in some instances. If the thickness of the cap layer 1510 is too thin, a risk of the conductive material from the substrate 102 migrating into the ESL 104 increases, in some instances.

A method of forming the semiconductor device 1500 is similar to the method 1200 described above. For the semiconductor device 1500, the surface modification prevents formation of liner layers along the bottom surface of the via opening.

Figure 16A:
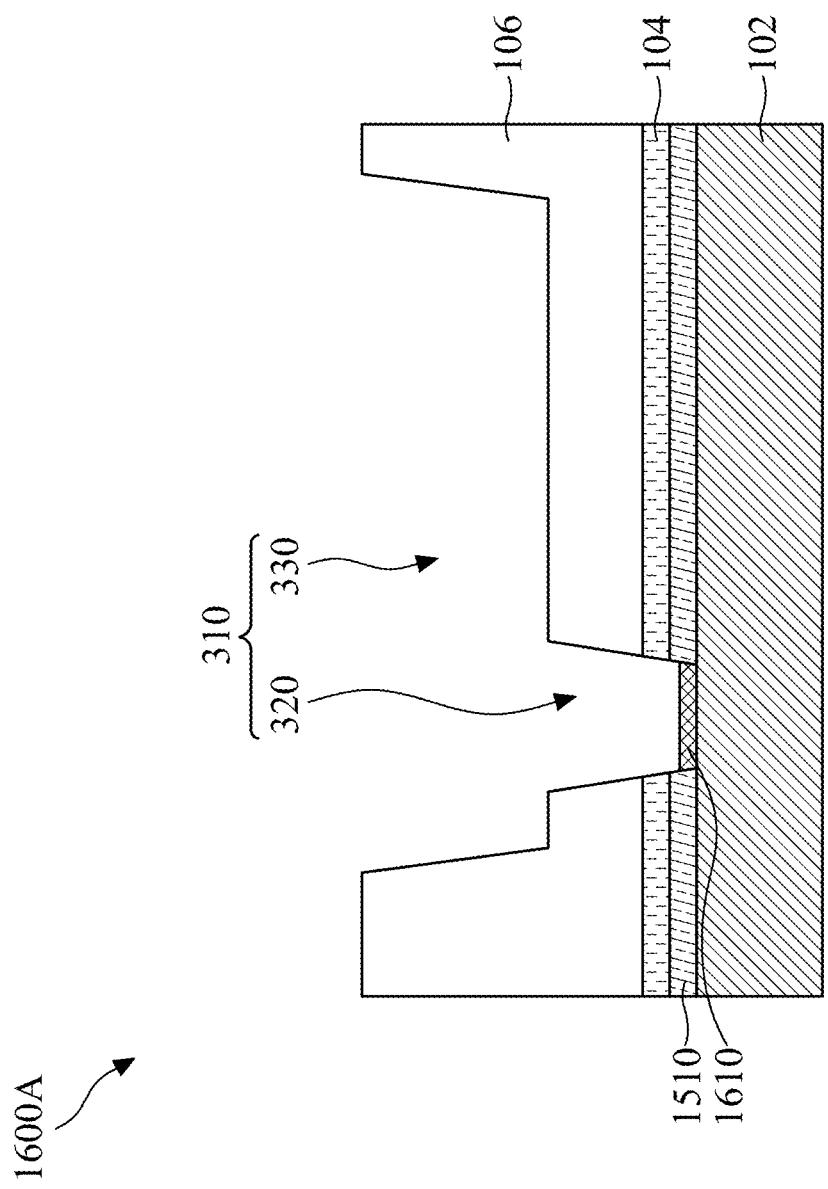
FIGS. 16A-16D are cross-sectional views of a contact structure during various stage of manufacturing in accordance with some embodiments.

FIG. 16A is a cross-sectional view of a contact structure following etching of a dual damascene opening in accordance with some embodiments. A semiconductor device 1600A is similar to the semiconductor device 300A (FIG. 3A). The semiconductor device 1610 includes a cap layer section 1610 that is removed by an etching process. In some embodiments, the etching process to remove the cap layer section 1610 is a same process as that used to form the dual damascene opening 310. In some embodiments, the etching process to remove the cap layer section 1610 is a different process form that used to form the dual damascene opening 310.

Figure 16B:
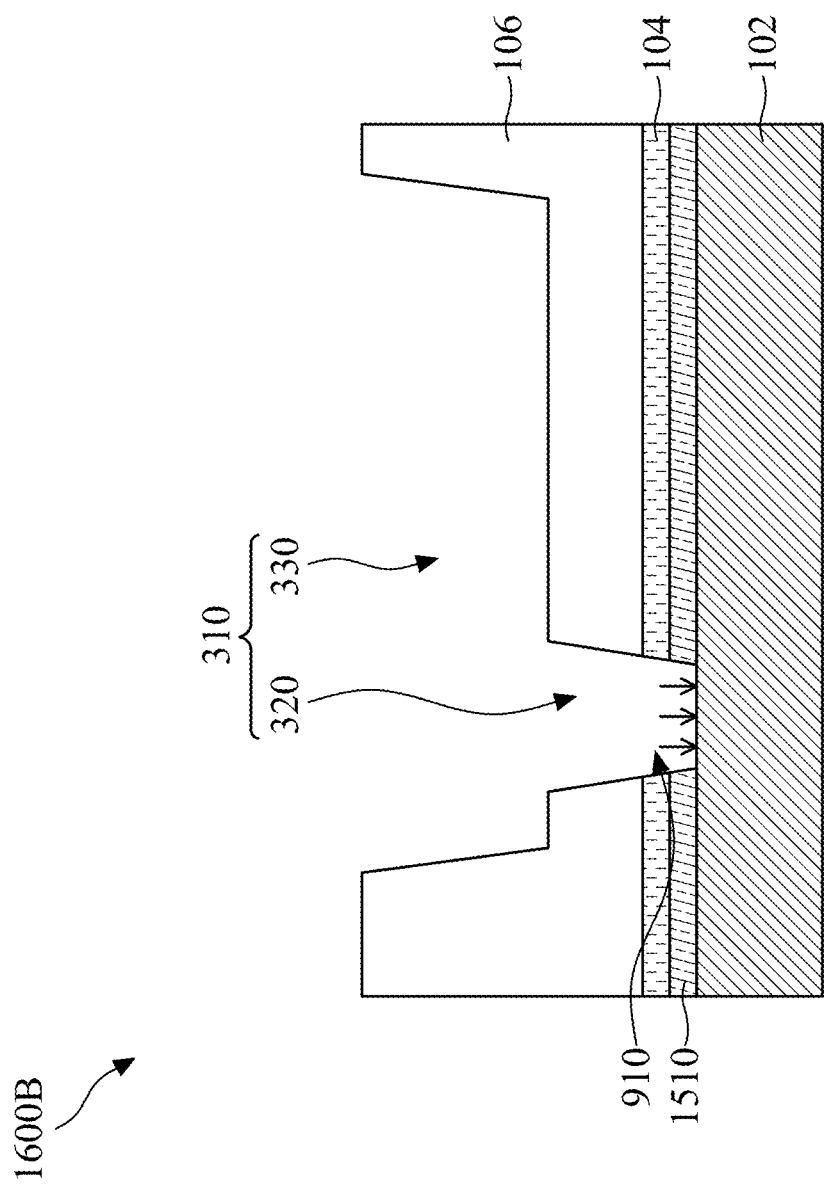

FIG. 16B is a cross-sectional view of a contact structure during performance of a surface modification process in accordance with some embodiments. A semiconductor device 1600B includes a surface modification process 910 being performed on the substrate 102. In some embodiments, the surface modification process 910 is performed on a conductive element, an isolation structure in the substrate 102 or on a layer of the interconnect structure above the substrate 102.

Figure 16C:
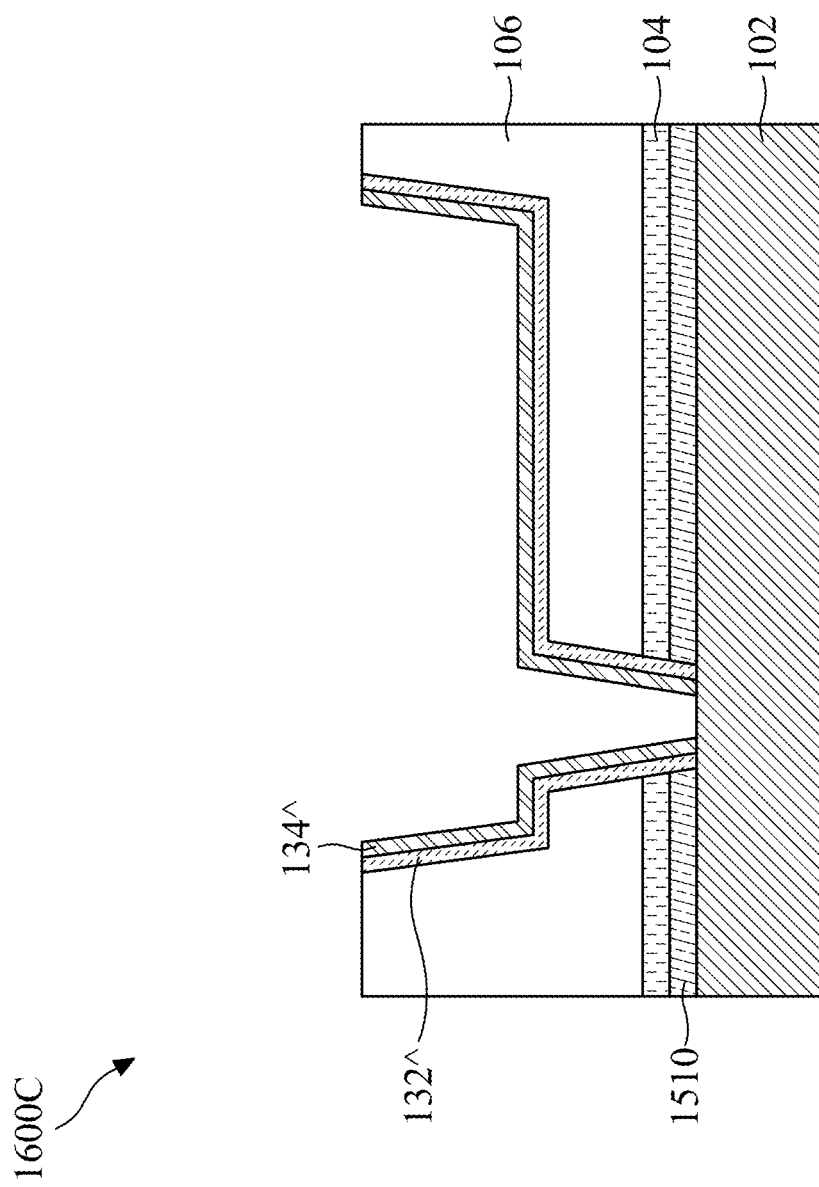

FIG. 16C is a cross-sectional view of a contact structure following deposition of two liner layers in accordance with some embodiments. A semiconductor device 1600C includes the first liner layer 132^ along sidewalls in the via opening 320 and in the conductive line opening 330. The first liner layer 132^ exposes a portion of the substrate 102. The semiconductor device 1600C includes the second liner layer 134^ along sidewalls in the via opening 320 and in the conductive line opening 330. The second liner layer 134^ exposes a portion of the substrate 102.

Figure 16D:
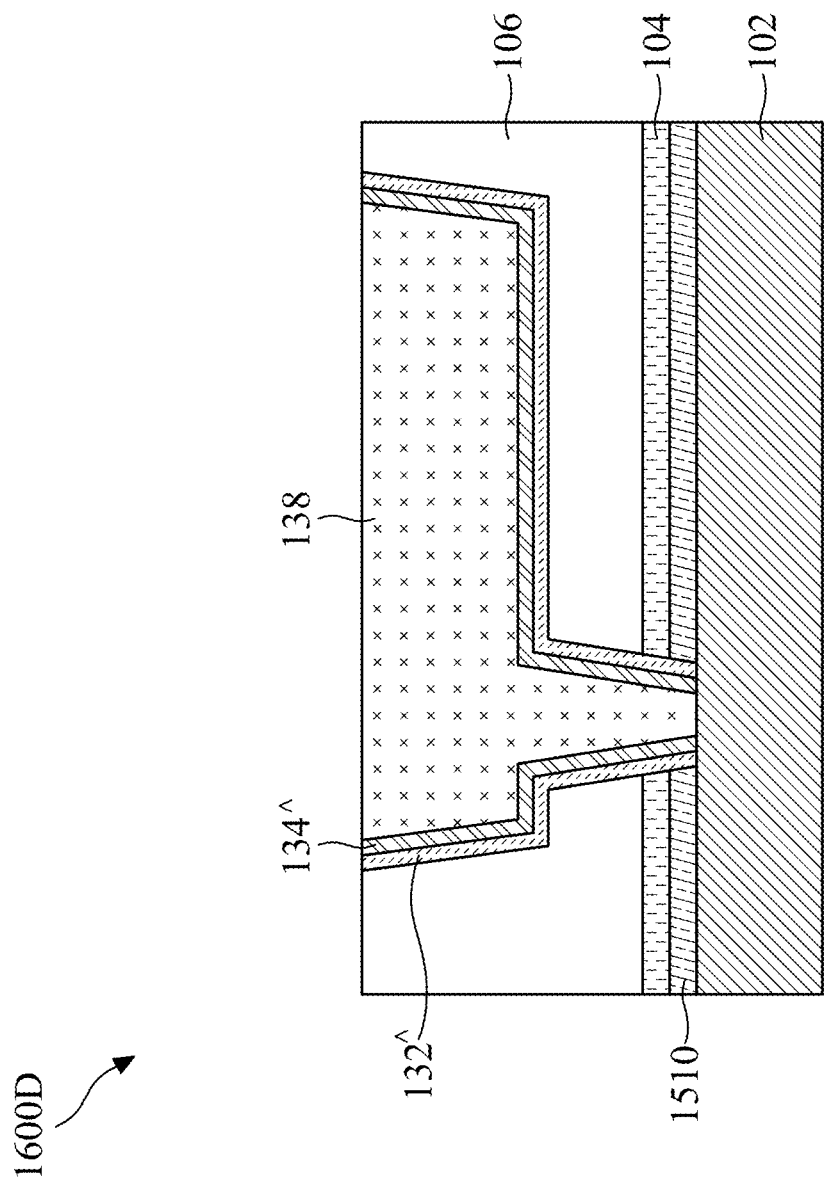

FIG. 16D is a cross-sectional view of a contact structure following filling a remaining portion of the opening with a conductive fill in accordance with some embodiments. A semiconductor device 1600D includes the conductive fill 138 in the conductive line opening and the via opening. The conductive fill 138 fills the remaining portion of the conductive line opening not occupied by the first liner layer 132^ and the second liner layer 134^. The conductive fill 138 directly contacts the substrate 102.

FIG. 17A is a cross-sectional view of a contact structure in a circuit region in accordance with some embodiments. A semiconductor device 1700A is similar to the semiconductor device 1500 (FIG. 15). In comparison with the semiconductor device 1500, the semiconductor device 1700A includes the conductive feature 410 as part of the substrate 102. The semiconductor device 1700A does not include a via, e.g., via 120 (FIG. 1). Instead, the liner layers 132^, 134^ and the conductive fill 138 fill the entire opening in the insulating layer 106 and the ESL 104. In some embodiments where the semiconductor device is part of the M0 level, the width W1 ranges from about 8 nm to about 12 nm. In some embodiments where the semiconductor device 1700A is in the M1 level, the width W1 ranges from about 10 nm to about 15 nm. In some embodiments where the semiconductor device 1700A is in the M2 level, the width W1 ranges from about 14 nm to about 22 nm. In some embodiments where the semiconductor device 1700A is in the M3 level, the width W1 ranges from about 12 nm to about 16 nm. If the width W1 is too small, then resistance at the interface between the via 120 and the conductive fill 418 is increased which impairs functioning of the semiconductor device 1700A, in some instances. If the width W1 is too great, then a size of the semiconductor device 1700A is increased without a significant improvement in performance, in some instances.

FIG. 17B is a cross-sectional view of a contact structure in a seal ring region in accordance with some embodiments. A semiconductor device 1700B is similar to the semiconductor device 1500 (FIG. 15). In comparison with the semiconductor device 1500, the semiconductor device 1700B includes the conductive feature 410 as part of the substrate 102. In some embodiments, the conductive feature 410 is in place of the substrate 102. The semiconductor device 1700B does not include a via, e.g., via 120 (FIG. 1). Instead, the liner layers 132^, 134^ and the conductive fill 138 fill the entire opening in the insulating layer 106 and the ESL 104.

Figure 18:
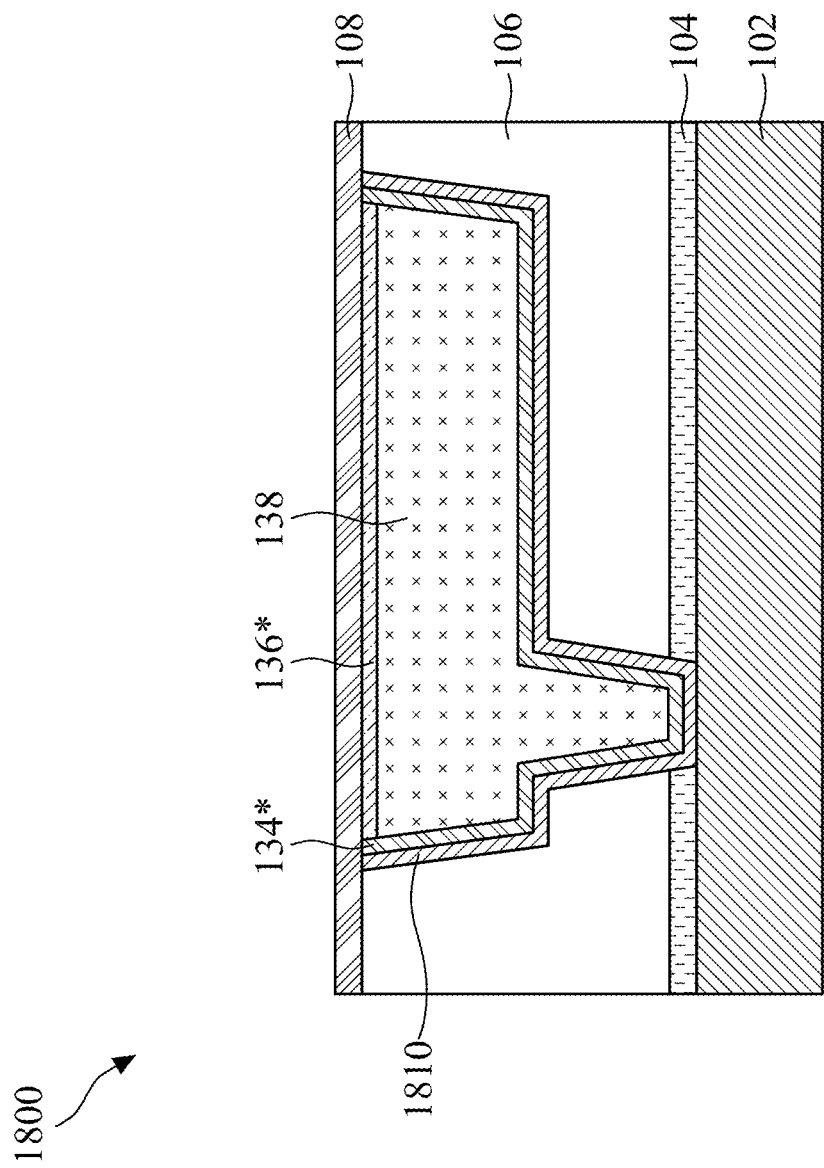
FIG. 18 is a cross-sectional view of a contact structure in accordance with some embodiments.

FIG. 18 is a cross-sectional view of a contact structure in accordance with some embodiments. A semiconductor device 1800 is similar to the semiconductor device 1100 (FIG. 11). In comparison with the semiconductor device 1100, the semiconductor device 1800 includes a different first liner layer. Instead of first liner layer 132* (FIG. 11), the semiconductor device 1800 includes first liner layer 1810. In addition, the third liner layer 136* of the semiconductor device 1800 is only along a top surface of the conductive fill 138. The third liner layer 136* is similar to the third liner layer 136 (FIG. 1) in material, thickness and formation process.

The first liner layer 1810 includes TaN doped with ruthenium. In some embodiments, the TaN is doped with ruthenium using in-situ doping. In some embodiments, the TaN is doped with ruthenium by depositing a layer of ruthenium on a TaN layer and annealing in order to drive the ruthenium into the TaN. A thickness of the first liner layer 1810 along the sidewalls of the via opening and the conductive line opening ranges from about 5 angstroms to about 15 angstroms. If the thickness of the first liner layer 1810 is too thin, then a risk of the conductive fill 138 migrating into the insulating layer 106 increases, in some instances. If the thickness of the first liner layer 1810 is too great, then a size of the semiconductor device 1800 is increased without a significant increase in performance, in some instances. A thickness of the first liner layer 1810 adjacent to the substrate 102 ranges from about 3 angstroms to about 8 angstroms. If the thickness of the first liner layer 1810 is too thin, then a risk of the conductive fill 138 migrating into the substrate 102 increases, in some instances. If the thickness of the first liner layer 1810 is too great, then resistance between the conductive fill 138 and the substrate 102 increases and the functionality of the semiconductor device 1800 is impaired, in some instances.

Figure 19:
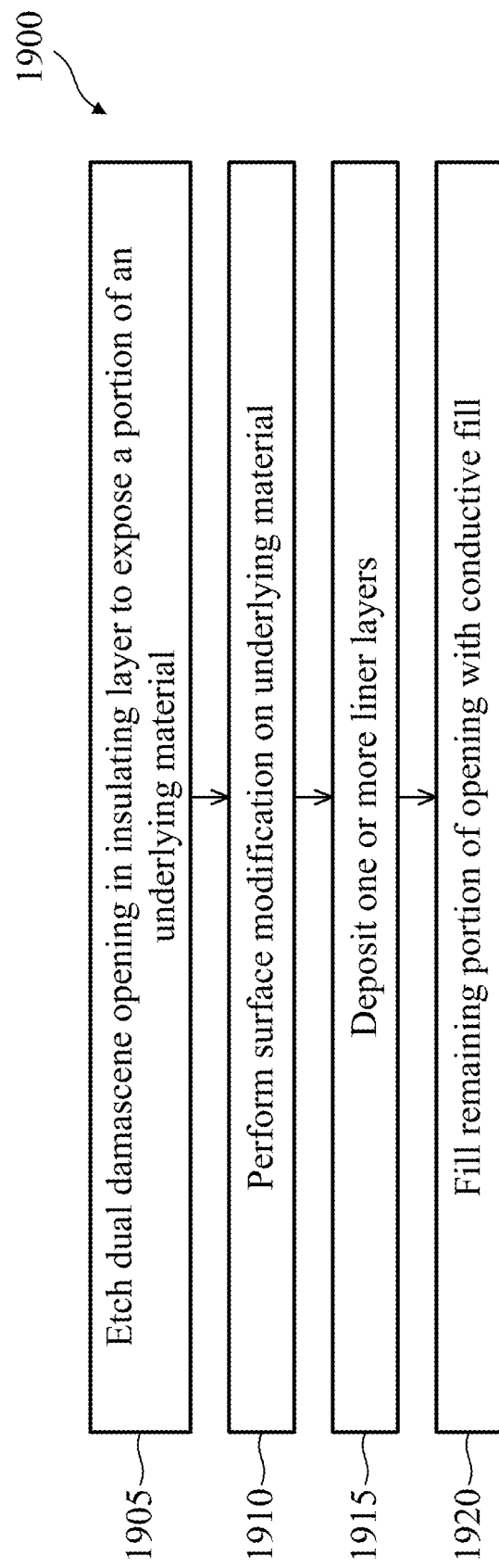
FIG. 19 is a flow chart of a method of making a contact structure in accordance with some embodiments.

FIG. 19 is a flow chart of a method 1900 of making a contact structure in accordance with some embodiments. In operation 1905, an insulating layer is etched to form a dual damascene opening to expose an underlying material. In some embodiments, operation 1905 is similar to operation 205 (FIG. 2).

Figure 20A:
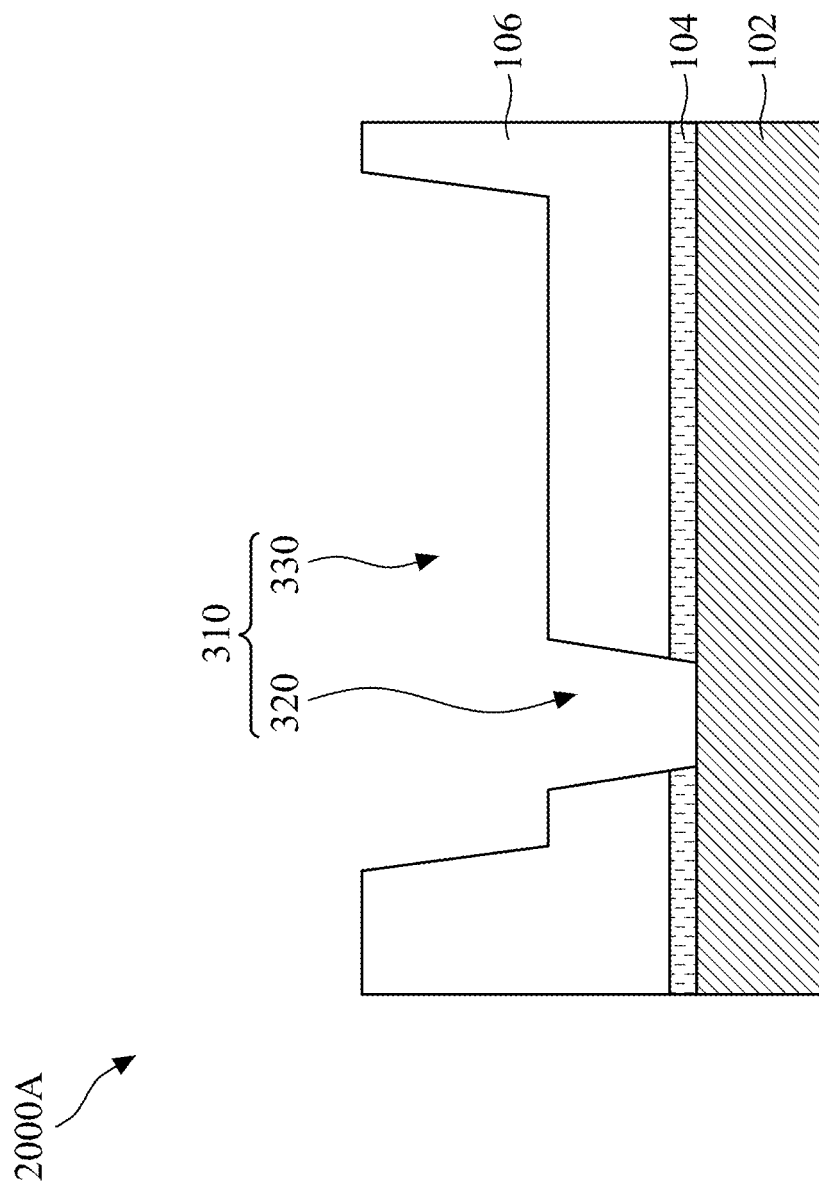
FIGS. 20A-20D are cross-sectional views of a contact structure during various stage of manufacturing in accordance with some embodiments.

FIG. 20A is a cross-sectional view of a contact structure following etching of a dual damascene opening in accordance with some embodiments. A semiconductor device 2000A is similar to the semiconductor device 300A (FIG. 3A).

Returning to FIG. 19, method 1900 further includes operation 1910 in which a surface modification is performed on the underlying material. In some embodiments, the underlying material includes a conductive material, an isolation structure or a semiconductor structure. The surface modification includes the deposition of a monolayer of BTA. In some embodiments, the surface modification includes deposition of a material other than BTA. The surface modification is selective to the conductive material, so the monolayer is not formed on the insulating layer 106.

Figure 20B:
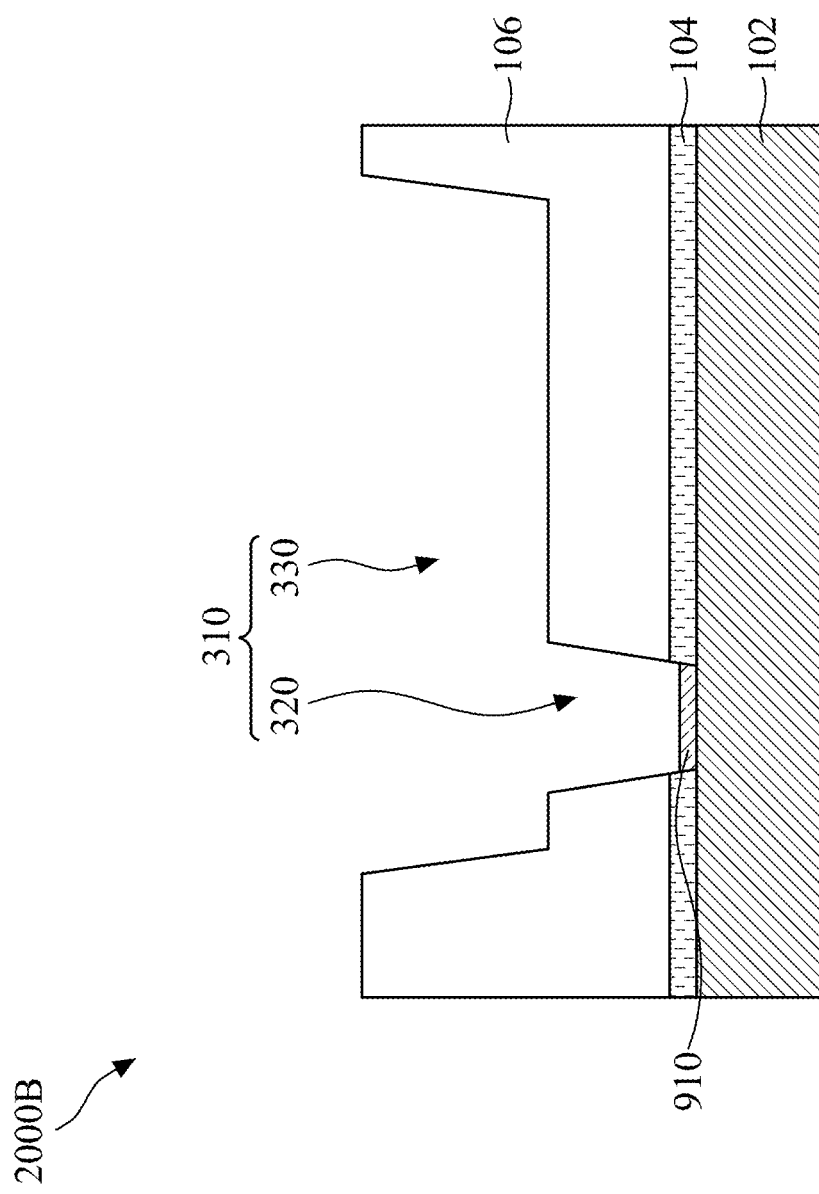

FIG. 20B is a cross-sectional view of a contact structure during performance of a surface modification process in accordance with some embodiments. A semiconductor device 2000B includes a surface modification process 910 being performed on the substrate 102. In some embodiments, the surface modification process 910 is performed on a conductive element, an isolation structure in the substrate 102 or on a layer of the interconnect structure above the substrate 102.

Returning to FIG. 19, the method 1900 includes operation 1215 in which one or more liner layers are deposited. In some embodiments, a single liner layer is deposited. In some embodiments, multiple liner layers are deposited. The surface modification from operation 1910 results in a thickness of a first liner layer deposited in the operation 1915 being reduced over the underlying material in comparison with the thickness of the first liner layer along sidewalls of the insulating layer. In some embodiments, the first liner layer includes TaN doped with ruthenium or another suitable material. In some embodiments, additional liner layers include ruthenium, cobalt or other suitable materials. In some embodiments, the surface modification from operation 1910 prevents formation of liner layers adjacent to the substrate 102. In some embodiments, the one or more liner layers are independently deposited using ALD, CVD, PVD, plating or another suitable deposition process.

Figure 20C:
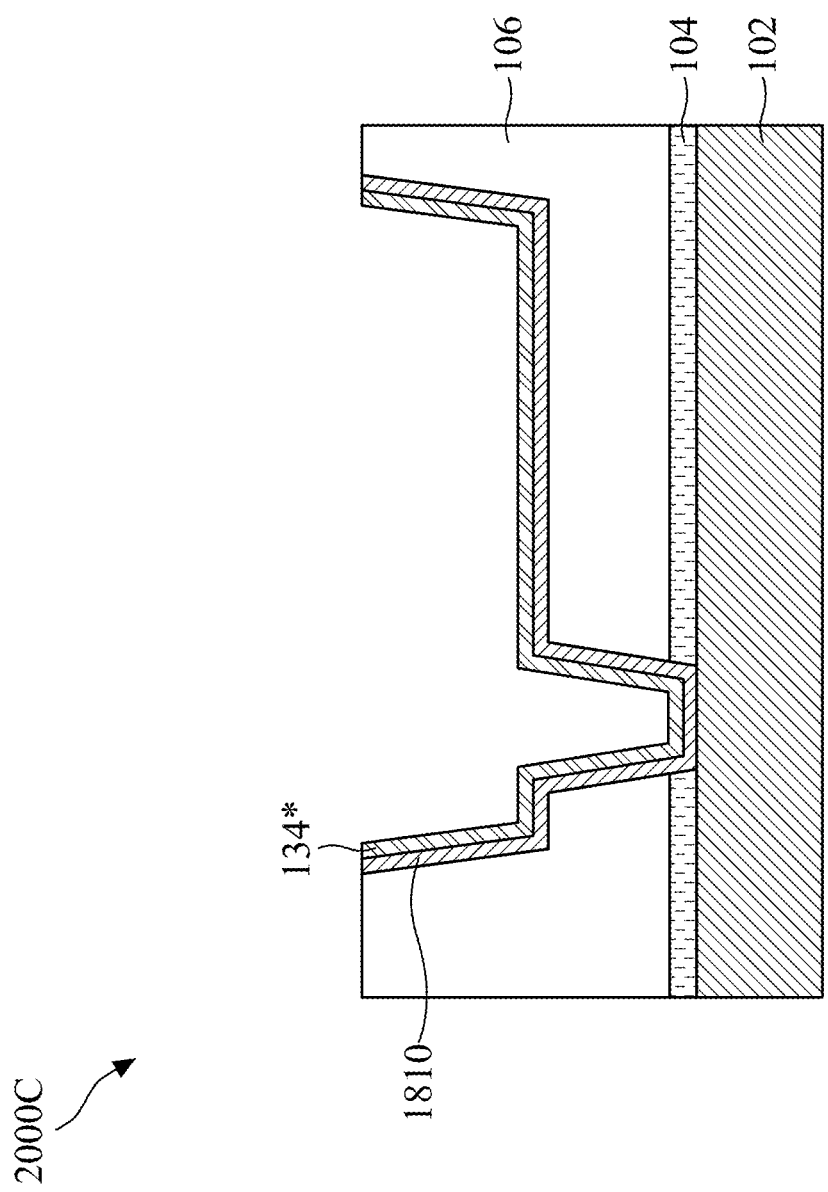

FIG. 20C is a cross-sectional view of a contact structure following deposition of two liner layers in accordance with some embodiments. A semiconductor device 2000C includes the first liner layer 1810 in the via opening 320 and in the conductive line opening 330. A thickness of the first liner layer 1810 over the substrate 102 is less than a thickness of the first liner layer 1810 on the sidewalls of the via opening 320 and the conductive line opening 330. The semiconductor device 2000C includes the second liner layer 134* in the via opening 320 and in the conductive line opening 330. A thickness of the second liner layer 134* over the substrate 102 is less than a thickness of the second liner layer 134* on the sidewalls of the via opening 320 and the conductive line opening 330.

Returning to FIG. 19, method 1900 further includes operation 1920 in which a remaining portion of the dual damascene opening is filled with a conductive fill. The conductive fill fills portions of the conductive line opening not occupied by the one or more liner layers. In some embodiments, the conductive fill includes copper, copper alloy, tungsten, aluminum or another suitable material. In some embodiments, the fill is performed using ALD, CVD, PVD, plating or another suitable deposition process. In some embodiments, the method 1900 includes additional operations such as annealing or planarization processes.

Figure 20D:
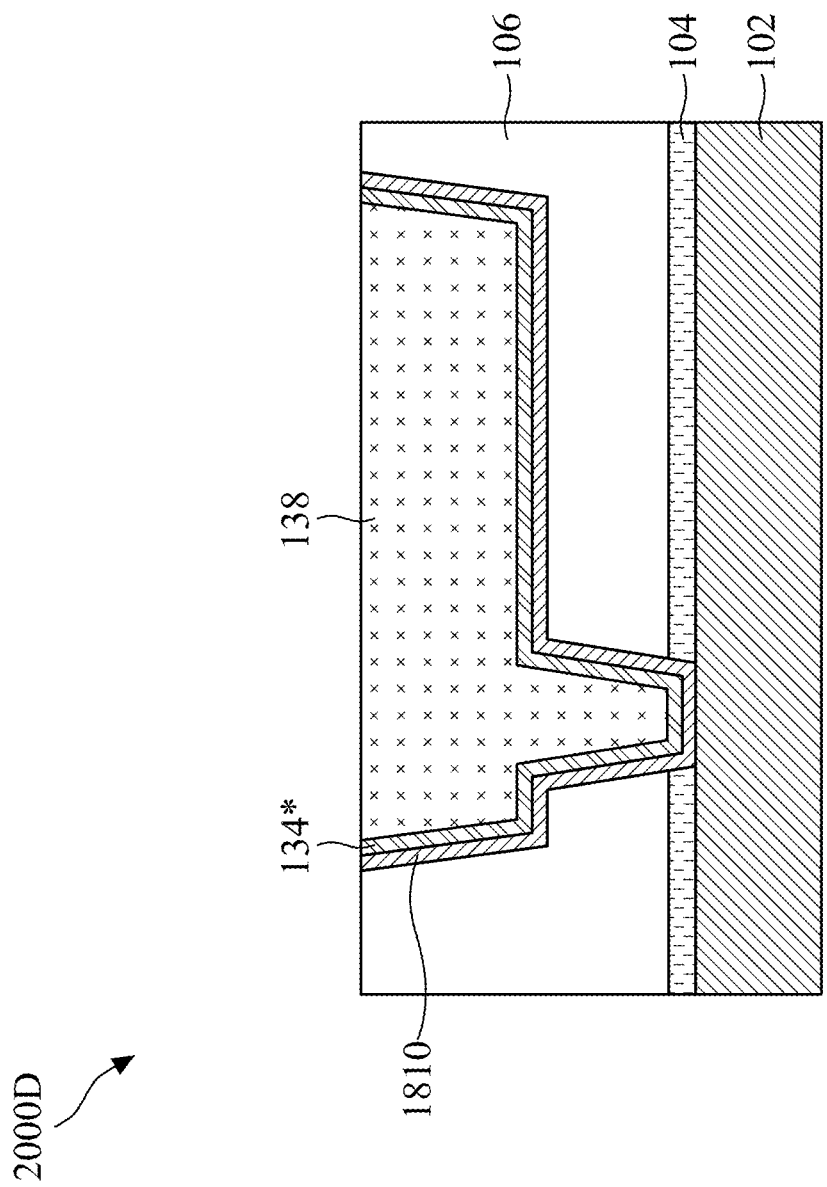

FIG. 20D is a cross-sectional view of a contact structure following filling a remaining portion of the opening with a conductive fill in accordance with some embodiments. A semiconductor device 2000D includes the conductive fill 138 in the conductive line opening and the via opening. The conductive fill 138 fills the remaining portion of the conductive line opening not occupied by the first liner layer 1810 and the second liner layer 134*.

FIG. 21A is a cross-sectional view of a contact structure in a circuit region in accordance with some embodiments. A semiconductor device 2100A is similar to the semiconductor device 1800 (FIG. 18). In comparison with the semiconductor device 1800, the semiconductor device 2100A includes the conductive feature 410 as part of the substrate 102. The semiconductor device 2100A does not include a via, e.g., via 120 (FIG. 1). Instead, the liner layers 1810 and 134* and the conductive fill 138 fill the entire opening in the insulating layer 106 and the ESL 104. In some embodiments where the semiconductor device 2100A is in the M1 level, the width W1 ranges from about 10 nm to about 15 nm. In some embodiments where the semiconductor device 2100A is in the M2 level, the width W1 ranges from about 14 nm to about 22 nm. In some embodiments where the semiconductor device 2100A is in the M3 level, the width W1 ranges from about 12 nm to about 16 nm. If the width W1 is too small, then resistance at the interface between the conductive fill 418 and the substrate 102 is increased which impairs functioning of the semiconductor device 2100A, in some instances. If the width W1 is too great, then a size of the semiconductor device 2100A is increased without a significant improvement in performance, in some instances.

FIG. 21B is a cross-sectional view of a contact structure in a seal ring region in accordance with some embodiments. A semiconductor device 2100B is similar to the semiconductor device 1800 (FIG. 18). In comparison with the semiconductor device 1800, the semiconductor device 2100B includes the conductive feature 410 as part of the substrate 102. In some embodiments, the conductive feature 410 is in place of the substrate 102. The semiconductor device 2100B does not include a via, e.g., via 120 (FIG. 1). Instead, the liner layers 1810, 134* and the conductive fill 138 fill the entire opening in the insulating layer 106 and the ESL 104.

Figure 22:
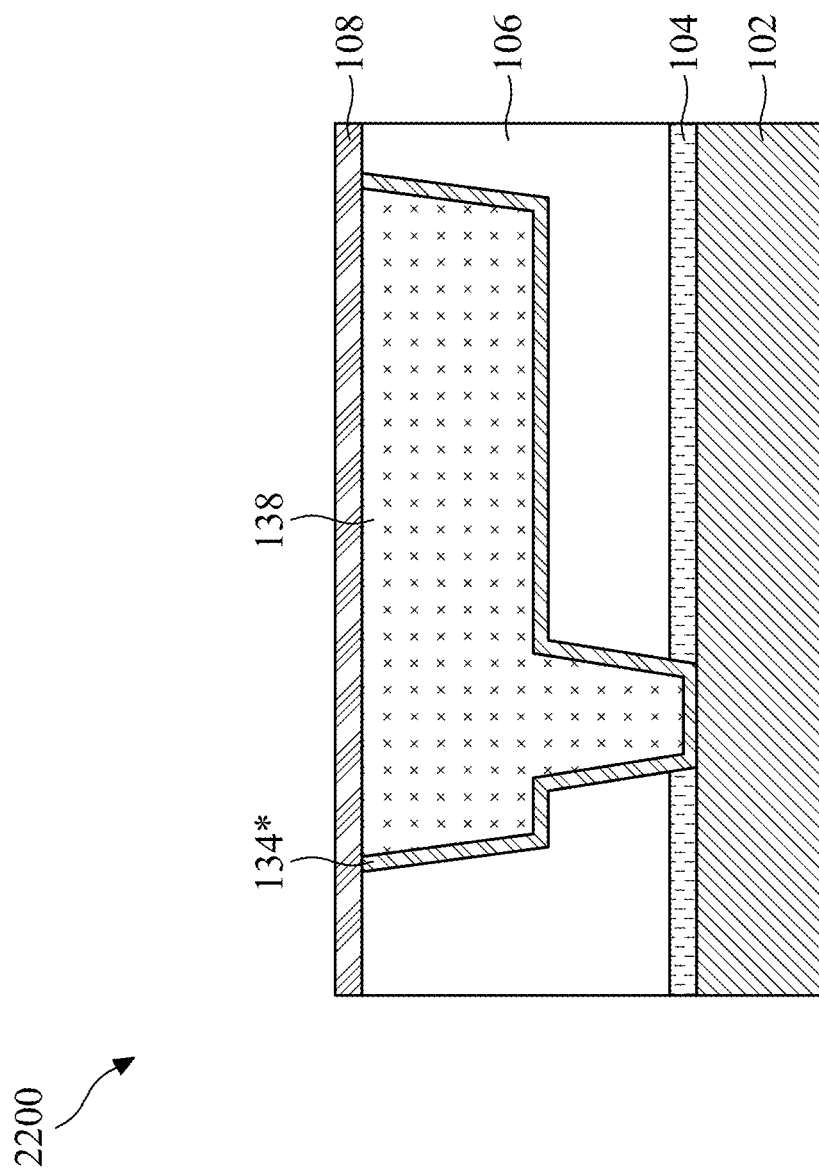
FIG. 22 is a cross-sectional view of a contact structure in accordance with some embodiments.

FIG. 22 is a cross-sectional view of a contact structure in accordance with some embodiments. A semiconductor device 2200 is similar to the semiconductor device 1800 (FIG. 18). In comparison with the semiconductor device 1800, the semiconductor device 2200 does not include first liner layer 1810 (FIG. 18) or the third liner layer 136* (FIG. 18). Instead, the semiconductor device 2200 includes second liner layer 134* in direct contact with both the substrate 102 and the conductive fill 138. In some embodiments, the second liner layer 134* includes ruthenium. A thickness of the second liner layer 136* along the sidewalls of the via opening and the conductive line opening ranges from about 10 angstroms to about 35 angstroms. If the thickness of the second liner layer 136* is too thin, then a risk of the conductive fill 138 migrating into the insulating layer 106 increases, in some instances. If the thickness of the second liner layer 136* is too great, then a size of the semiconductor device 2200 is increased without a significant increase in performance, in some instances. A thickness of the second liner layer 136* adjacent to the substrate 102 ranges from about 3 angstroms to about 8 angstroms. If the thickness of the second liner layer 136* is too thin, then a risk of the conductive fill 138 migrating into the substrate 102 increases, in some instances. If the thickness of the second liner layer 136* is too great, then resistance between the conductive fill 138 and the substrate 102 increases and the functionality of the semiconductor device 2200 is impaired, in some instances.

Figure 23:
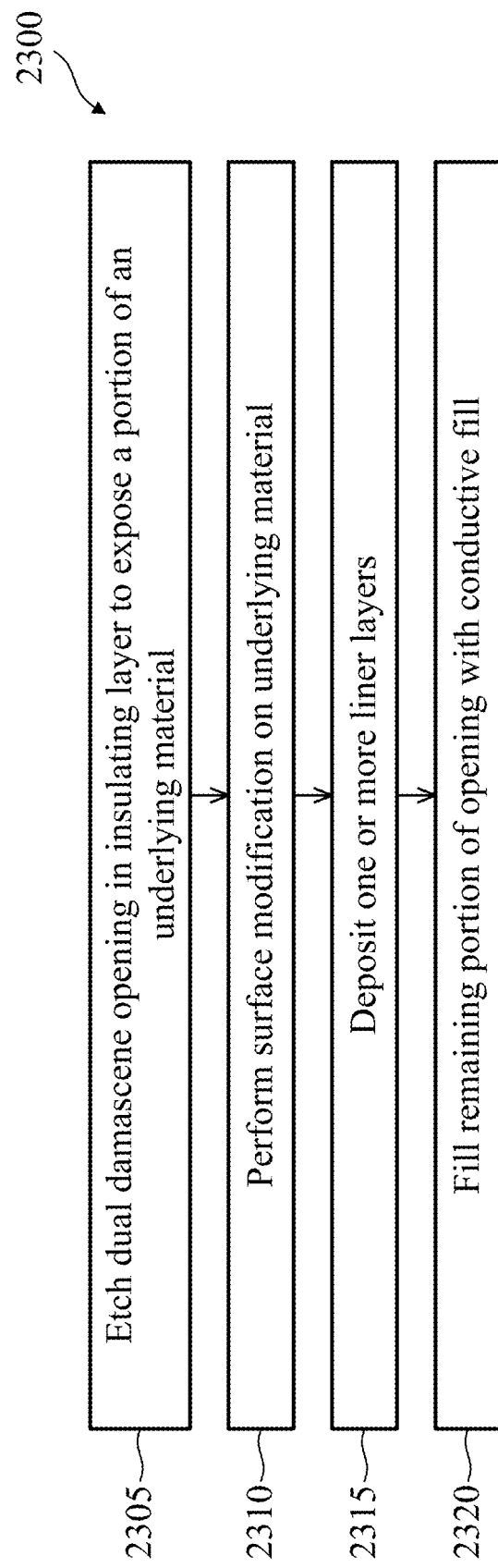
FIG. 23 is a flow chart of a method of making a contact structure in accordance with some embodiments.

FIG. 23 is a flow chart of a method 2300 of making a contact structure in accordance with some embodiments. In operation 2305, an insulating layer is etched to form a dual damascene opening to expose an underlying material. In some embodiments, operation 2305 is similar to operation 205 (FIG. 2).

Figure 24A:
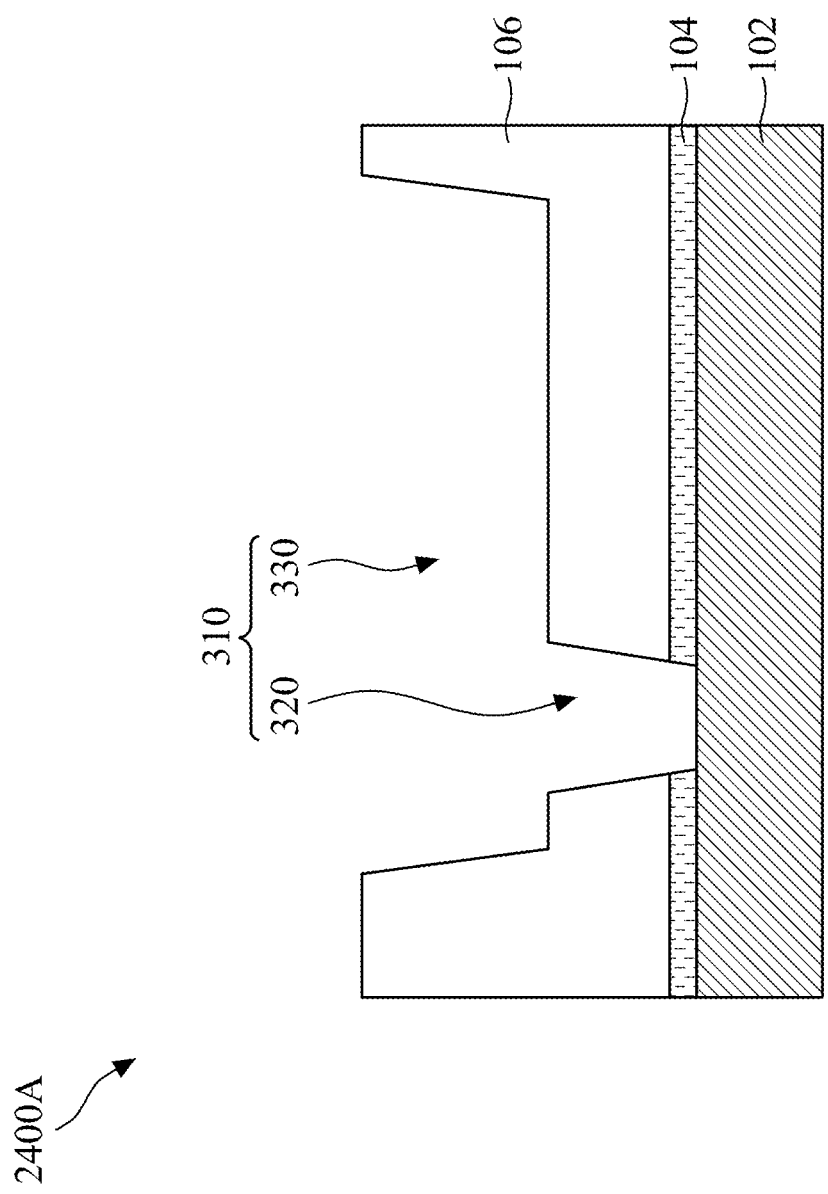
FIGS. 24A-24D are cross-sectional views of a contact structure during various stage of manufacturing in accordance with some embodiments.

FIG. 24A is a cross-sectional view of a contact structure following etching of a dual damascene opening in accordance with some embodiments. A semiconductor device 2400A is similar to the semiconductor device 300A (FIG. 3A).

Returning to FIG. 23, method 2300 further includes operation 2310 in which a surface modification is performed on the underlying material. In some embodiments, the underlying material includes a conductive material, an isolation structure or a semiconductor structure. The surface modification includes the deposition of a monolayer of BTA. In some embodiments, the surface modification includes deposition of a material other than BTA. The surface modification is selective to the conductive material, so the monolayer is not formed on the insulating layer 106.

Figure 24B:
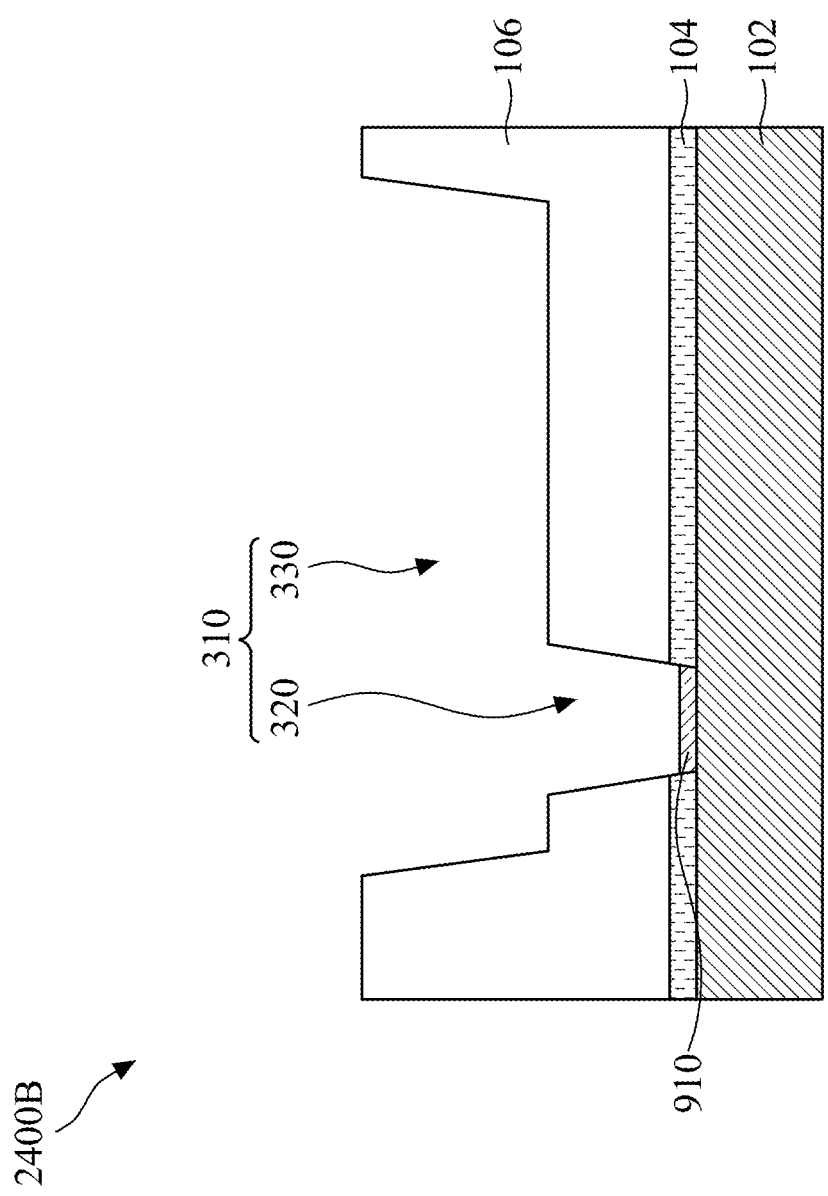

FIG. 24B is a cross-sectional view of a contact structure during performance of a surface modification process in accordance with some embodiments. A semiconductor device 2400B includes a surface modification process 910 being performed on the substrate 102. In some embodiments, the surface modification process 910 is performed on a conductive element, an isolation structure in the substrate 102 or on a layer of the interconnect structure above the substrate 102.

Returning to FIG. 23, the method 2300 includes operation 2315 in which one or more liner layers are deposited. In some embodiments, a single liner layer is deposited. In some embodiments, multiple liner layers are deposited. The surface modification from operation 2310 results in a thickness of a liner layer deposited in the operation 2315 being reduced over the underlying material in comparison with the thickness of the liner layer along sidewalls of the insulating layer. In some embodiments, the liner layer includes ruthenium or another suitable material. In some embodiments, additional liner layers include cobalt or other suitable materials. In some embodiments, the surface modification from operation 2310 prevents formation of liner layers adjacent to the substrate 102. In some embodiments, the one or more liner layers are independently deposited using ALD, CVD, PVD, plating or another suitable deposition process.

Figure 24C:
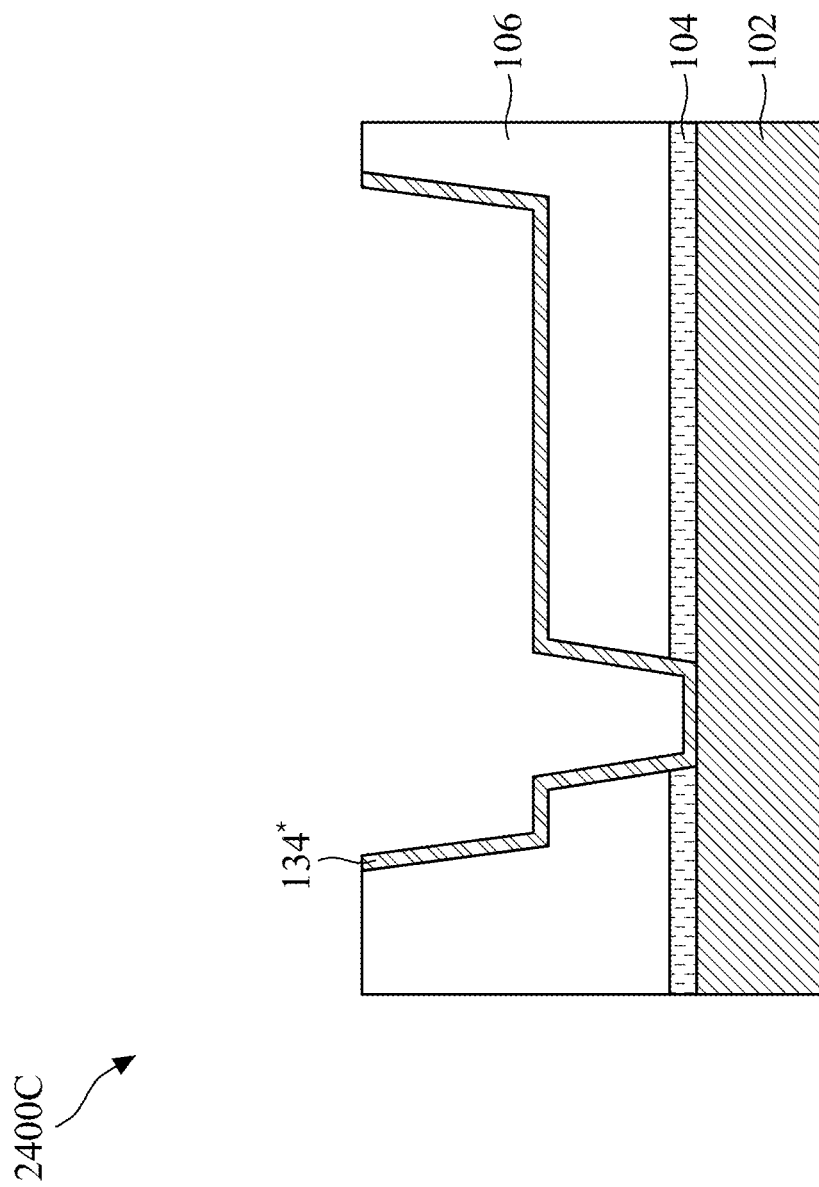
Figure 24D:
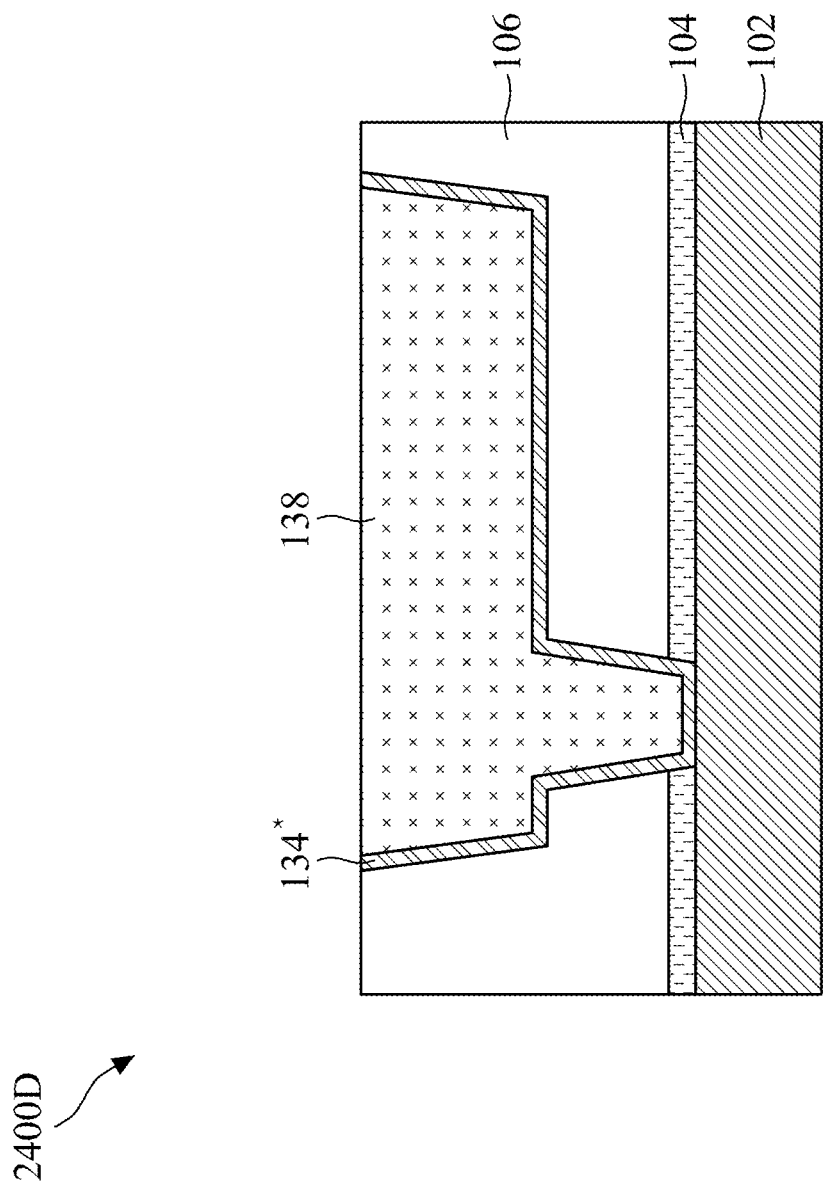

FIG. 24C is a cross-sectional view of a contact structure following deposition of a liner layer in accordance with some embodiments. A semiconductor device 2400C includes the second liner layer 136* in the via opening 320 and in the conductive line opening 330. A thickness of the second liner layer 136* over the substrate 102 is less than a thickness of the second liner layer 136* on the sidewalls of the via opening 320 and the conductive line opening 330.

Returning to FIG. 23, method 2300 further includes operation 2320 in which a remaining portion of the dual damascene opening is filled with a conductive fill. The conductive fill fills portions of the conductive line opening not occupied by the one or more liner layers. In some embodiments, the conductive fill includes copper, copper alloy, tungsten, aluminum or another suitable material. In some embodiments, the fill is performed using ALD, CVD, PVD, plating or another suitable deposition process. In some embodiments, the method 2300 includes additional operations such as annealing or planarization processes.

FIG. 2400D is a cross-sectional view of a contact structure following filling a remaining portion of the opening with a conductive fill in accordance with some embodiments. A semiconductor device 2400D includes the conductive fill 138 in the conductive line opening and the via opening. The conductive fill 138 fills the remaining portion of the conductive line opening not occupied by the second liner layer 134*.

FIG. 25A is a cross-sectional view of a contact structure in a circuit region in accordance with some embodiments. A semiconductor device 2500A is similar to the semiconductor device 2200 (FIG. 22). In comparison with the semiconductor device 2200, the semiconductor device 2500A includes the conductive feature 410 as part of the substrate 102. The semiconductor device 2500A does not include a via, e.g., via 120 (FIG. 1). Instead, the liner layer 134* and the conductive fill 138 fill the entire opening in the insulating layer 106 and the ESL 104. In some embodiments where the semiconductor device 2500A is in the M1 level, the width W1 ranges from about 10 nm to about 15 nm. In some embodiments where the semiconductor device 2500A is in the M2 level, the width W1 ranges from about 14 nm to about 22 nm. In some embodiments where the semiconductor device 2500A is in the M3 level, the width W1 ranges from about 12 nm to about 16 nm. If the width W1 is too small, then resistance at the interface between the conductive fill 418 and the substrate 102 is increased which impairs functioning of the semiconductor device 2500A, in some instances. If the width W1 is too great, then a size of the semiconductor device 2500A is increased without a significant improvement in performance, in some instances.

FIG. 25B is a cross-sectional view of a contact structure in a seal ring region in accordance with some embodiments. A semiconductor device 2500B is similar to the semiconductor device 2200 (FIG. 22). In comparison with the semiconductor device 2200, the semiconductor device 2500B includes the conductive feature 410 as part of the substrate 102. In some embodiments, the conductive feature 410 is in place of the substrate 102. The semiconductor device 2500B does not include a via, e.g., via 120 (FIG. 1). Instead, the liner layer 134* and the conductive fill 138 fill the entire opening in the insulating layer 106 and the ESL 104.

Figure 26:
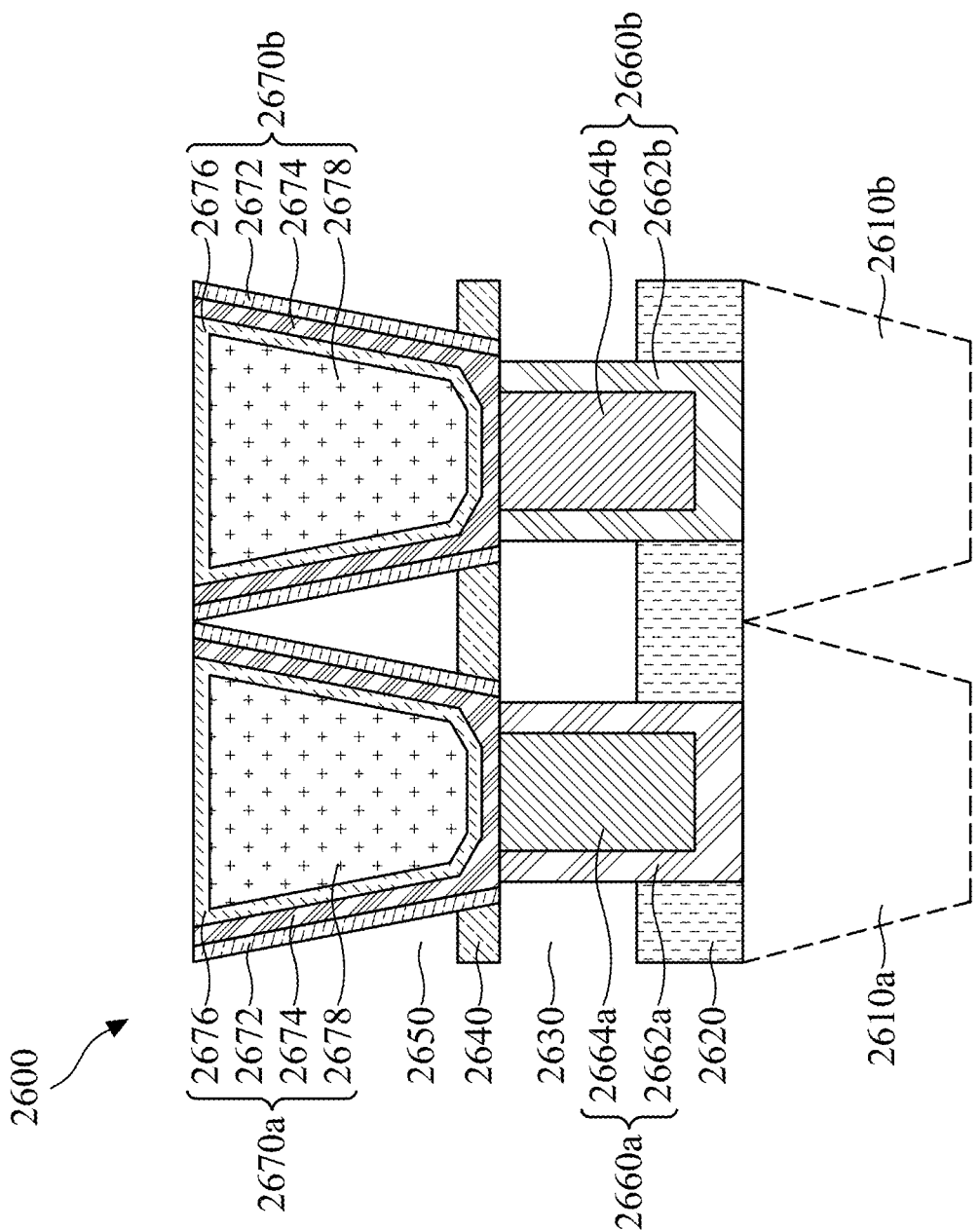
FIG. 26 is a cross-sectional view of a contact structure in accordance with some embodiments.

FIG. 26 is a cross-sectional view of a contact structure in accordance with some embodiments. The contact structure is part of a semiconductor device 2600. The semiconductor device 2600 includes a substrate (not labeled) which includes a first S/D region 2610a and a second S/D region 2610b. An ESL 2620 is over the substrate 102. In some embodiments, ESL 2620 is called a CESL. An insulating layer 2630 is over the ESL 2620. In some embodiments, the insulating layer 2630 is an inter-layer dielectric (ILD) layer. In some embodiments, the insulating layer 2630 is an inter-metal dielectric (IMD) layer. An ESL 2640 is over the insulating layer 2360. An insulating layer 2650 is over the ESL 2640. A first via 2660a extends from the insulating layer 2630 through the ESL 2620 to connect to the first S/D region 2610a. A second via 2660b extends from the insulating layer 2630 through the ESL 2620 to connect to the second S/D region 2610b. A first conductive line 2670a extends from the insulating layer 2650 through the ESL 2640 to connect to the first via 2660a. A second conductive line 2670b extends from the insulating layer 2650 through the ESL 2640 to connect to the second via 2660b.

In some embodiments, at least one of the first S/D region 2610a or the second S/D region 2610b are replaced by another conductive element, such as a gate electrode. In some embodiments, at least one of the first S/D region 2610a or the second S/D region 2610b is replaced with an isolation structure, such as a shallow trench isolation (STI). FIG. 26 is a cross-sectional view with the contact structure at the M0 level. In some embodiments where the contact structure is part of the M1-M3 level, the substrate is replaced with a layer of the interconnect structure directly below the contact structure.

The ESL 2620 and the ESL 2640 are independently similar to ESL 104 (FIG. 1). In some embodiments, the ESL 2620 and the ESL 2640 include a same material and have a same thickness. In some embodiments, the ESL 2620 differs from the ESL 2640 in at least one of thickness or material.

The insulating layer 2630 and the insulating layer 2650 are independently similar to the insulating layer 106 (FIG. 1). In some embodiments, the insulating layer 2630 and the insulating layer 2650 include a same material and a same thickness. In some embodiments, the insulating layer 2630 differs from the insulating layer 2650 in at least one of thickness or material.

The first via 2660a includes a first liner layer 2662a and a first conductive fill 2664a. The first liner layer 2662a helps to prevent migration of the first conductive fill 2664a into the insulating layer 2630 or the ESL 2620. The first conductive fill 2664a includes a conductive material for carrying a signal from the first conductive line 2670a to the first S/D region 2610a. In some embodiments, the first liner layer 2662a is similar to the second liner layer 134 (FIG. 1). In some embodiments, the first conductive fill 2664a is similar to the conductive fill 138 (FIG. 1) and includes copper, copper alloy or another suitable material.

The second via 2660b includes a second liner layer 2662b and a second conductive fill 2664b. The second liner layer 2662b helps to prevent migration of the second conductive fill 2664b into the insulating layer 2630 or the ESL 2620. The second conductive fill 2664b includes a conductive material for carrying a signal from the second conductive line 2670b to the second S/D region 2610b. In some embodiments, the second liner layer 2662b is similar to the second liner layer 134 (FIG. 1). In some embodiments, the second conductive fill 2664b includes cobalt or another suitable material. In some embodiments, the first via 2660a and the second via 2660b include a same conductive fill material.

The first conductive line 2670a includes a first liner layer 2672, a second liner layer 2674, a third liner layer 2676 and a conductive fill 2678. In some embodiments, the first liner layer 2672 is similar to the first liner layer 132 (FIG. 1). In some embodiments, the second liner layer 2674 is similar to the second liner layer 134 (FIG. 1). In some embodiments, the third liner layer 2676 is similar to the third liner layer 136 (FIG. 1). In some embodiments, the conductive fill 2678 is similar to the conductive fill 138 (FIG. 1). The first liner layer 2672 extends only along the sidewalls of the second liner layer 2674. The bottom surface of the second liner layer 2674 directly contacts the first liner layer 2662a of the first via 2660a. The second conductive line 2670b is similar to the first conductive line 2670a.

Figure 27:
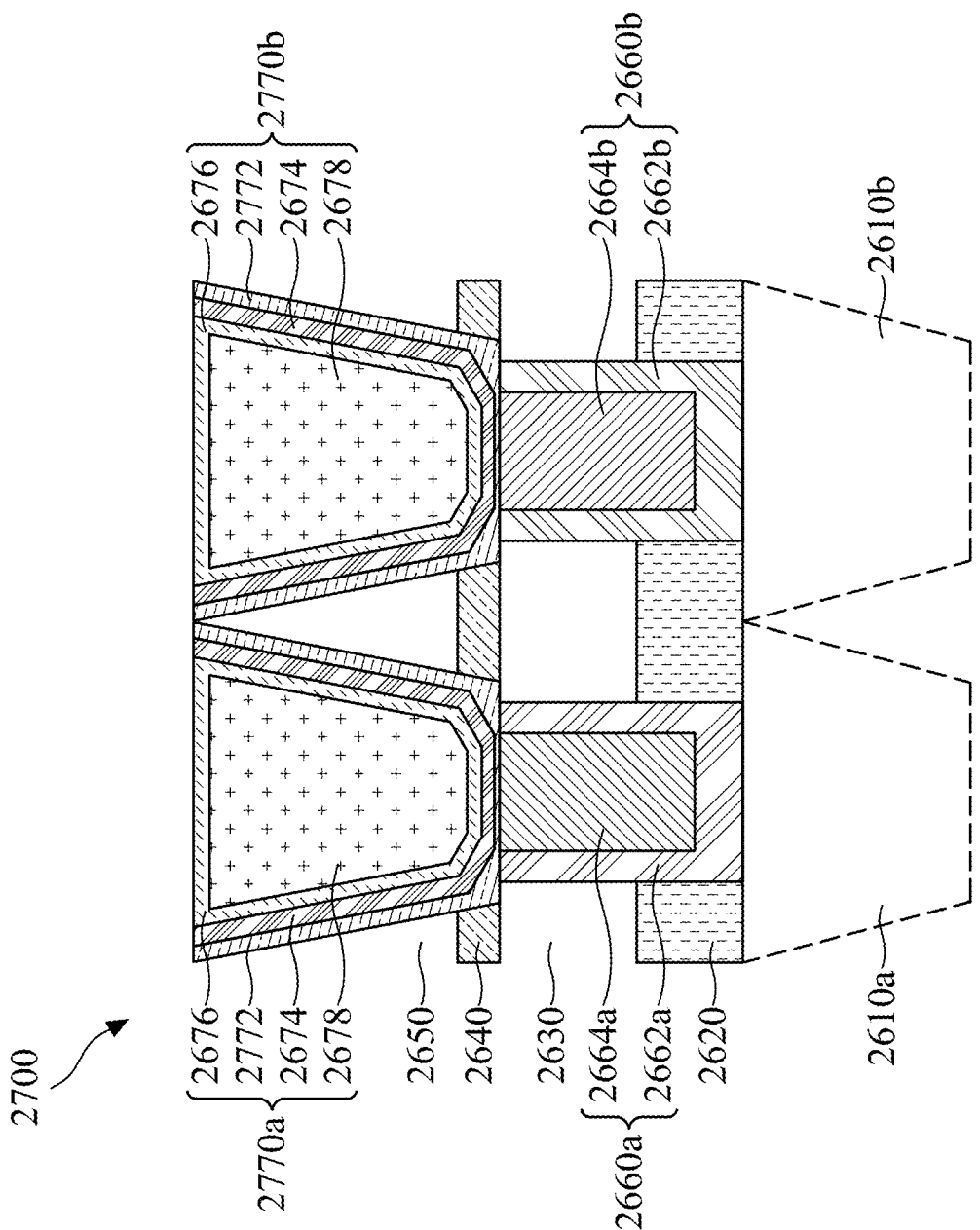
FIG. 27 is a cross-sectional view of a contact structure in accordance with some embodiments.

FIG. 27 is a cross-sectional view of a contact structure in accordance with some embodiments. The contact structure is part of a semiconductor device 2700. The semiconductor device 2700 is similar to the semiconductor device 2600 (FIG. 26). In comparison with the semiconductor device 2600, the first conductive line 2770a and the second conductive line 2770b include a first liner layer 2772 which extends under the second liner layer 2674. The first liner layer 2772 separates the second liner layer 2674 from the first liner layer 2662a of the first via 2660a. In FIG. 27, the first liner layer 2772 extends under an entirety of the second liner layer 2674. In some embodiments, an inner edge of the first liner layer 2772 is aligned with an inner sidewall of the first liner layer 2662a of the first via 2660a. That is, the second liner layer 2674 directly contacts the first conductive fill 2664a but is separated from the first liner layer 2662a. The second conductive via 2770b includes a similar arrangement with respect to the second via 2660b as that described above between the first conductive line 2770a and the first via 2660a. The contact structure of the semiconductor device 2700 helps to improve performance in comparison with the semiconductor device 2600 because diffusion of the metal fill is reduced or eliminated by the bottom corner of the first liner 2772 separating the second liner 2674 from the insulating layer 2630.

Figure 28:
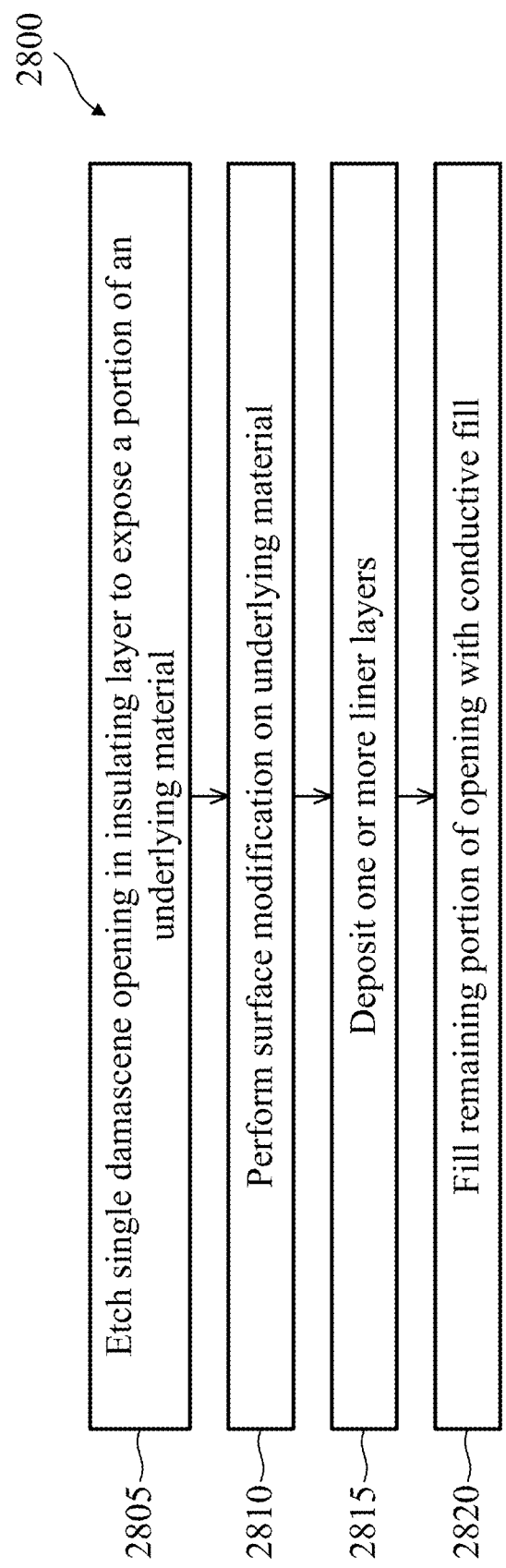
FIG. 28 is a flow chart of a method of making a contact structure in accordance with some embodiments.

FIG. 28 is a flow chart of a method 2800 of making a contact structure in accordance with some embodiments. In operation 2805, an insulating layer is etched to form a single damascene opening to expose an underlying material. In some embodiments, operation 2805 is similar to operation 205 (FIG. 2). In comparison with operation 205, the operation 2805 forms a single damascene opening, e.g., for a conductive line, instead of a dual damascene opening.

FIG. 29A is a cross-sectional view of a contact structure following etching of a single damascene opening in accordance with some embodiments. A semiconductor device 2900A includes a single damascene opening 2910 over each of the first via 2660a and the second via 2660b.

Returning to FIG. 28, method 2800 further includes operation 2810 in which a surface modification is performed on the underlying material. In some embodiments, the underlying material includes a conductive material, an isolation structure or a semiconductor structure. The surface modification includes the deposition of a monolayer of BTA. In some embodiments, the surface modification includes deposition of a material other than BTA. The surface modification is selective to the conductive material, so the monolayer is not formed on the insulating layer 2650.

Figure 29B:
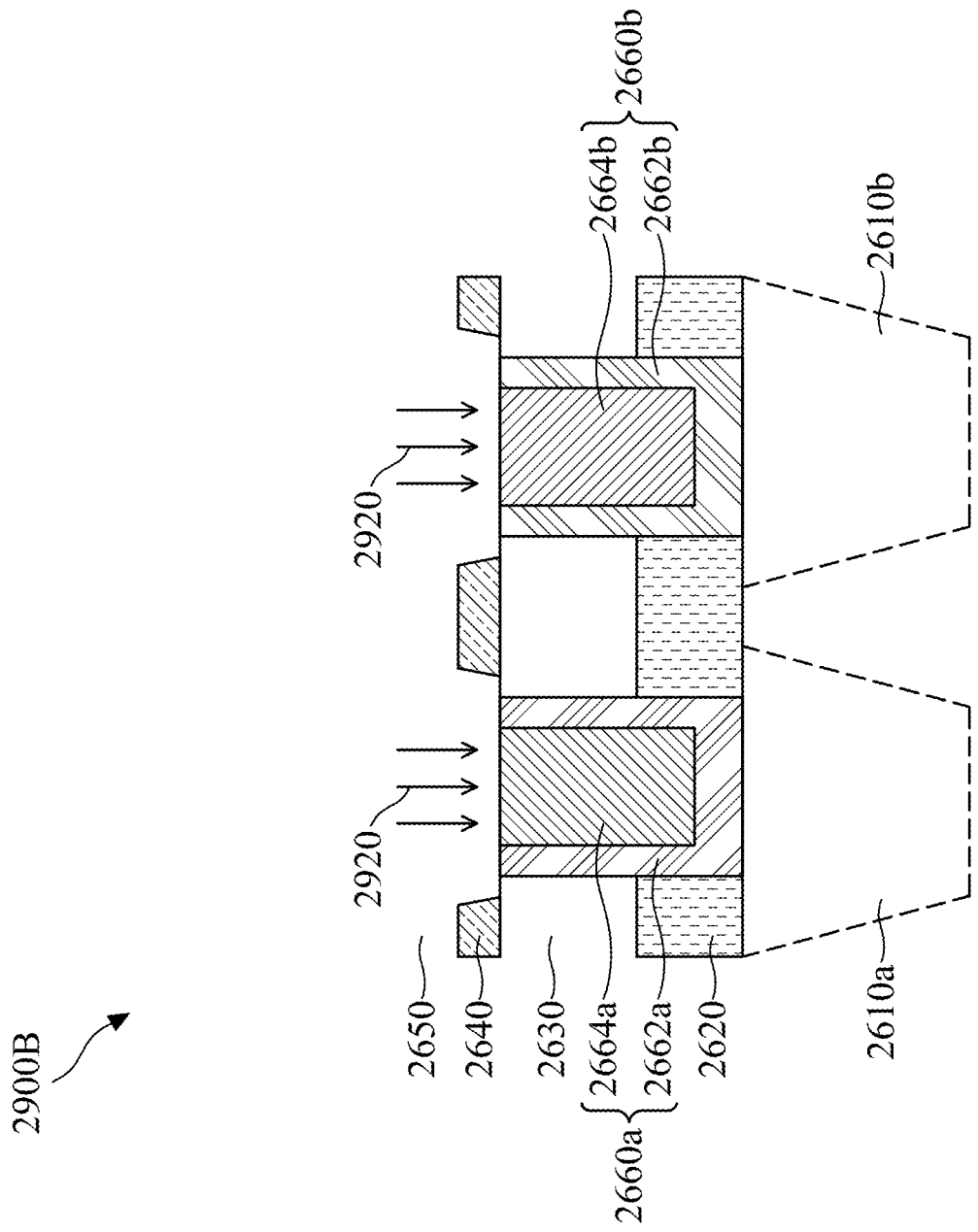

FIG. 29B is a cross-sectional view of a contact structure during performance of a surface modification process in accordance with some embodiments. A semiconductor device 2900B includes a surface modification process 2920 being performed on each of the first via 2660a and the second via 2660b. In some embodiments, the surface modification process 2920 is performed on a conductive element, an isolation structure in the substrate or on a layer of the interconnect structure above the substrate.

Returning to FIG. 28, the method 2800 includes operation 2815 in which one or more liner layers are deposited. In some embodiments, a single liner layer is deposited. In some embodiments, multiple liner layers are deposited. The surface modification from operation 2810 results in a thickness of a liner layer deposited in the operation 2815 being reduced over the underlying material in comparison with the thickness of the liner layer along sidewalls of the insulating layer. In some embodiments, the first liner layer includes TaN or another suitable material. In some embodiments, additional liner layers include ruthenium, cobalt or other suitable materials. In some embodiments, the surface modification from operation 2810 prevents formation of the first liner layer adjacent to the first via 2660a or the second via 2660b. In some embodiments, the one or more liner layers are independently deposited using ALD, CVD, PVD, plating or another suitable deposition process.

FIG. 29C is a cross-sectional view of a contact structure following deposition of a liner layer in accordance with some embodiments. A semiconductor device 2900C includes the first liner layer 2772 over the first via 2660a and the second via 2660b. A thickness of the first liner layer 2772 over the first conductive fill 2664a and the second conductive fill 2664b is less than a thickness of the first liner layer 2772 over the first liner layer 2662a and the first liner layer 2662b and along the sidewalls of the insulating layer 2650.

Returning to FIG. 28, method 2800 further includes operation 2820 in which a remaining portion of the single damascene opening is filled with a conductive fill. The conductive fill fills portions of the opening not occupied by the one or more liner layers. In some embodiments, the conductive fill includes copper, copper alloy, tungsten, aluminum or another suitable material. In some embodiments, the fill is performed using ALD, CVD, PVD, plating or another suitable deposition process. In some embodiments, the method 2800 includes additional operations such as annealing or planarization processes.

FIG. 30 is a cross-sectional view of a contact structure in accordance with some embodiments. The contact structure is part of a semiconductor device 3000. The semiconductor device 3000 is similar to the semiconductor device 2700 (FIG. 27). In comparison with the semiconductor device 2700, the third liner layer 3076 covers only a top surface of the conductive fill 2678. The second liner layer 2674 directly contacts sidewall of the conductive fill 2678.

Figure 31:
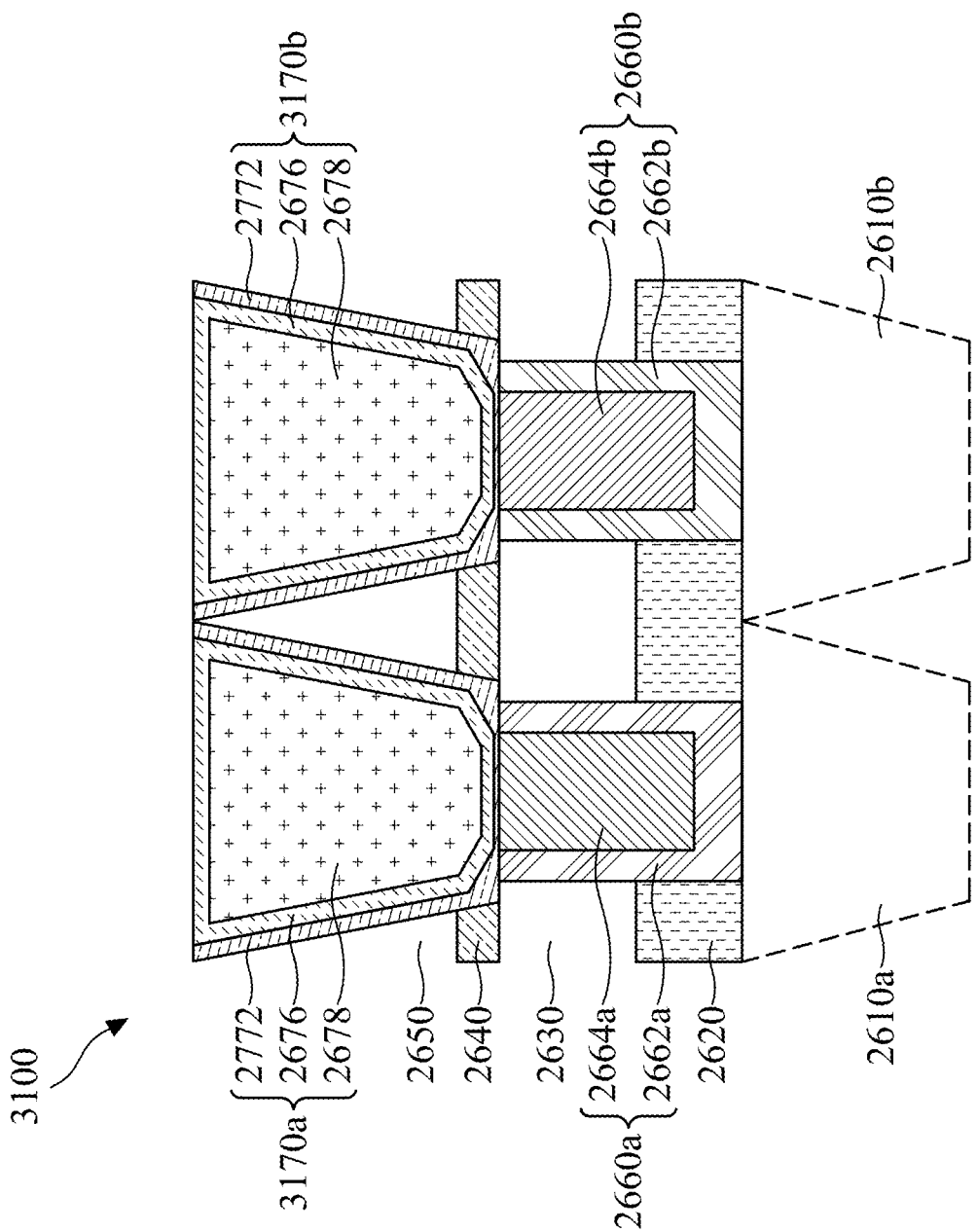
FIG. 31 is a cross-sectional view of a contact structure in accordance with some embodiments.

FIG. 31 is a cross-sectional view of a contact structure in accordance with some embodiments. The contact structure is part of a semiconductor device 3100. The semiconductor device 3100 is similar to the semiconductor device 2700 (FIG. 27). In comparison with the semiconductor device 2700, the second liner layer 2674 (FIG. 27) is omitted. The third liner layer 2676 directly contacts the first liner layer 2772.

Figure 32:
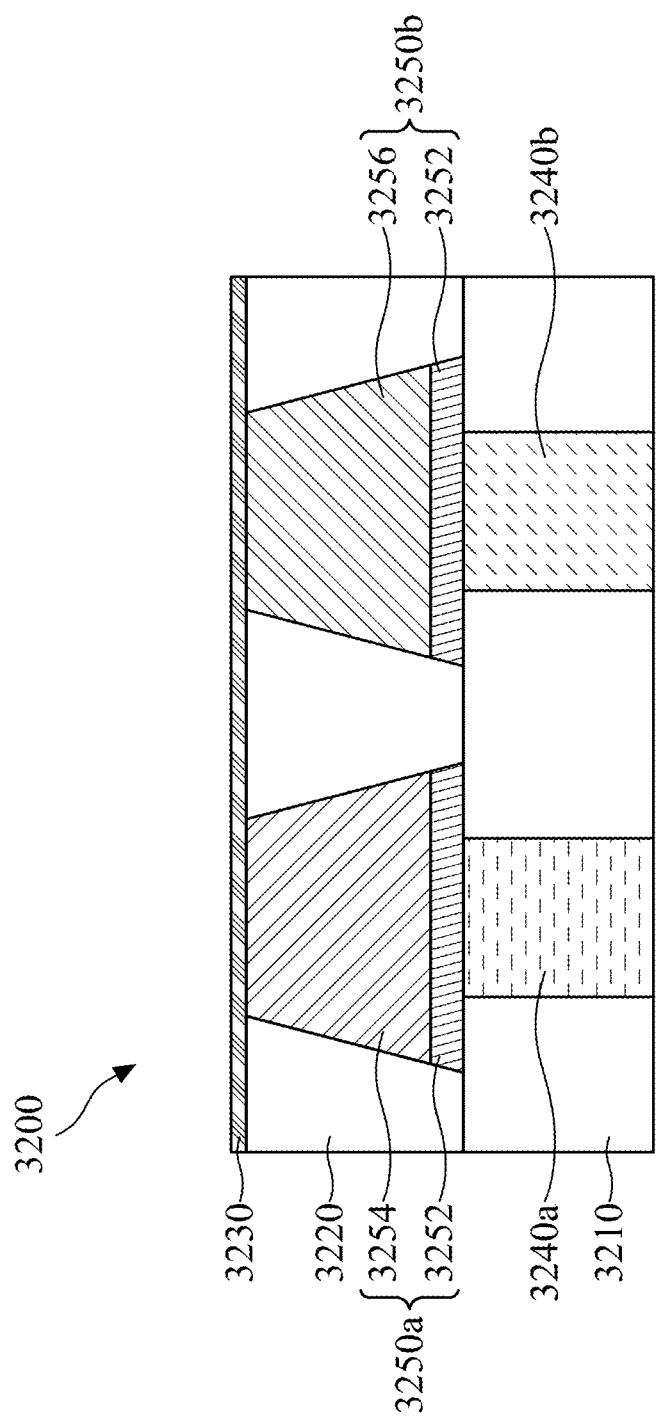
FIG. 32 is a cross-sectional view of a contact structure in accordance with some embodiments.

FIG. 32 is a cross-sectional view of a contact structure in accordance with some embodiments. The contact structure is part of a semiconductor device 3200. The semiconductor device 3200 includes an insulating layer 3210. In some embodiments, the insulating layer 3210 is over a substrate. In some embodiments, the insulating layer 3210 is part of an interconnect structure. In some embodiments, the insulating layer 3210 is an inter-layer dielectric (ILD) layer. In some embodiments, the insulating layer 3210 is an inter-metal dielectric (IMD) layer. The semiconductor device 3200 further includes an insulating layer 3220 over the insulating layer 3210. In some embodiments, the insulating layer 3210 and the insulating layer 3220 are a same layer with no interface between. In some embodiments, an interface exists between the insulating layer 3210 and the insulating layer 3220. An ESL 3230 is over the insulating layer 3220. A first via 3240a extends through the insulating layer 3210 to connect to another element in the semiconductor device 3200. In some embodiments, the first via 3240a connects to a substrate, a conductive element, an isolation structure or another device within the semiconductor device 3200. A second via 3240b extends through the insulating layer 3210 to connect to another element in the semiconductor device 3200. In some embodiments, the second via 3240b connects to a substrate, a conductive element, an isolation structure or another device within the semiconductor device 3200. In some embodiments, the first via 3240a and the second via 3240b connect to a same element. In some embodiments, the first via 3240a and the second via 3240b connect to different elements. A first conductive line 3250a extends through the insulating layer 3220 to connect to the first via 3240a. A second conductive line 3250b extends through the insulating layer 3220 to connect to the second via 3240b.

The insulating layer 3210 and the insulating layer 3220 are independently similar to the insulating layer 106 (FIG. 1). In some embodiments, the insulating layer 3210 and the insulating layer 3220 include a same material and a same thickness. In some embodiments, the insulating layer 3210 differs from the insulating layer 3220 in at least one of thickness or material. The ESL 3230 is similar to ESL 104 (FIG. 1).

The first via 3240a includes tungsten. In some embodiments, the first via 3240a further includes at least one liner layer between the tungsten and the insulating layer 3210. The second via 3240b includes ruthenium. In some embodiments, the second via 3240b further includes at least one liner layer between the ruthenium and the insulating layer 3210. In some embodiments, both the first via 3240a and the second via 3240b include tungsten. In some embodiments, both the first via 3240a and the second via 3240b include ruthenium.

The first conductive line 3250a includes a first liner layer 3252 and a first conductive fill 3254. The first liner layer 3252 separates the first conductive fill 3254 from the first via 3240a. The first liner layer 3252 extends over the insulating layer 3210 surrounding the first via 3240a. In some embodiments, the first liner layer 3252 includes TiN. A thickness of the first liner layer 3252 is substantially uniform. In some embodiments, a thickness of the first liner layer 3252 over the first via 3240a is less than a thickness of the first liner layer 3252 over the insulating layer 3210. The first conductive fill 3254 is over the first liner layer 3252 and is configured to convey a signal from above the first conductive fill 3254 to the first via 3240a in a final device structure. In some embodiments, the first conductive fill 3254 includes ruthenium.

The second conductive line 3250b is similar to the first conductive line 3250b. In comparison with the first conductive line 3250a, the second conductive line 3250b includes a second conductive fill 3256. In some embodiments, the second conductive fill 3256 includes tungsten. In some embodiments, the first conductive fill 3254 and the second conductive fill 3256 include ruthenium. In some embodiments, the first conductive fill and the second conductive fil 3256 include tungsten.

In some embodiments, a thickness of the first liner layer 3252 ranges from about 5 angstroms to about 15 angstroms. If the thickness is too small, then a risk of migration of the conductive fill 3254 or 3256 into the insulating layer 3210 increases, in some instances. If the thickness is too large, then a size of the semiconductor device 3200 is increased without a significant improvement in the functionality of the semiconductor device 3200, in some instances. In some embodiments, a thickness of the first conductive fill 3254 or the second conductive fill 3256 independently ranges from about 10 angstroms to about 30 angstroms. If the thickness is too small, then resistance in the conductive fill increases and functionality of the semiconductor device 3200 is impaired, in some instances. If the thickness is too large, then a size of the semiconductor device 3200 is increased without a significant improvement in the functionality of the semiconductor device 3200, in some instances.

Figure 33:
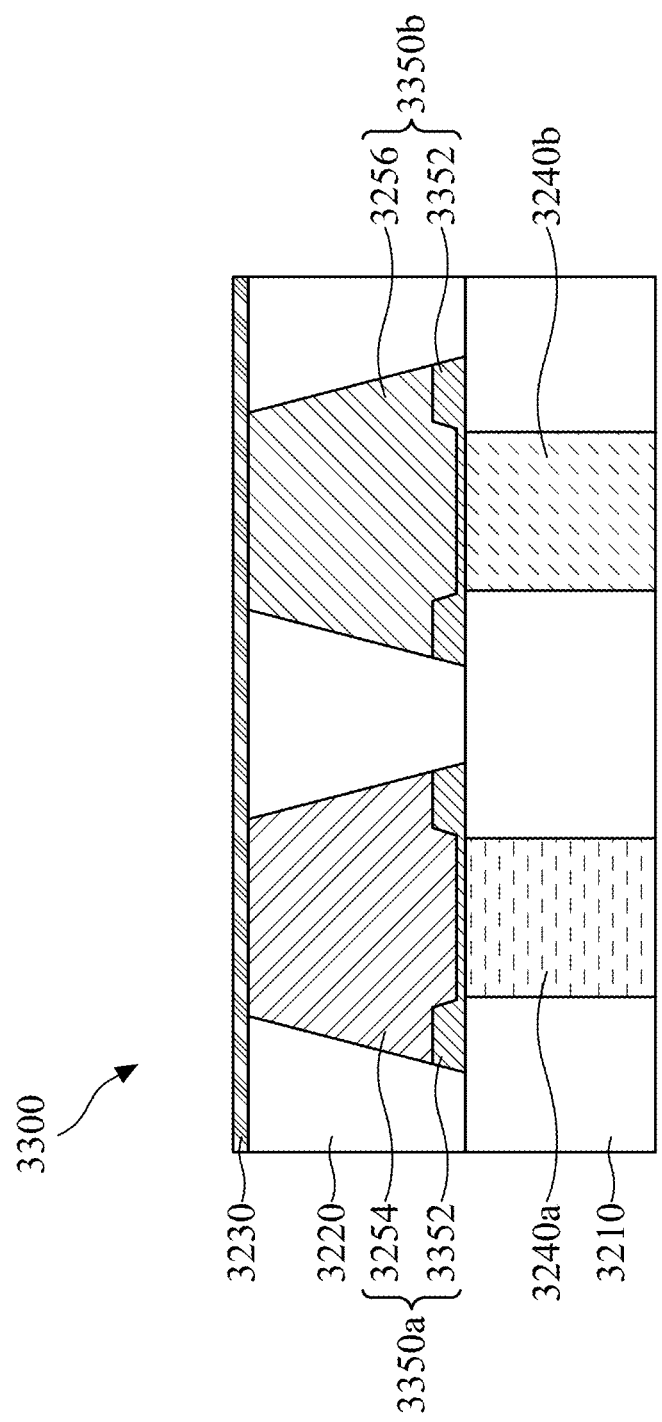
FIG. 33 is a cross-sectional view of a contact structure in accordance with some embodiments.

FIG. 33 is a cross-sectional view of a contact structure in accordance with some embodiments. The contact structure is part of a semiconductor device 3300. The semiconductor device 3300 is similar to the semiconductor device 3200 (FIG. 32). In comparison with the semiconductor device 3200, the first conductive line 3350a and the second conductive line 3350b include a first liner layer 3352 which includes TaN. A thickness of the first liner layer 3352 over the first via 3240a and the second via 3240b is less than a thickness of the first liner layer 3352 over the insulating layer 3210. In some embodiments, the first liner layer 3352 is discontinuous over the first via 3240a or the second via 3240b. In comparison with the semiconductor device 3200 (FIG. 32), the semiconductor device 3300 has reduced contact resistance.

In some embodiments, a thickness of the first liner layer 3352 ranges from about 5 angstroms to about 15 angstroms. If the thickness is too small, then a risk of migration of the conductive fill 3254 or 3256 into the insulating layer 3210 increases, in some instances. If the thickness is too large, then a size of the semiconductor device 3300 is increased without a significant improvement in the functionality of the semiconductor device 3300, in some instances. In some embodiments, a thickness of the first conductive fill 3254 or the second conductive fill 3256 independently ranges from about 10 angstroms to about 30 angstroms. If the thickness is too small, then resistance in the conductive fill increases and functionality of the semiconductor device 3300 is impaired, in some instances. If the thickness is too large, then a size of the semiconductor device 3300 is increased without a significant improvement in the functionality of the semiconductor device 3300, in some instances.

Figure 34:
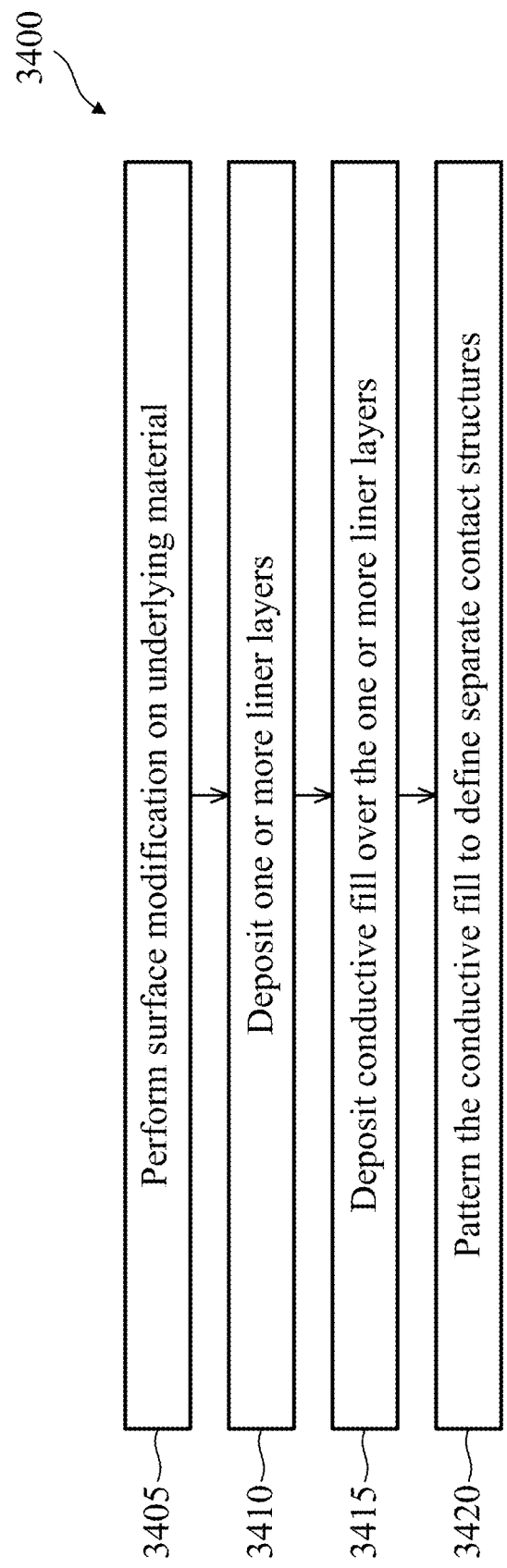
FIG. 34 is a flow chart of a method of making a contact structure in accordance with some embodiments.

FIG. 34 is a flow chart of a method 3400 of making a contact structure in accordance with some embodiments. In operation 3405, a surface modification is performed on the underlying material. In some embodiments, the underlying material includes a conductive material, an isolation structure or a semiconductor structure. The surface modification includes the deposition of a monolayer of BTA. In some embodiments, the surface modification includes deposition of a material other than BTA. The surface modification is selective to the conductive material, so the monolayer is not formed on the insulating layer, e.g., the insulating layer 3210 (FIG. 33).

Figure 35A:
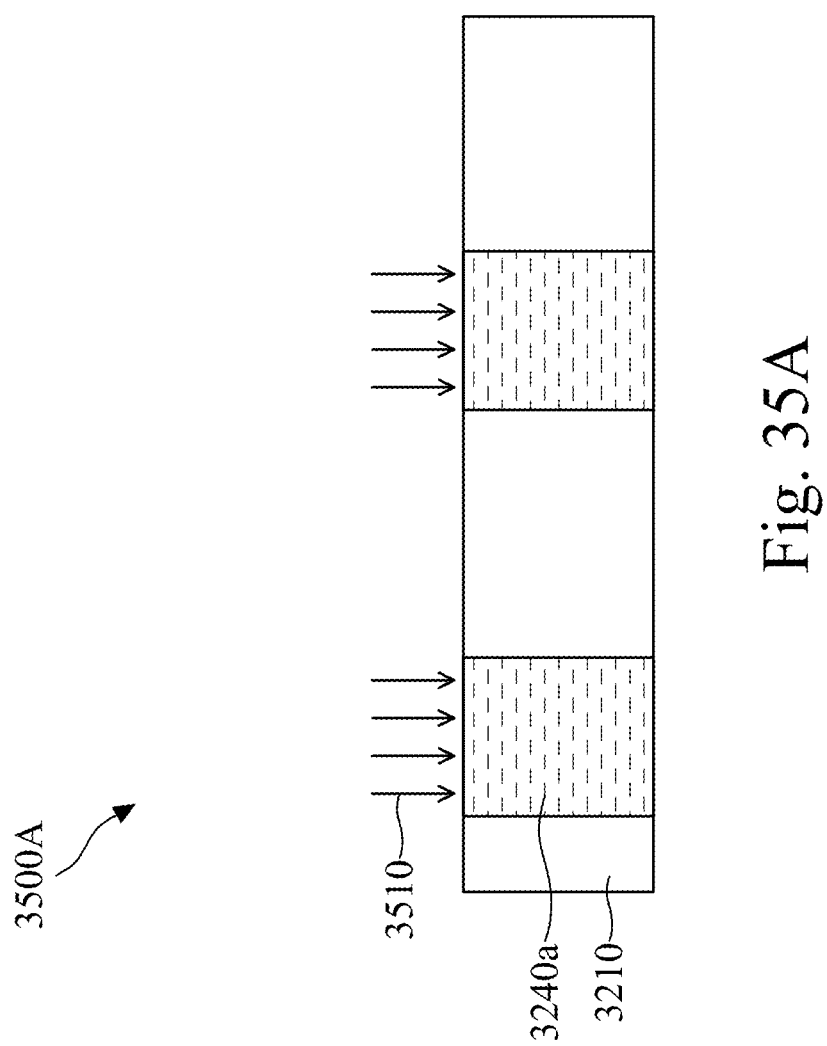

FIG. 35A is a cross-sectional view of a contact structure during performance of a surface modification process in accordance with some embodiments. A semiconductor device 3500A includes a surface modification process 3510 being performed on each of the first via 3240a and the second via 3420b. In some embodiments, the surface modification process 3510 is performed on a conductive element, an isolation structure in the substrate or on a layer of the interconnect structure above the substrate.

Returning to FIG. 34, the method 3400 includes operation 3410 in which one or more liner layers are deposited. In some embodiments, a single liner layer is deposited. In some embodiments, multiple liner layers are deposited. The surface modification from operation 3405 results in a thickness of a liner layer deposited in the operation 3410 being reduced over the underlying material in comparison with the thickness of the liner layer along the insulating layer. In some embodiments, the first liner layer includes TaN, TiN or another suitable material. In some embodiments, additional liner layers include ruthenium, cobalt or other suitable materials. In some embodiments, the surface modification from operation 3405 prevents formation of the first liner layer adjacent to a via, such as the first via 3240a or the second via 3240b (FIG. 33). In some embodiments, the one or more liner layers are independently deposited using ALD, CVD, PVD, plating or another suitable deposition process.

FIG. 35B is a cross-sectional view of a contact structure following deposition of a liner layer in accordance with some embodiments. A semiconductor device 3500B includes the first liner layer 3352 over the first via 3240a and the second via 3240b. A thickness of the first liner layer 3352 over the first via 3240a and the second via 3240b is less than a thickness of the first liner layer 3352 over the insulating layer 3210.

Returning to FIG. 34, method 3400 further includes operation 3415 in which a conductive fill is deposited over the one or more liner layers. The conductive fill is blanket deposited over the one or more liner layers. In some embodiments, the conductive fill includes copper, copper alloy, tungsten, aluminum or another suitable material. In some embodiments, the fill is performed using ALD, CVD, PVD, plating or another suitable deposition process.

Figure 35C:
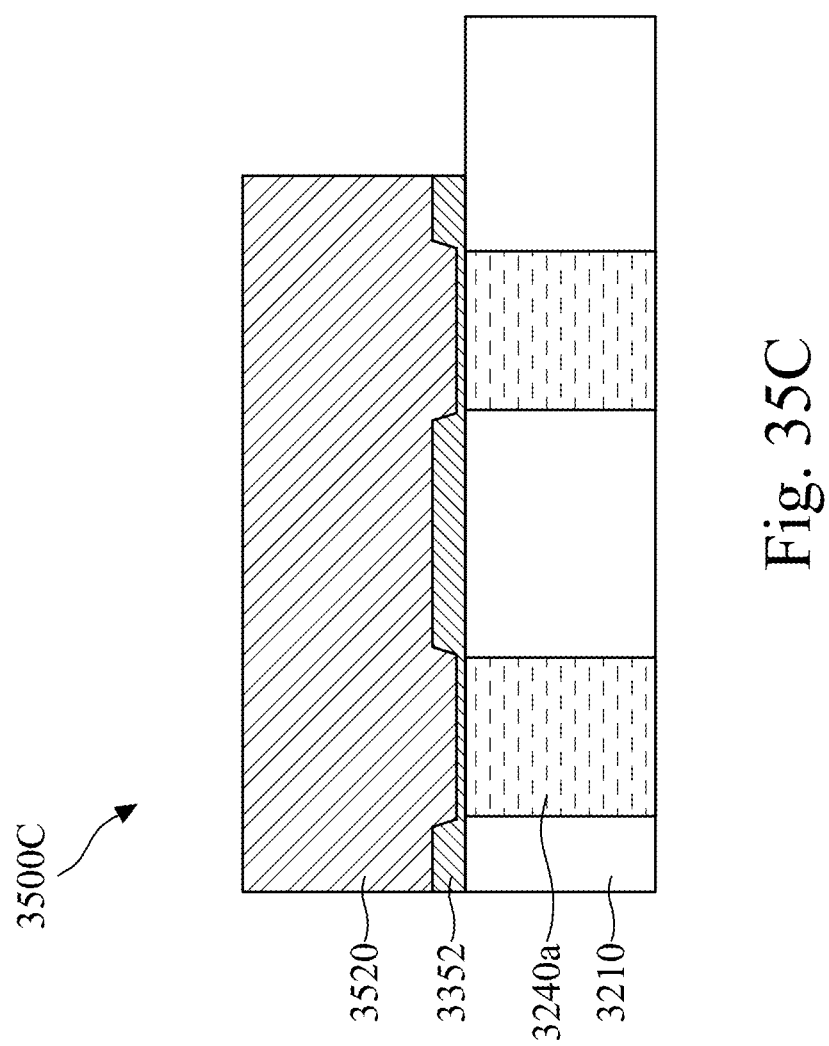

FIG. 35C is a cross-sectional view of a contact structure following deposition of a conductive fill in accordance with some embodiments. A semiconductor device 3500C includes the conductive fill 3520 blanket deposited over the first liner layer 3352.

Returning to FIG. 34, method 3400 further includes operation 3420 in which the conductive fill is patterned in order to form separate contact structures. In some embodiments, the patterning is performed using a series of photolithography and etching processes. In some embodiments, the etching processes are wet etching processes. In some embodiments, the etching processes are dry etching processes.

Figure 35D:
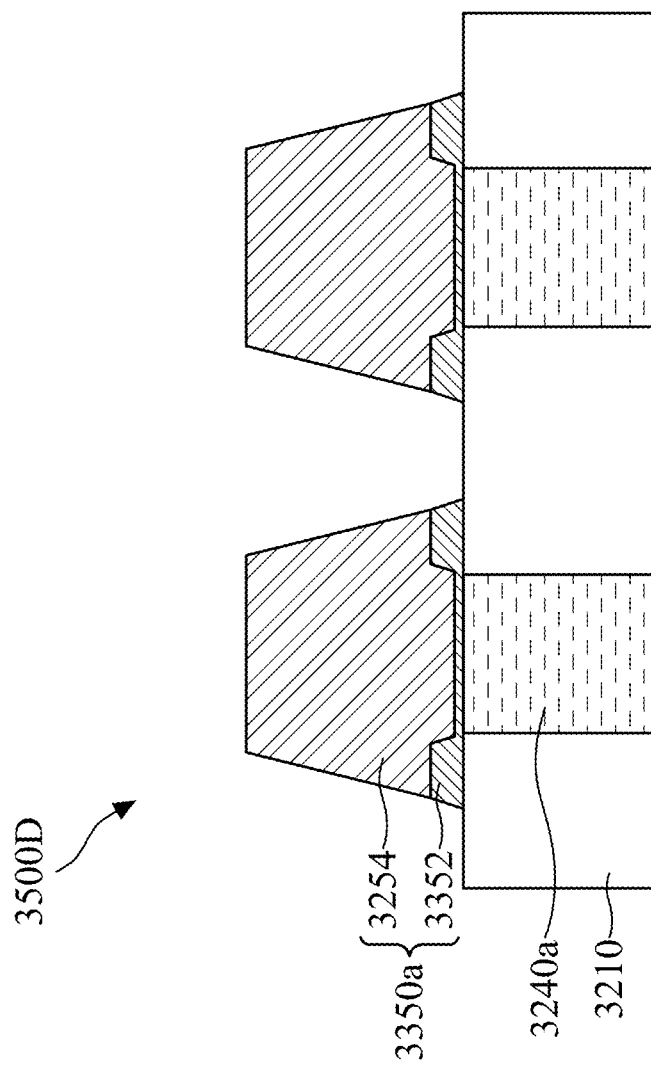

FIG. 35D is a cross-sectional view of a contact structure following patterning of the conductive fill in accordance with some embodiments. The conductive fill 3520 has been patterned to form two distinct contact structures 3350a.

In some embodiments, the method 3400 includes additional operations such as annealing or planarization processes. In some embodiments, additional deposition and patterning processes are used to form semiconductor devices having different materials in the conductive lines.

FIG. 36A is a cross-sectional view of a contact structure in a circuit region in accordance with some embodiments. A semiconductor device 3600A is similar to the semiconductor device 3300 (FIG. 33). In comparison with the semiconductor device 3300, the semiconductor device 3600A includes the conductive feature 3640 as part of the first via 3240a. The semiconductor device 3600A does not include the first via 3240a (FIG. 33). Instead, the conductive feature 3640 includes a first liner layer 3642, a second liner layer 3644 and a conductive fill 3646. The first liner layer 3642 is similar to the first liner layer 132 (FIG. 1). The second liner layer 3644 is similar to the second liner layer 134 (FIG. 1). The conductive fill 3646 is similar to the conductive fill 138 (FIG. 1). In some embodiments, the conductive feature 3640 directly contacts a gate or a S/D region. In some embodiments, a width W3 of the conductive feature 3640 ranges from about 6 nm to about 15 nm. If the width W3 is too small, then a resistance of the conductive feature 3640 increases and functionality of the semiconductor device 3600A is impaired, in some instances. If the width W3 is too large, then a size of the semiconductor device 3600A is increased without a significant improvement in the functionality of the semiconductor device 3600A, in some instances. In some embodiments, a width W4 of the first liner layer 3352 ranges from about 8 nm to about 22 nm. If the width W4 is too small, then a resistance of the conductive line 3350a increases and functionality of the semiconductor device 3600A is impaired, in some instances. If the width W4 is too large, then a size of the semiconductor device 3600A is increased without a significant improvement in the functionality of the semiconductor device 3600a, in some instances.

FIG. 36B is a cross-sectional view of a contact structure in a seal ring region in accordance with some embodiments. A semiconductor device 3600B is similar to the semiconductor device 3300 (FIG. 33). In comparison with the semiconductor device 3300, the semiconductor device 3600B includes the conductive feature 3640 instead of the first via 3240a or the second via 3240b. In some embodiments, a width W5 of the conductive feature 3640 ranges from about 6 nm to about 15 nm. If the width W5 is too small, then a resistance of the conductive feature 3640 increases and functionality of the semiconductor device 3600B is impaired, in some instances. If the width W5 is too large, then a size of the semiconductor device 3600B is increased without a significant improvement in the functionality of the semiconductor device 3600B, in some instances. In some embodiments, a width W6 of the first liner layer 3352 ranges from about 100 nm to about 180 nm. If the width W6 is too small, then a resistance of the conductive line 3350a increases and functionality of the semiconductor device 3600B is impaired, in some instances. If the width W6 is too large, then a size of the semiconductor device 3600B is increased without a significant improvement in the functionality of the semiconductor device 3600B, in some instances.

An aspect of this description relates to a semiconductor device. The semiconductor device includes an insulating layer, wherein the insulating layer has a via opening and a conductive line opening. The semiconductor device further includes a via in the via opening, wherein the via includes a first conductive material. The semiconductor device further includes a conductive line in the conductive line opening. The conductive line includes a first liner layer, wherein a first thickness of the first liner layer over the via is less than a second thickness of the first liner layer over the insulating layer, and a conductive fill comprising a second conductive material different from the first conductive material. In some embodiments, the first liner layer includes tantalum nitride (TaN). In some embodiments, the first conductive material directly contacts the insulating layer. In some embodiments, the first conductive material includes ruthenium or tungsten. In some embodiments, the conductive line further includes a second liner layer between the first liner layer and the conductive fill. In some embodiments, the second liner layer includes the first conductive material. In some embodiments, the first liner layer extends into the via opening. In some embodiments, the conductive fill extends into the via opening. In some embodiments, the first thickness is less than 50% of the second thickness. In some embodiments, a third thickness of the first liner layer along sidewalls of the insulating layer is equal to the second thickness.

An aspect of this description relates to a method of making a semiconductor device. The method includes etching an insulating layer to form a first opening and a second opening. The method further includes depositing a conductive material in the first opening. The method further includes performing a surface modification process on the conductive material. The method further includes depositing, after the surface modification process, a first liner layer in the second opening, wherein the first liner layer extends over the conductive material and the insulating layer. The method further includes depositing a conductive fill over the first liner layer, wherein the conductive fill includes a different material from the conductive material. In some embodiments, depositing the first liner layer includes depositing the first liner layer having a first thickness over the conductive material and a second thickness over the insulating layer, and the second thickness is greater than the first thickness. In some embodiments, depositing the conductive material includes depositing ruthenium or tungsten. In some embodiments, performing the surface modification includes depositing a monolayer of an organic long chain molecule. In some embodiments, the method further includes depositing a second liner layer over the first liner layer, wherein the second liner layer is between the first liner layer and the conductive fill, and a thickness of the second liner layer is substantially uniform.

An aspect of this description relates to a semiconductor device. The semiconductor device includes an insulating layer, wherein the insulating layer has a via opening and a conductive line opening. The semiconductor device further includes a via in the via opening, wherein the via includes a first conductive material. The semiconductor device further includes a conductive line in the conductive line opening. The conductive line includes a first liner layer, a second liner layer over the first liner layer, wherein the second liner layer is continuous with the first conductive material, and a conductive fill comprising a second conductive material different from the first conductive material. In some embodiments, the first liner layer extends into the via opening. In some embodiments, the first liner layer is between the via and the insulating layer. In some embodiments, the first conductive material includes ruthenium. In some embodiments, the first liner layer extends along a bottommost surface of the via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   an insulating layer, wherein the insulating layer has a via opening and a conductive line opening;
   a via in the via opening, wherein the via comprises a first conductive material; and
   a conductive line in the conductive line opening, wherein the conductive line comprises:
      a first liner layer, wherein a first thickness of the first liner layer over the via is less than a second thickness of the first liner layer over the insulating layer, and
      a conductive fill comprising a second conductive material different from the first conductive material.

2. The semiconductor device of claim 1, wherein the first liner layer comprises tantalum nitride (TaN).

3. The semiconductor device of claim 1, wherein the first conductive material directly contacts the insulating layer.

4. The semiconductor device of claim 1, wherein the first conductive material comprises ruthenium or tungsten.

5. The semiconductor device of claim 1, wherein the conductive line further comprises a second liner layer between the first liner layer and the conductive fill.

6. The semiconductor device of claim 5, wherein the second liner layer comprises the first conductive material.

7. The semiconductor device of claim 1, wherein the first liner layer extends into the via opening.

8. The semiconductor device of claim 1, wherein the conductive fill extends into the via opening.

9. The semiconductor device of claim 1, wherein the first thickness is less than 50% of the second thickness.

10. The semiconductor device of claim 1, wherein a third thickness of the first liner layer along sidewalls of the insulating layer is equal to the second thickness.

11. A semiconductor device comprising:
    an insulating layer, wherein the insulating layer has a via opening and a conductive line opening;
    a via in the via opening, wherein the via comprises a first conductive material; and
    a conductive line in the conductive line opening, wherein the conductive line comprises:
       a first liner layer having a variable thickness, a second liner layer over the first liner layer, and a conductive fill comprising a second conductive material different from the first conductive material, wherein the first liner layer, in a direction perpendicular to a top surface of the insulating layer, is between a portion of the second liner layer and the conductive fill.

12. The semiconductor device of claim 11, wherein the first liner layer extends into the via opening.

13. The semiconductor device of claim 12, wherein a first portion of the first liner layer contacting the via is thinner than a second portion of the first liner layer contacting the insulating layer.

14. The semiconductor device of claim 11, wherein the first conductive material comprises ruthenium.

15. The semiconductor device of claim 11, wherein the second liner layer directly contacts the conductive fill.

16. A semiconductor device comprising:
    an insulating layer, wherein the insulating layer has a via opening and a conductive line opening;
    a via in the via opening, wherein the via comprises a first conductive material; and
    a conductive line in the conductive line opening, wherein the conductive line comprises:
       a first liner layer having a variable thickness, wherein a portion of the first liner layer over the insulating layer has a uniform thickness,
       a second liner layer over the first liner layer, wherein the second liner layer has a uniform thickness, and
       a conductive fill comprising a second conductive material different from the first conductive material.

17. The semiconductor device of claim 16, wherein the first liner layer extends into the via opening.

18. The semiconductor device of claim 16, wherein the second liner layer directly contacts a top-most surface of the conductive fill.

19. The semiconductor device of claim 16, further comprising an etch stop layer over the insulating layer.

20. The semiconductor device of claim 19, wherein the second liner layer directly contacts the etch stop layer.

* * * * *